United States Patent
Isa et al.

(10) Patent No.: US 8,513,664 B2
(45) Date of Patent: Aug. 20, 2013

(54) THIN FILM TRANSISTOR, SEMICONDUCTOR DEVICE AND ELECTRONIC DEVICE

(75) Inventors: Toshiyuki Isa, Kanagawa (JP); Yasuhiro Jinbo, Kanagawa (JP); Sachiaki Tezuka, Kanagawa (JP); Koji Dairiki, Kanagawa (JP); Hidekazu Miyairi, Kanagawa (JP); Shunpei Yamazaki, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 268 days.

(21) Appl. No.: 12/490,458

(22) Filed: Jun. 24, 2009

(65) Prior Publication Data

US 2009/0321743 A1    Dec. 31, 2009

(30) Foreign Application Priority Data

Jun. 27, 2008   (JP) ................................. 2008-169499
Sep. 5, 2008    (JP) ................................. 2008-228242

(51) Int. Cl.
*H01L 29/04* (2006.01)
*H01L 29/10* (2006.01)
*H01L 31/00* (2006.01)

(52) U.S. Cl.
USPC ................ 257/57; 257/66; 257/607; 257/611

(58) Field of Classification Search
USPC ............. 257/40, 57, 263, 288, 347; 438/141, 438/149, 155, 158, 486
See application file for complete search history.

(56) References Cited

U.S. PATENT DOCUMENTS

| | | | |
|---|---|---|---|
| 4,226,898 A | 10/1980 | Ovshinsky et al. |
| 4,409,134 A | 10/1983 | Yamazaki |
| 4,460,670 A | 7/1984 | Ogawa et al. |
| 4,766,477 A | 8/1988 | Nakagawa et al. |
| 5,101,242 A | 3/1992 | Ikeda et al. |
| 5,221,631 A | 6/1993 | Ikeda et al. |
| 5,311,040 A | 5/1994 | Hiramatsu et al. |

(Continued)

FOREIGN PATENT DOCUMENTS

| | | |
|---|---|---|
| EP | 0 449 539 A2 | 10/1991 |
| EP | 0 535 979 A2 | 4/1993 |

(Continued)

OTHER PUBLICATIONS

"International Search Report (Application No. PCT/JP2009/061794; PCT11624/11792) Dated Sep. 15, 2009".

(Continued)

*Primary Examiner* — Kimberly Rizkallah
*Assistant Examiner* — Errol Fernandes
(74) *Attorney, Agent, or Firm* — Nixon Peabody LLP; Jeffrey L. Costellia

(57) ABSTRACT

A thin film transistor includes, as a buffer layer, an amorphous semiconductor layer having nitrogen or an NH group between a gate insulating layer and source and drain regions and at least on the source and drain regions side. As compared to a thin film transistor in which an amorphous semiconductor is included in a channel formation region, on-current of a thin film transistor can be increased. In addition, as compared to a thin film transistor in which a microcrystalline semiconductor is included in a channel formation region, off-current of a thin film transistor can be reduced.

19 Claims, 29 Drawing Sheets

(56) References Cited

U.S. PATENT DOCUMENTS

| | | |
|---|---|---|
| 5,453,858 A | 9/1995 | Yamazaki |
| 5,514,879 A | 5/1996 | Yamazaki |
| 5,591,987 A | 1/1997 | Yamazaki et al. |
| 5,600,154 A | 2/1997 | Shimizu et al. |
| 5,614,732 A | 3/1997 | Yamazaki |
| 5,648,662 A | 7/1997 | Zhang et al. |
| 5,677,236 A | 10/1997 | Saitoh et al. |
| 5,701,167 A | 12/1997 | Yamazaki |
| 5,766,989 A | 6/1998 | Maegawa et al. |
| 5,849,601 A | 12/1998 | Yamazaki |
| 5,859,445 A | 1/1999 | Yamazaki |
| 5,864,150 A | 1/1999 | Lin |
| 5,932,302 A | 8/1999 | Yamazaki et al. |
| 6,011,277 A | 1/2000 | Yamazaki |
| 6,017,781 A | 1/2000 | Shimizu et al. |
| 6,023,075 A | 2/2000 | Yamazaki |
| 6,028,472 A | 2/2000 | Nagumo |
| 6,153,893 A | 11/2000 | Inoue et al. |
| 6,171,674 B1 | 1/2001 | Yamazaki et al. |
| 6,183,816 B1 | 2/2001 | Yamazaki et al. |
| 6,188,085 B1 | 2/2001 | Shimizu et al. |
| 6,252,249 B1 | 6/2001 | Yamazaki |
| 6,255,146 B1 | 7/2001 | Shimizu et al. |
| 6,281,520 B1 | 8/2001 | Yamazaki |
| 6,306,213 B1 | 10/2001 | Yamazaki |
| 6,410,372 B2 | 6/2002 | Flewitt |
| 6,468,617 B1 | 10/2002 | Yamazaki et al. |
| 6,468,839 B2 | 10/2002 | Inoue et al. |
| 6,483,124 B2 | 11/2002 | Flewitt |
| 6,544,908 B1 | 4/2003 | Weimer et al. |
| 6,680,486 B1 | 1/2004 | Yamazaki |
| 6,700,057 B2 | 3/2004 | Yasuno |
| 6,737,676 B2 | 5/2004 | Yamazaki |
| 6,747,627 B1 | 6/2004 | Koyama et al. |
| 6,756,258 B2 | 6/2004 | Zhang et al. |
| 6,835,523 B1 | 12/2004 | Yamazaki et al. |
| 6,838,300 B2 | 1/2005 | Jin et al. |
| 6,890,803 B2 * | 5/2005 | Lin et al. ............ 438/149 |
| 6,943,764 B1 | 9/2005 | Koyama et al. |
| 7,012,753 B2 | 3/2006 | Quesnel |
| 7,067,844 B2 | 6/2006 | Yamazaki |
| 7,098,479 B1 | 8/2006 | Yamazaki |
| 7,115,902 B1 | 10/2006 | Yamazaki |
| 7,199,846 B2 | 4/2007 | Lim |
| 7,511,709 B2 | 3/2009 | Koyama et al. |
| 7,635,889 B2 | 12/2009 | Isa et al. |
| 7,786,485 B2 | 8/2010 | Dairiki et al. |
| 7,812,348 B2 | 10/2010 | Dairiki et al. |
| 7,821,012 B2 | 10/2010 | Jinbo |
| 8,119,468 B2 | 2/2012 | Miyairi et al. |
| 8,124,972 B2 | 2/2012 | Dairiki et al. |
| 8,138,032 B2 | 3/2012 | Miyairi et al. |
| 2001/0017372 A1 | 8/2001 | Koyama |
| 2001/0019154 A1 | 9/2001 | Yamazaki et al. |
| 2002/0009819 A1 | 1/2002 | Flewitt |
| 2002/0044111 A1 | 4/2002 | Yamazaki et al. |
| 2003/0148630 A1 | 8/2003 | Hu |
| 2004/0084699 A1 * | 5/2004 | Yamazaki et al. ............ 257/288 |
| 2004/0198046 A1 | 10/2004 | Yu-Chou et al. |
| 2004/0221887 A1 | 11/2004 | Kondo et al. |
| 2005/0012097 A1 | 1/2005 | Yamazaki |
| 2005/0014319 A1 * | 1/2005 | Yamazaki et al. ............ 438/197 |
| 2005/0022864 A1 | 2/2005 | Fujioka et al. |
| 2005/0064667 A1 | 3/2005 | Matsushita et al. |
| 2005/0085003 A1 | 4/2005 | Kishimoto et al. |
| 2005/0115930 A1 | 6/2005 | Tanaka et al. |
| 2005/0214455 A1 | 9/2005 | Li et al. |
| 2005/0229965 A1 | 10/2005 | Nishimura et al. |
| 2005/0233595 A1 | 10/2005 | Choi et al. |
| 2006/0024866 A1 | 2/2006 | Gan et al. |
| 2006/0027804 A1 | 2/2006 | Yamazaki et al. |
| 2006/0063391 A1 | 3/2006 | You et al. |
| 2006/0079100 A1 | 4/2006 | Joshi et al. |
| 2006/0170111 A1 | 8/2006 | Isa et al. |
| 2007/0056628 A1 * | 3/2007 | Park et al. ............ 136/263 |
| 2007/0181945 A1 | 8/2007 | Nakamura |
| 2007/0295399 A1 | 12/2007 | Carlson |
| 2008/0121896 A1 | 5/2008 | Takizawa et al. |
| 2008/0296704 A1 | 12/2008 | Wakabayashi |
| 2008/0308807 A1 | 12/2008 | Yamazaki et al. |
| 2009/0033818 A1 | 2/2009 | Nakajima et al. |
| 2009/0057683 A1 | 3/2009 | Nakajima et al. |
| 2009/0061574 A1 | 3/2009 | Nakajima et al. |
| 2009/0114921 A1 | 5/2009 | Yamazaki et al. |
| 2009/0218568 A1 | 9/2009 | Dairiki et al. |
| 2009/0236600 A1 | 9/2009 | Yamazaki et al. |
| 2009/0242889 A1 | 10/2009 | Nakayama |
| 2009/0261328 A1 | 10/2009 | Miyairi et al. |
| 2009/0261330 A1 | 10/2009 | Yamazaki et al. |
| 2009/0267067 A1 | 10/2009 | Jinbo et al. |
| 2009/0267068 A1 | 10/2009 | Dairiki et al. |
| 2009/0321737 A1 | 12/2009 | Isa et al. |
| 2010/0059749 A1 | 3/2010 | Takahashi et al. |
| 2010/0078071 A1 | 4/2010 | Miyairi et al. |
| 2010/0079425 A1 | 4/2010 | Yamazaki et al. |
| 2010/0096631 A1 | 4/2010 | Miyairi et al. |
| 2010/0096637 A1 | 4/2010 | Yamazaki et al. |
| 2010/0099217 A1 | 4/2010 | Isa et al. |
| 2010/0127261 A1 | 5/2010 | Yamazaki et al. |
| 2010/0224879 A1 | 9/2010 | Miyairi et al. |

FOREIGN PATENT DOCUMENTS

| | | |
|---|---|---|
| EP | 0 652 595 B1 | 5/1995 |
| EP | 1 505 174 A1 | 2/2005 |
| EP | 1 537 938 A2 | 6/2005 |
| JP | 57-071126 | 5/1982 |
| JP | 58-092217 | 6/1983 |
| JP | 59-072781 | 4/1984 |
| JP | 60-027122 | 2/1985 |
| JP | 60-160170 | 8/1985 |
| JP | 64-073671 | 3/1989 |
| JP | 01-144682 | 6/1989 |
| JP | 02-028624 | 1/1990 |
| JP | 02028624 A * | 1/1990 |
| JP | 04-242724 | 8/1992 |
| JP | 04-266019 | 9/1992 |
| JP | 05-129608 | 5/1993 |
| JP | 05-175503 | 7/1993 |
| JP | 06-326312 | 11/1994 |
| JP | 07-131030 | 5/1995 |
| JP | 2000-277439 | 10/2000 |
| JP | 2001-007024 | 1/2001 |
| JP | 2001-053283 | 2/2001 |
| JP | 3175503 | 6/2001 |
| JP | 2004-014958 | 1/2004 |
| JP | 2005-049832 | 2/2005 |
| JP | 2005-167051 | 6/2005 |
| JP | 2005-191546 | 7/2005 |
| JP | 2008-124392 | 5/2008 |
| KR | 2002091695 A * | 12/2002 |
| WO | WO 02/07207 A1 | 1/2002 |

OTHER PUBLICATIONS

"Written Opinion (Application No. PCT/JP2009/061794; PCT11624/11792) Dated Sep. 15, 2009".

Kim.C et al., "42.1: A Novel Four-Mask-Count Process Architecture for TFT-LCDS,", SID Digest '00 : SID International Symposium Digest of Technical Papers, 2000, vol. 31, pp. 1006-1009.

Arai.T et al., "41.2: Micro Silicon Technology for Active Matrix OLED Display,", SID Digest '07 : SID International Symposium Digest of Technical Papers, 2007, vol. 38, pp. 1370-1373.

Fujiwara.H et al., "Stress-Induced Nucleation of Microcrystalline Silicon from Amorphous Phase,", Jpn. J. Appl. Phys. (Japanese Journal of Applied Physics) , May 15, 2002, vol. 41, No. 5A, pp. 2821-2828.

Kamei.T et al., "A Significant Reduction of Impurity Contents in Hydrogenated Microcrystalline Silicon Films for Increased Grain Size and Reduced Defect Density,", Jpn. J. Appl. Phys. (Japanese Journal of Applied Physics) , Mar. 1, 1998, vol. 37, No. 3A, pp. L265-L268.

Lee.C et al., "How to Achieve High Mobility Thin Film Transistors by Direct Deposition of Silicon Using 13.56 MHz RF PECVD?,", IEDM 06: Technical Digest of International Electron Devices Meeting, Dec. 11, 2006, pp. 295-298.

Lee.C et al., "Directly Deposited Nanocrystalline Silicon Thin-Film Transistors With Ultra High Mobilities,", Appl. Phys. Lett. (Applied Physics Letters), Dec. 18, 2006, vol. 89, No. 25, pp. 252101-1-252101-3.

Song.J et al., "34.1: Advanced Four-Mask Process Architecture for the A-Si TFT Array Manufacturing Method,", SID Digest '02 : SID International Symposium Digest of Technical Papers, 2002, vol. 32, pp. 1038-1041.

Choi.S et al., "P-16: Novel Four-Mask Process in the FFS TFT-LCD With Optimum Multiple-Slit Design Applied by the Use of a Gray-Tone Mask,", SID Digest '05 : SID International Symposium Digest of Technical Papers, 2005, vol. 36, pp. 284-287.

Lee.C et al., "High-Mobility Nanocrystalline Silicon Thin-Film Transistors Fabricated by Plasma-Enhanced Chemical Vapor Deposition,", Appl. Phys. Lett. (Applied Physics Letters), May 24, 2005, vol. 86, pp. 222106-1-222106-3.

Lee.C et al., "High-Mobility N-Channel and P-Channel Nanocrystalline Silicon Thin-Film Transistors,", IEDM 05: Technical Digest of International Electron Devices Meeting, 2005, pp. 937-940.

Esmaeili-Rad.M et al., "High Stability, Low Leakage Nanocrystalline Silicon Bottom Gate Thin Film Transistors for AMOLED Displays,", IEDM 06: Technical Digest of International Electron Devices Meeting, 2006, pp. 303-306.

Lee.H et al., "Leakage Current Mechanisms in Top-Gate Nanocrystalline Silicon Thin-Film Transistors,", Appl. Phys. Lett. (Applied Physics Letters), Feb. 28, 2008, vol. 92, pp. 083509-1-083509-3.

Lee.C et al., "Stability of NC-SI:H TFTS With Silicon Nitride Gate Dielectric,", IEEE Transactions on Electron Devices, 2007, vol. 54, No. 1, pp. 45-51.

Sazonov.A et al., "Low-Temperature Materials and Thin Film Transistors for Flexible Electronics,", Proceedings of the IEEE, Aug. 1, 2005, vol. 93, No. 8, pp. 1420-1428.

Lee.C et al., "Top-Gate TFTS Using 13.56MHZ PECVD Microcrystalline Silicon,", IEEE Electron Device Letters, Sep. 5, 2005, vol. 26, No. 9, pp. 637-639.

Lee.C et al., "Postdeposition Thermal Annealing and Material Stability of 75° C. Hydrogenated Nanocrystalline Silicon Plasma-Enhanced Chemical Vapor Deposition Films,", J. Appl. Phys. (Journal of Applied Physics), Aug. 4, 2005, vol. 98, No. 3, pp. 034305-1-034305-7.

Fujiwara.H et al., "Microcrystalline silicon nucleation sites in the sub-surface of hydrogenated amorphous silicon,", Surface Science, 2002, vol. 497, No. 1-3, pp. 333-340.

Fujiwara.H et al., "Real-time spectroscopic ellipsometry studies of the nucleation and grain growth processes in microcrystalline silicon thin films,", Phys. Rev. B (Physical Review B), Feb. 23, 2001, vol. 63, pp. 115306-1-115306-9.

Ehara.T et al., "Nitrogen-Doping Effects on Electrical Properties of Hydrogenated Microcrystalline Sillicon as Studied by Electron Paramagnetic Resonance and Conductivity,", Jpn. J. Appl. Phys. (Japanese Journal of Applied Physics), 2000, vol. 39, No. 1, pp. 31-34.

Chinese Office Action (Application No. 200980124788.4; PCTCN11624/11792), dated Nov. 2, 2012.

* cited by examiner 118a
107

118b
107

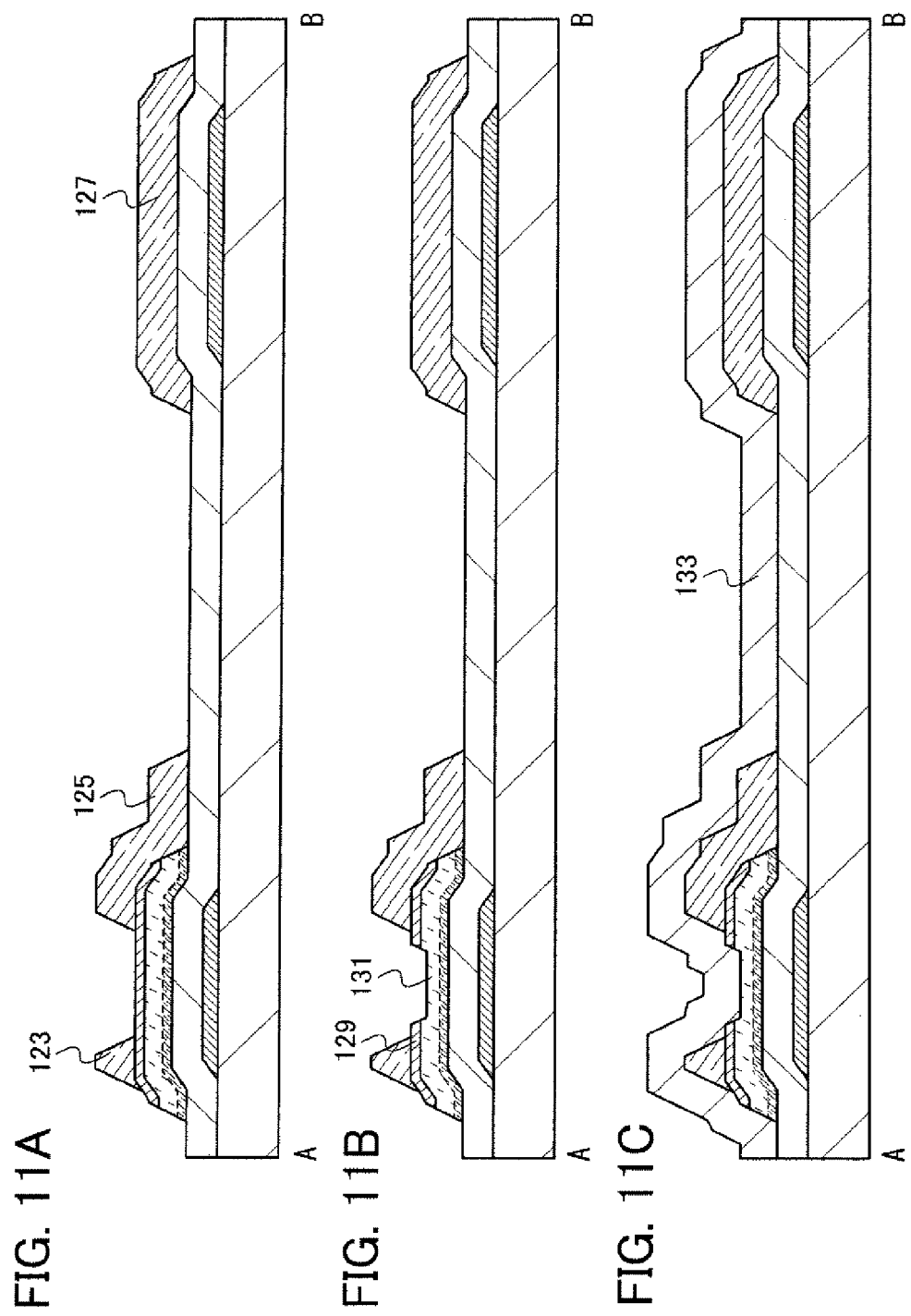

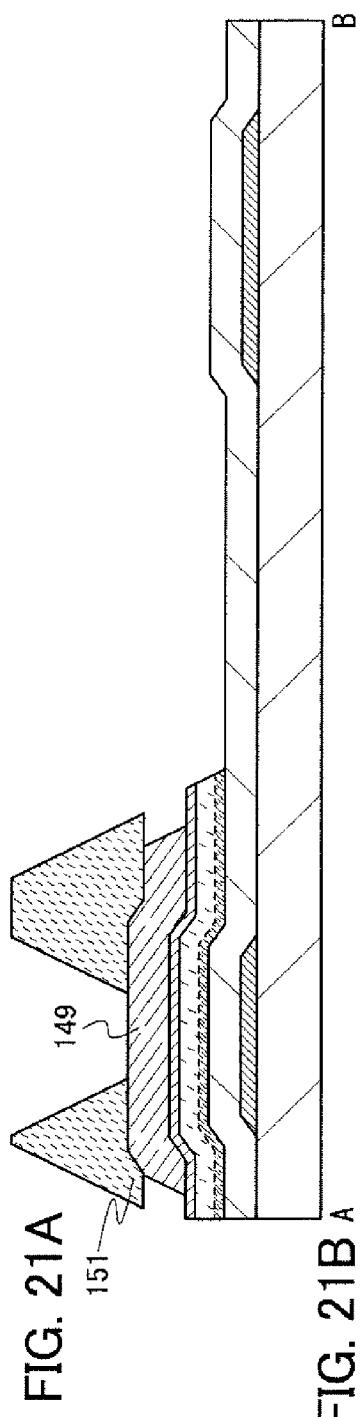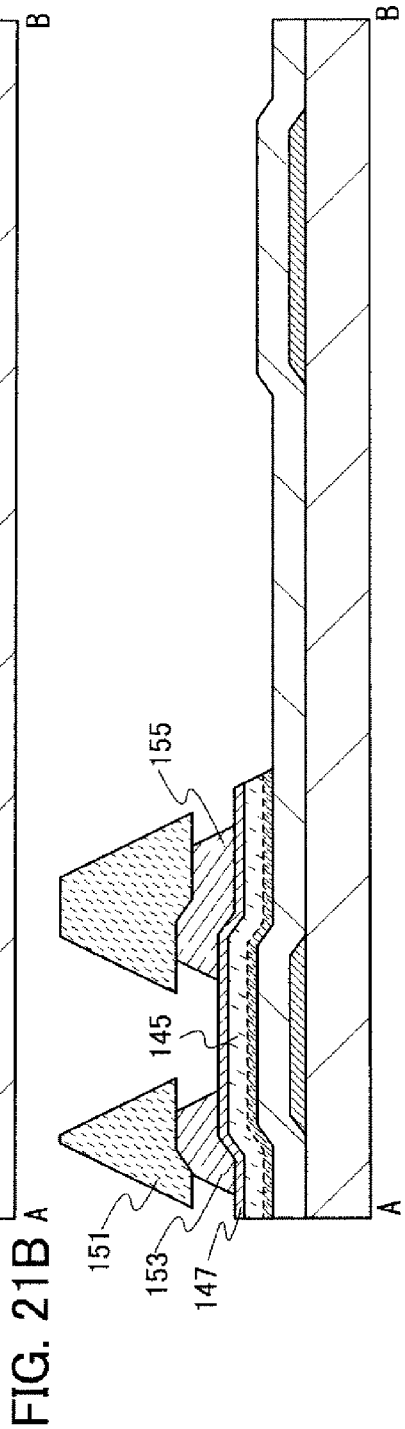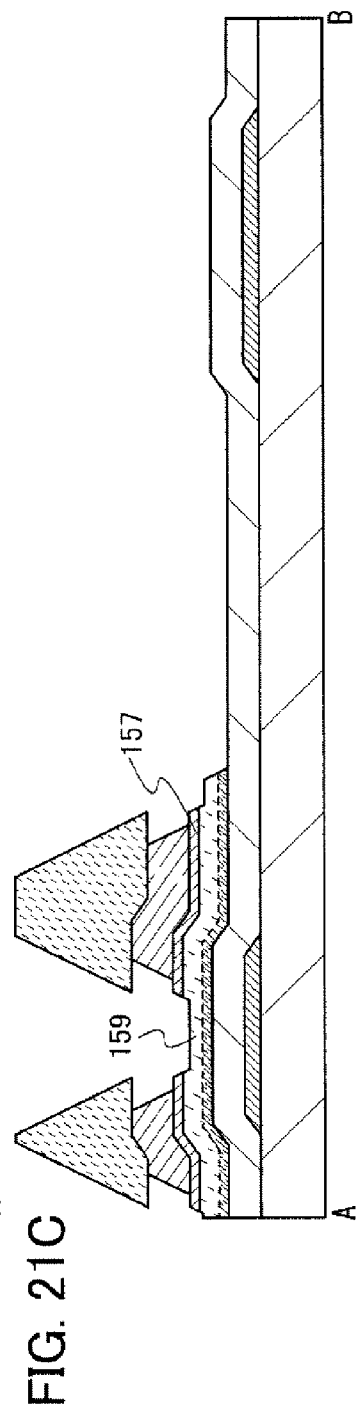

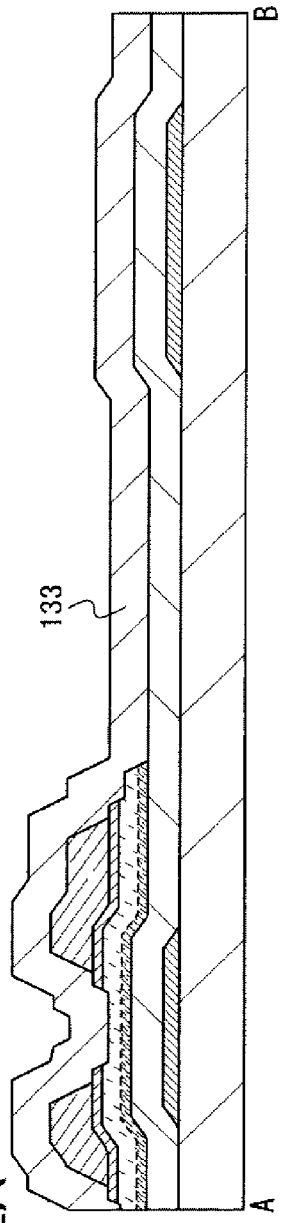
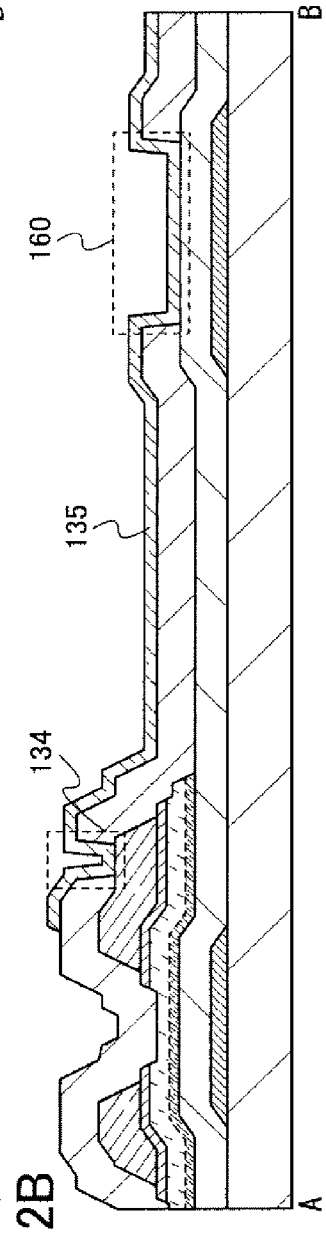
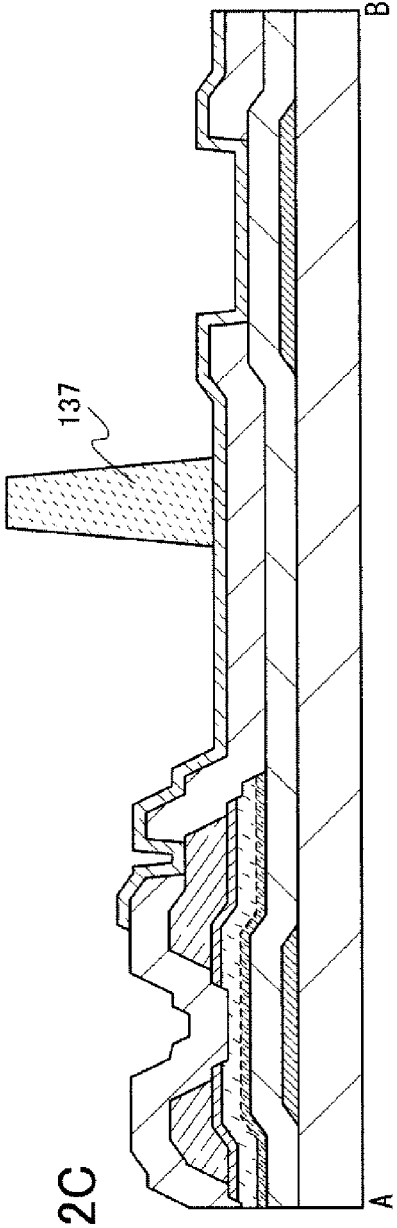

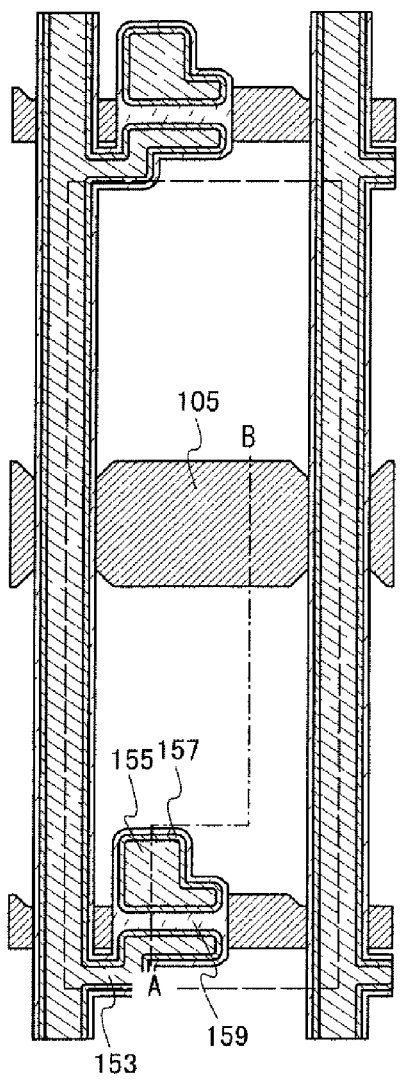
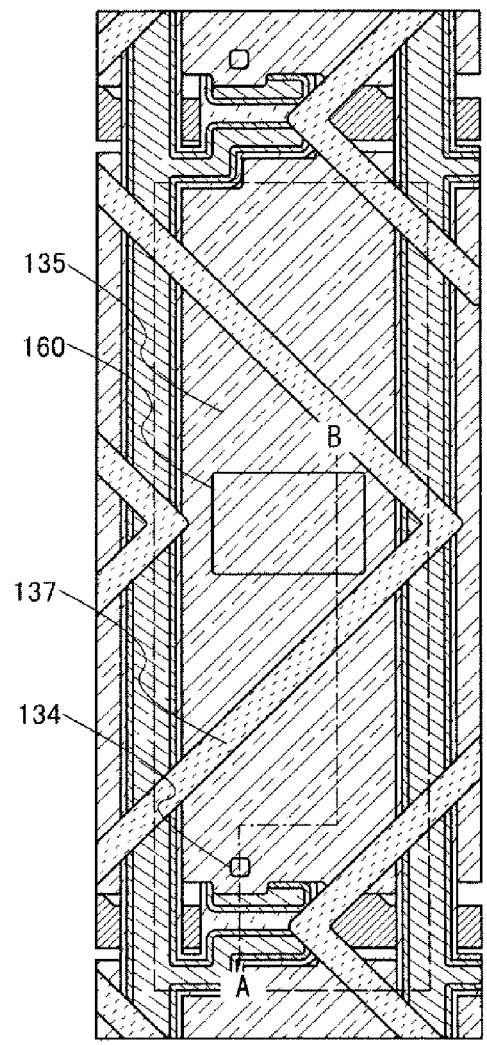
FIG. 23A
FIG. 23B

THIN FILM TRANSISTOR, SEMICONDUCTOR DEVICE AND ELECTRONIC DEVICE

TECHNICAL FIELD

The present invention relates to a thin film transistor and a method for manufacturing the thin film transistor, and a semiconductor device and a display device using the thin film transistor.

BACKGROUND ART

As a kind of field-effect transistor, a thin-film transistor in which a channel region is formed in a semiconductor layer formed over a substrate having an insulating surface is known. Techniques in which amorphous silicon, microcrystalline silicon, or polycrystalline silicon is used for the semiconductor layer used in the thin-film transistor have been disclosed (see Patent Documents 1 to 5). A typical application of a thin-film transistor is a liquid crystal television device, and the thin film transistor has been put to the practical use as a switching transistor for each pixel included in a display screen.

REFERENCE

[Patent Document]
[Patent Document 1] Japanese Published Patent Application No. 2001-053283
[Patent Document 2] Japanese Published Patent Application No. Hei05-129608
[Patent Document 3] Japanese Published Patent Application No. 2005-049832
[Patent Document 4] Japanese Published Patent Application No. Hei07-131030
[Patent Document 5] Japanese Published Patent Application No. 2005-191546

DISCLOSURE OF INVENTION

A thin film transistor in which a channel is formed using an amorphous silicon layer has problems such as low field-effect mobility and low on-current. On the other hand, a thin film transistor in which a channel is formed using a microcrystalline silicon layer has a problem in that, whereas the field-effect mobility is higher than that of the thin film transistor in which a channel is formed using an amorphous silicon layer, the off-current is high, and thus sufficient switching characteristics cannot be obtained.

The thin-film transistor in which a polycrystalline silicon layer is used for the channel formation region has characteristics in that the field-effect mobility is far higher than those of the above-described two kinds of thin-film transistors and high on-current can be obtained. Because of such characteristics, this thin film transistor can be used not only as a switching transistor provided in a pixel but also in a driver circuit for which high-speed operation is required.

However, a thin film transistor formed using a polycrystalline silicon layer requires a crystallization step for a semiconductor layer and has a problem of higher manufacturing cost as compared to a thin film transistor formed using an amorphous silicon layer. For example, with laser annealing technique involved in the process for manufacturing a polycrystalline silicon layer has a problem in that large liquid crystal panels cannot be produced efficiently because the laser beam irradiation area is small.

A mother glass for manufacturing display panels has been grown in size from year to year as follows: the 3rd generation (550 mm×650 mm), the 3.5th generation (600 mm×720 mm or 620 mm×750 mm), the 4th generation (680 mm×880 mm or 730 mm×920 mm), the 5th generation (1100 mm×1300 mm), the 6th generation (1500 mm×1850 mm), the 7th generation (1870 mm×2200 mm), and the 8th generation (2200 mm×2400 mm). From now on, the size of mother glasses is expected to grow to the 9th generation (2400 mm×2800 mm or 2450 mm×3050 mm) and the 10th generation (2950 mm×3400 mm). Increase in size of mother glasses is based on the minimum-cost design concept.

However, the technique that thin-film transistors capable of high-speed operation can be manufactured over a large-area mother glass such as a 10th generation (2950 mm×3400 mm) mother glass with high productivity has not been established yet, which is a problem in industry.

In view of the foregoing, it is an object of the present invention to solve the aforementioned problems related to on-current and off-current of a thin film transistor. It is another object of the present invention to provide a thin film transistor capable of high-speed operation.

In the present invention, a thin film transistor includes, as a buffer layer, an amorphous semiconductor layer having an NH group or an $NH_2$ group between a gate insulating layer and source and drain regions and at least on the source and drain regions side. The buffer layer is provided on a so-called back channel side. In addition, in the present invention, in a thin film transistor, an amorphous semiconductor layer having an NH group or an $NH_2$ group is formed between a gate insulating layer and source and drain regions.

An amorphous semiconductor layer having an NH group or an $NH_2$ group is formed using, as a reactive gas, a gas in which a semiconductor source gas (e.g. a silicon hydride gas, a silicon fluoride gas, a silicon chloride gas, a germanium hydride gas, a germanium fluoride gas, or a germanium chloride gas) and a dilution gas are mixed at a mixture ratio at which an amorphous semiconductor can be generated. The reactive gas is introduced into an ultrahigh vacuum reaction chamber where an oxygen concentration is reduced, and a predetermined pressure is maintained therein to generate glow discharge plasma. Accordingly, a film is deposited over a substrate which is placed in the reaction chamber. At the early stage of deposition or during deposition, a nitrogen element and a hydrogen element, or an NH group are/is included in the reaction chamber to start deposition of a film, and dangling bonds in the film are cross-linked with an NH group, whereby an amorphous semiconductor layer in which the defect levels are reduced is formed. Alternatively, at the early stage of deposition or during deposition, a nitrogen element and a hydrogen element or an $NH_2$ group are/is included in the reaction chamber to start deposition of a film, and dangling bonds in the film are terminated with an NH group, whereby an amorphous semiconductor layer in which the defect levels are reduced is formed.

The concentration of nitrogen contained in the amorphous semiconductor layer is preferably a concentration at which semiconductor characteristics are kept, the defect levels are reduced, and carrier mobility is increased.

By including nitrogen, typically an NH group in a semiconductor layer and cross-linking dangling bonds of Si atoms with nitrogen, typically, an NH group, the bonding becomes a carrier path at the crystal grain boundary, whereby carrier transfer is facilitated. Accordingly, in a thin film transistor, an amorphous semiconductor layer having an NH group or an $NH_2$ group is provided as a buffer layer between a channel formation region and source and drain regions, whereby the resistance in a thickness direction of the buffer layer when a voltage is applied to the source region or the drain region can be reduced. In particular, an amorphous semiconductor layer having an NH group or an $NH_2$ group is provided as a buffer layer directly under the source and drain regions, whereby on-current can be increased. Therefore, as compared to a thin film transistor in which an amorphous semiconductor layer is provided between a gate insulating layer and source and drain regions, on-current of a thin film transistor can be increased.

Dangling bonds in a semiconductor layer are defect levels. However, dangling bonds of a semiconductor element are cross-linked with an NH group, whereby the defect levels are eliminated. Further, the dangling bonds of the semiconductor element are terminated with an $NH_2$ group, whereby the defect levels are eliminated. An amorphous semiconductor layer has short-range order and no constant repeated patterns like a crystal lattice in a structure. Therefore, many dangling bonds are included, and the dangling bonds become defect levels where carriers are trapped. However, the dangling bonds in the amorphous semiconductor layer are cross-linked with an NH group, whereby the defect levels can be eliminated. Further, the dangling bonds in the amorphous semiconductor layer are terminated with an $NH_2$ group, whereby the defect levels in the amorphous semiconductor layer can be reduced. When there are defect levels, at the defect levels, electrons and holes are generated and recombined by thermal excitation and Shockley-Read-Hall current flows. However, when defect levels are eliminated, the current can be reduced. Accordingly, an amorphous semiconductor layer having an NH group or an $NH_2$ group is provided as a buffer layer in a region where off-current flows, whereby off-current can be reduced as compared to a thin film transistor in which a microcrystalline semiconductor is provided between a gate insulating layer and source and drain regions.

Accordingly, on-current and field-effect mobility can be increased as compared to a thin film transistor in which an amorphous semiconductor layer is provided between a gate insulating layer and source and drain regions, and off-current can be reduced as compared to a thin film transistor in which a microcrystalline semiconductor layer is provided between a gate insulating layer and source and drain regions.

Note that the concentration of an impurity element in silicon which reduces the coordination number of silicon and generates dangling bonds, such as oxygen, is reduced. That is, it is preferable that the oxygen concentration which is measured by secondary ion mass spectrometry be less than or equal to $5 \times 10^{18}$ $cm^{-3}$.

Note that here, a concentration without mention of a measuring method is a concentration measured by secondary ion mass spectrometry.

Note that on-current refers to current which flows between a source electrode and a drain electrode when a transistor is on. For example, in the case of an n-channel transistor, the on current refers to current which flows between the source electrode and the drain electrode when a gate voltage of the transistor is higher than a threshold voltage thereof.

Further, off-state current is current which flows between a source electrode and a drain electrode when a transistor is off. For example, in the case of an n-channel transistor, the off-state current is current which flows between the source electrode and the drain electrode when a gate voltage of the transistor is lower than a threshold voltage thereof.

According to the present invention, as compared to a thin film transistor in which an amorphous semiconductor is included in a channel formation region, on-current of a thin film transistor can be increased. In addition, as compared to a thin film transistor in which a microcrystalline semiconductor is included in a channel formation region, off-current of a thin film transistor can be reduced.

BRIEF DESCRIPTION OF DRAWINGS

In the accompanying drawings:

FIGS. 11A to 11C are views illustrating an example of a method for manufacturing a thin film transistor according to an embodiment of the present invention;

FIGS. 21A to 21C are views illustrating an example of a method for manufacturing a thin film transistor according to an embodiment of the present invention;

FIGS. 22A to 22C are views illustrating an example of a method for manufacturing a thin film transistor according to an embodiment of the present invention;

FIGS. 23A and 23B are views illustrating an example of a method for manufacturing a thin film transistor according to an embodiment of the present invention;

BEST MODE FOR CARRYING OUT THE INVENTION

Figure 1A:
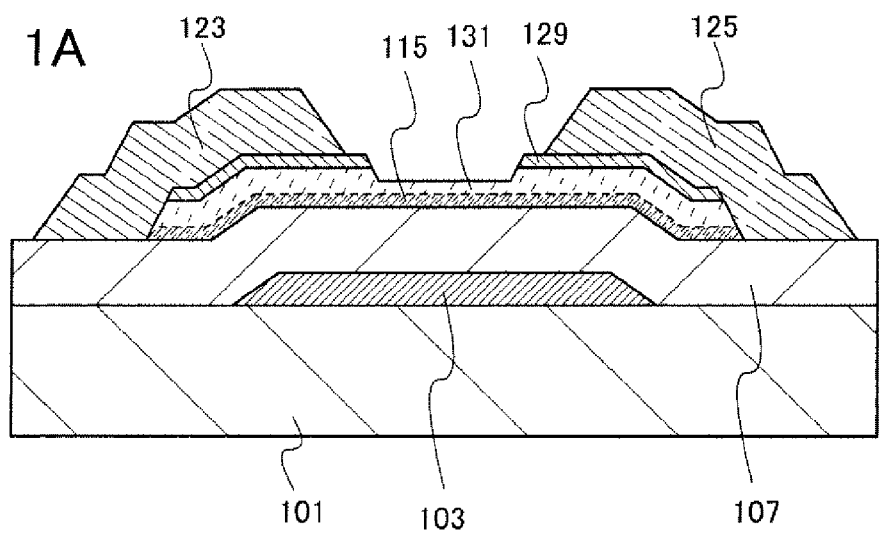
FIGS. 1A and 1B are views illustrating an example of a thin film transistor according to an embodiment of the present invention.

Hereinafter, embodiments are described with reference to the drawings. Note that the present invention disclosed is not limited to the following description. It is easily understood by those skilled in the art that the mode and detail can be variously changed unless departing from the scope and spirit of the invention disclosed. Therefore, the invention should not be interpreted as being limited to the description of the embodiments to be given below. Note that as structures of the present invention are described with reference to the drawings, like portions are denoted by common reference numerals in different drawings. The same hatching pattern is applied to like portions, and the like portions are not especially denoted by reference numerals in some cases.

Embodiment 1

In this embodiment, an example of a mode of a thin film transistor will be described with reference to the drawings.

Figure 1B:
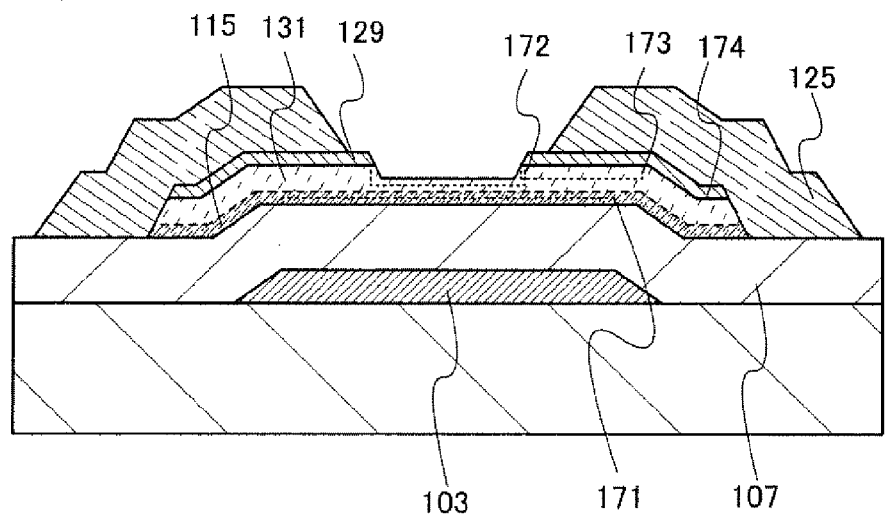

FIGS. 1A and 1B are cross-sectional views of a thin film transistor according to this embodiment. A thin film transistor illustrated in FIG. 1A includes a gate electrode layer 103 over a substrate 101; a gate insulating layer 107 which covers the gate electrode layer 103; a semiconductor layer 115 which is provided over and in contact with the gate insulating layer 107 and serves as a channel formation region; a buffer layer 131 over the semiconductor layer 115; and source and drain regions 129 which are in contact with part of the buffer layer 131. In addition, the thin film transistor includes a wiring layer 123 and a wiring layer 125 which are provided over and in contact with the source and drain regions 129. The wiring layer 123 and the wiring layer 125 form a source electrode and a drain electrode. Further, each layer has been patterned into a desired shape. Here, the buffer layer 131 is formed using an amorphous semiconductor layer having an NH group or an NH$_2$ group (hereinafter, referred to as an amorphous semiconductor layer having an NH group).

As illustrated in FIG. 1B, in the semiconductor layer 115, a region 171 which overlaps with the gate electrode layer 103 and is provided on the gate insulating layer 107 side serves as a channel. Further, in the buffer layer 131, a region 172 which is provided on a side opposite to the gate insulating layer 107 and is not in contact with the source and drain regions 129 serves as a back channel. Further, in the buffer layer 131, a region 173 on a side which is in contact with the drain region becomes a depletion layer. Further, a region 174 where the buffer layer 131 and the source region or the drain region are in contact with each other is a bond region.

As the substrate 101, in addition to a glass substrate and a ceramic substrate, a plastic substrate or the like with heat resistance which can withstand a process temperature in this manufacturing process can be used. In the case where a substrate does not need a light-transmitting property, a substrate obtained by providing an insulating layer on a surface of a substrate of a metal such as a stainless steel alloy may be used. As a glass substrate, an alkali-free glass substrate formed using barium borosilicate glass, aluminoborosilicate glass, aluminosilicate glass, or the like may be used.

The gate electrode layer 103 can be formed as a single layer or a stacked layer using a metal material such as molybdenum, titanium, chromium, tantalum, tungsten, aluminum, copper, neodymium, or scandium or an alloy material which includes any of these materials as a main component. Alternatively, a semiconductor layer typified by polycrystalline silicon doped with an impurity element such as phosphorus, or an AgPdCu alloy may be used.

For example, as a two-layer structure of the gate electrode layer 103, a two-layer structure in which a molybdenum layer is stacked over an aluminum layer, a two-layer structure in which a molybdenum layer is stacked over a copper layer, a two-layer structure in which a titanium nitride layer or a tantalum nitride layer is stacked over a copper layer, or a two-layer structure in which a titanium nitride layer and a molybdenum layer are stacked is preferable. As a three-layer structure, a structure in which a tungsten layer or a tungsten nitride layer, a layer of an alloy of aluminum and silicon or an alloy of aluminum and titanium, and titanium nitride or a titanium layer are stacked is preferable. When a metal layer serving as a barrier layer is stacked over a layer with low electric resistance, electric resistance of the gate electrode layer can be reduced and a metal element from the metal layer can be prevented from diffusing into the semiconductor layer.

The gate insulating layer 107 can be formed as a single layer or a stacked layer of a silicon oxide layer, a silicon nitride layer, a silicon oxynitride layer, or a silicon nitride oxide layer by a CVD method, a sputtering method, or the like. Further, the gate insulating layer 107 is formed using a silicon oxynitride layer, whereby, in the case of forming a microcrystalline semiconductor layer as the semiconductor layer 115, fluctuation in the threshold voltage of the thin film transistor can be suppressed.

Note that in this specification, silicon oxynitride contains more oxygen than nitrogen, and in the case where measurements are conducted using Rutherford backscattering spectrometry (RBS) and hydrogen forward scattering (HFS), silicon oxynitride preferably contains oxygen, nitrogen, silicon, and hydrogen at concentrations ranging from 50 to 70 at. %, 0.5 to 15 at. %, 25 to 35 at. %, and 0.1 to 10 at. %, respectively. Further, silicon nitride oxide contains more nitrogen than oxygen, and in the case where measurements are conducted using RBS and HFS, silicon nitride oxide preferably contains oxygen, nitrogen, silicon, and hydrogen at concentrations ranging from 5 to 30 at. %, 20 to 55 at. %, 25 to 35 at. %, and 10 to 30 at. %, respectively. Note that percentages of nitrogen, oxygen, silicon, and hydrogen fall within the ranges given above, where the total number of atoms contained in the silicon oxynitride or the silicon nitride oxide is defined as 100 at. %.

The semiconductor layer 115 is formed using a microcrystalline semiconductor layer, an amorphous semiconductor layer, or an amorphous semiconductor layer having an NH group. As a microcrystalline semiconductor layer, an amorphous semiconductor layer, or an amorphous semiconductor layer having an NH group, silicon, germanium, or silicon germanium can be used. Note that phosphorus imparting n-type conductivity or boron imparting p-type conductivity may be added into the semiconductor layer 115. A metal element which reacts with silicon to form a silicide, such as titanium, zirconium, hafnium, vanadium, niobium, tantalum, chromium, molybdenum, tungsten, cobalt, nickel, or platinum, may be added into the semiconductor layer 115. Phosphorus imparting n-type conductivity, boron imparting p-type conductivity, a metal element which reacts with silicon to form a silicide, or the like is added into the semiconductor layer 115, whereby the carrier mobility of the semiconductor layer can be increased. Thus, the field-effect mobility of the thin film transistor in which the semiconductor layer serves as a channel formation region can be increased.

Figure 2A:
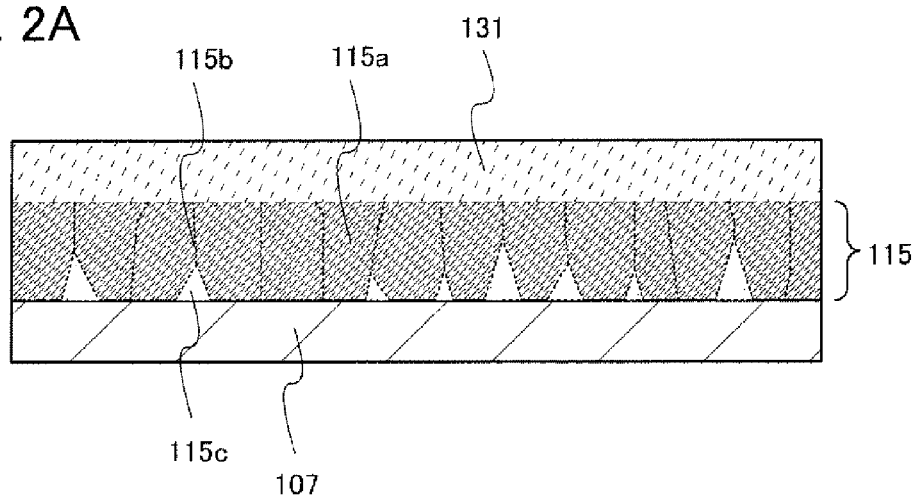
FIGS. 2A to 2C are views each illustrating a semiconductor layer included in a thin film transistor according to an embodiment of the present invention.

A microcrystalline semiconductor layer is a layer including a semiconductor having an intermediate structure between amorphous and crystalline (including single crystal and polycrystal) structures. A microcrystalline semiconductor is a semiconductor having a third state that is stable in terms of free energy and a crystalline semiconductor having short-range order and lattice distortion, in which columnar or needle-like crystals 115a having a crystal grain size of greater than or equal to 2 nm and less than or equal to 200 nm, preferably greater than or equal to 10 nm and less than or equal to 80 nm, more preferably greater than or equal to 20 nm and less than or equal to 50 nm have grown in a direction normal to the substrate surface. Therefore, a crystal grain boundary 115b is formed at the interface between the columnar or needle-like crystals 115a. Further, an amorphous structure 115c exists between the columnar or needle-like crystals 115a (see FIG. 2A).

Further, the concentrations of oxygen and nitrogen included in the microcrystalline semiconductor layer, which are measured by secondary ion mass spectrometry, are preferably less than $1 \times 10^{18}$ atoms/cm$^3$.

Figure 2B:
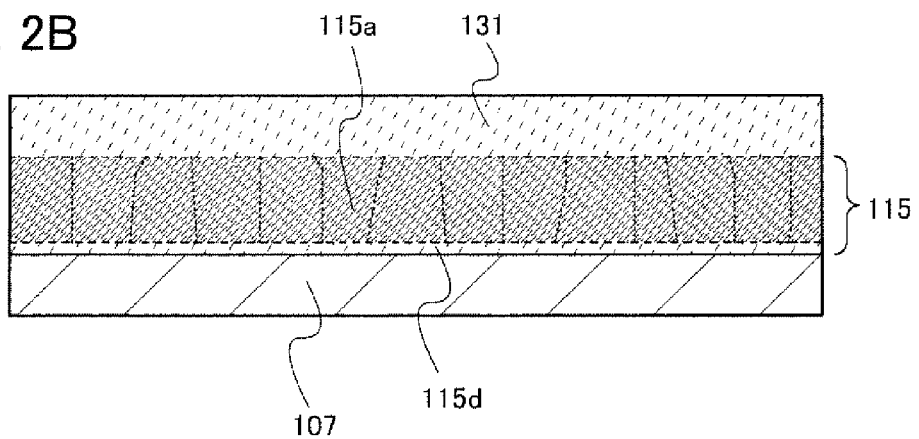

Alternatively, in the microcrystalline semiconductor layer, an amorphous layer 115d may be formed at an interface with the gate insulating layer 107 and the columnar or needle-like crystals 115a may be formed thereover (see FIG. 2B).

Figure 2C:
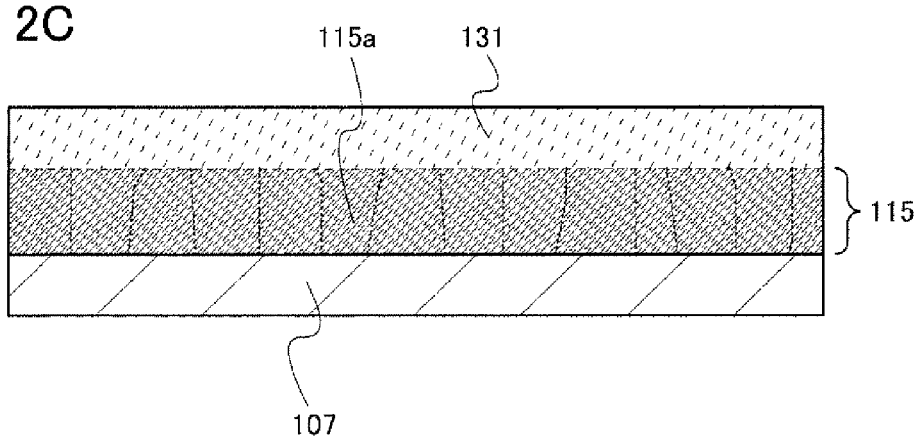

Further alternatively, as illustrated in FIG. 2C, the columnar or needle-like crystals 115a may be formed on a surface of the gate insulating layer 107 without an amorphous structure at an interface between the gate insulating layer 107 and the semiconductor layer 115. When an amorphous structure does not exist at the interface between the gate insulating layer 107 and the semiconductor layer 115 as described above, carriers flow in the columnar or needle-like crystals 115a with high crystallinity; therefore, on-current and field-effect mobility of the thin film transistor can be increased.

Microcrystalline silicon, which is a typical example of a microcrystalline semiconductor, has a Raman spectrum which is shifted to a lower wavenumber side than 520 cm$^{-1}$ that represents single crystal silicon. That is, the peak of the Raman spectrum of the microcrystalline silicon exists between 520 nm$^{-1}$ which represents single crystal silicon and 480 cm$^{-1}$ which represents amorphous silicon. The semiconductor includes hydrogen or halogen of at least 1 at. % to terminate a dangling bond. Moreover, a rare gas element such as helium, argon, krypton, or neon may be contained to further promote lattice distortion, so that stability is enhanced and a favorable microcrystalline semiconductor layer can be obtained. Such a microcrystalline semiconductor layer is disclosed in, for example, U.S. Pat. No. 4,409,134.

Here, a structure of the buffer layer 131 which is one of main features of the present invention will be described. As the buffer layer 131, an amorphous semiconductor layer having an NH group with which dangling bonds of a Si atom are cross-linked is used. Alternatively, an amorphous semiconductor layer having an NH$_2$ group with which dangling bonds of a Si atom are terminated is used. An amorphous semiconductor layer has no constant repeated patterns like a crystal lattice. Therefore, many dangling bonds are included and regions of the dangling bonds become defect levels, and thus the regions are portions where carriers are trapped, thereby reducing the carrier mobility. However, in the buffer layer 131 of the present invention, the dangling bonds are cross-linked with an NH group, or dangling bonds of a Si atom are terminated with an NH$_2$ group, so that the number of dangling bonds is reduced. That is, defect levels in the buffer layer 131 are reduced. Further, dangling bonds are cross-linked with an NH group, whereby the bond portion can be a carrier path, and thus carrier mobility is increased as compared to a conventional amorphous semiconductor layer. As a result, in the case of using the buffer layer of the present invention as a buffer layer of a thin film transistor, on-current and field-effect mobility of the thin film transistor can be increased and off-current thereof can be reduced.

Note that "dangling bonds of a Si atom in an amorphous semiconductor layer are cross-linked with an NH group" means that different bonds of the NH group are used for bonds with different semiconductor elements in the amorphous semiconductor layer. Therefore, a first bond of a N atom is used for a bond with a H atom, a second bond of the N atom is used for a bond with a first semiconductor atom, and a third bond of the N atom is used for a bond with a second semiconductor atom. In addition, "dangling bonds of a Si atom in an amorphous semiconductor layer are terminated with an NH$_2$ group" means that an NH$_2$ group is bonded with the Si atom in the amorphous semiconductor layer. Therefore, the first and second different bonds of the N atom are used for bonds with its different H atoms and the third bond of the N atom is used for a bond with a Si atom.

Note that as an impurity element which suppresses generation of crystal nuclei, oxygen and nitrogen can be given and an impurity element (e.g. nitrogen) in silicon which does not trap carriers is selected. On the other hand, the concentration of an impurity element (e.g. oxygen) which reduces the coordination number of silicon and generates dangling bonds is reduced. Therefore, it is preferable to reduce the oxygen concentration without reducing the nitrogen concentration. Specifically, it is preferable that the oxygen concentration which is measured by secondary ion mass spectrometry be less than or equal to $5 \times 10^{18}$ cm$^{-3}$.

Further, it is preferable that the nitrogen concentration be a concentration at which an amorphous semiconductor layer maintains a semiconductor property, dangling bonds are reduced, and carrier mobility is increased. When the nitrogen concentration is too high, a semiconductor property is lowered, resulting in high insulating property, and thus on-current is reduced. In addition, when the nitrogen concentration is too low, the carrier mobility is not increased and the defect levels are increased similarly to a conventional amorphous semiconductor layer.

Next, a model will be described below in which carriers flow easily when a plurality of dangling bonds included in the amorphous semiconductor layer as described above are cross-linked with nitrogen, typically, an NH group.

Figure 3:
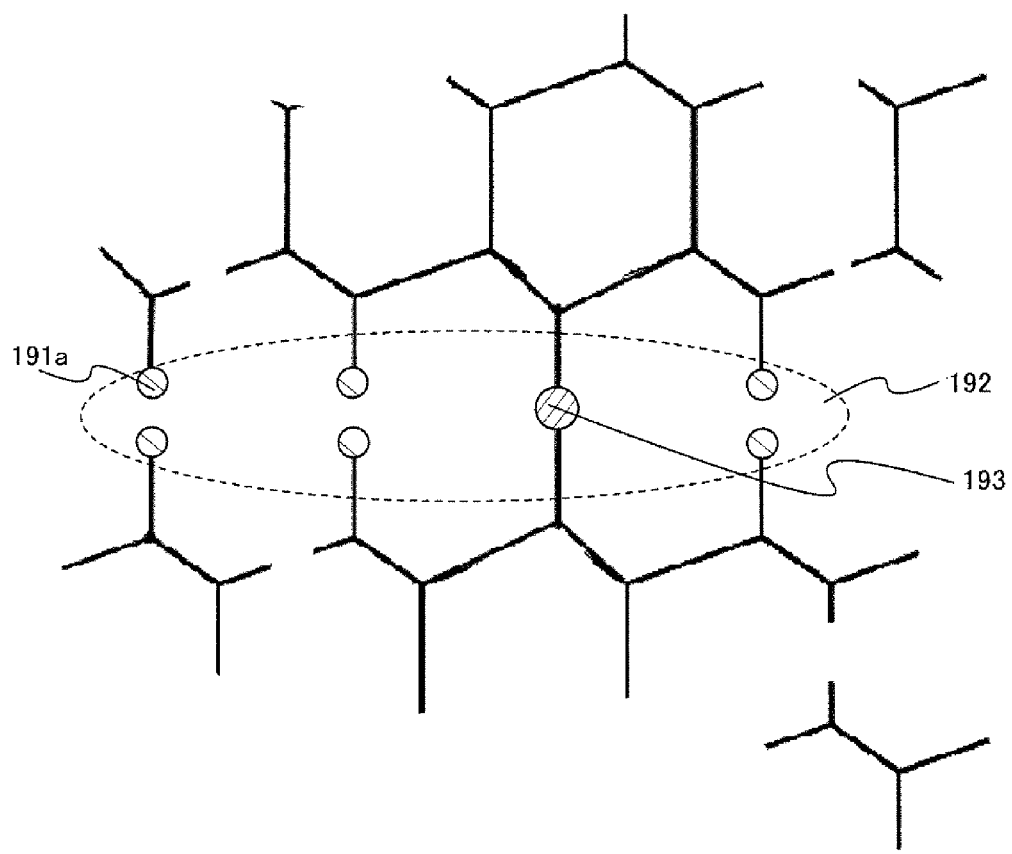
FIG. 3 is a view illustrating a semiconductor layer included in a thin film transistor according to an embodiment of the present invention.
Figure 4:
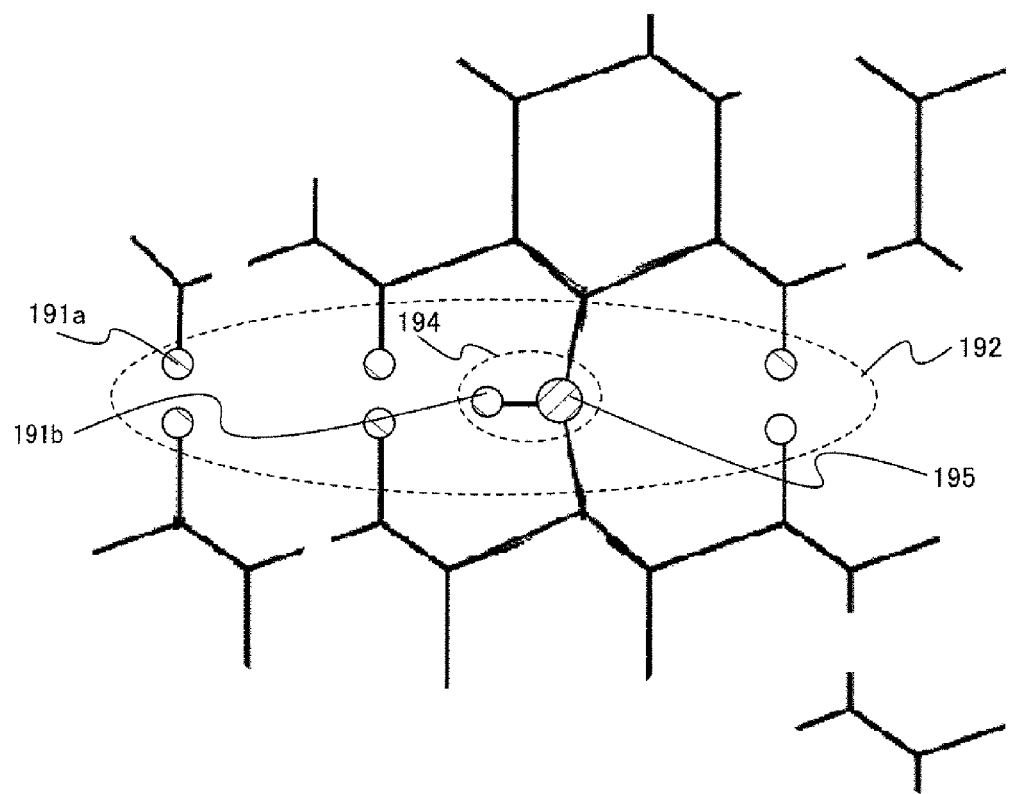
FIG. 4 is a view illustrating a semiconductor layer included in a thin film transistor according to an embodiment of the present invention.

Here, simulation of LUMO (lowest unoccupied molecular orbital) which is a level contributing to n-type-carriers transfer (that is, the lowest level in a conduction band) is performed on each of amorphous silicon layers of a model (model 1) in which one pair of dangling bonds are cross-linked with an O atom 193 in a silicon layer having a defect 192 where dangling bonds of a Si atom are terminated with H atoms 191a as illustrated in FIG. 3, and a model (model 2) in which one pair of dangling bonds are cross-linked with an NH group 194 in a silicon layer having a defect 192 where dangling bonds of a Si atom are terminated with H atoms 191a as illustrated in FIG. 4. As software for the simulation, first principle calculation software employing density functional theory is used. Note that the NH group 194 indicates a nitrogen atom 195 and a hydrogen atom 191b in FIG. 4. Further, an intersection of lines indicates a silicon atom and the line indicates a bond or a dangling bond of the silicon atom. Further, in order to evaluate effectiveness of the oxygen atom and the NH group, the dangling bonds other than the dangling bond cross-linked with the oxygen atom or the NH group are all terminated with the hydrogen atoms.

Figure 5:
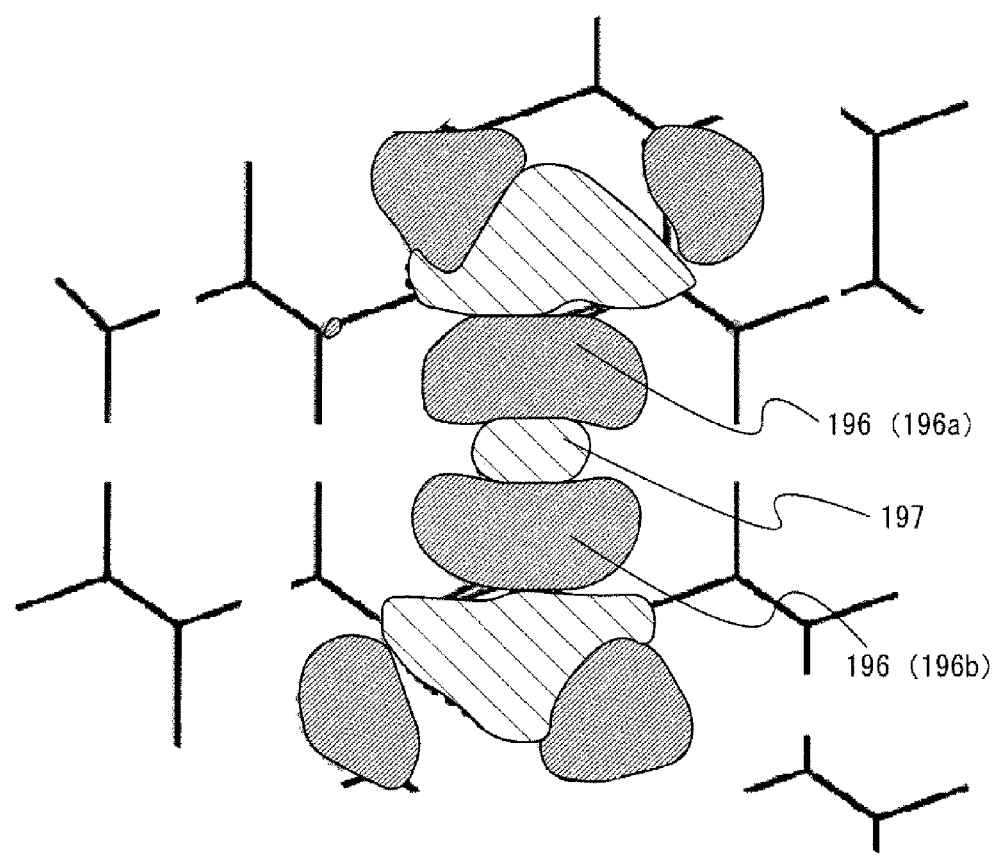
FIG. 5 is a view illustrating a semiconductor layer included in a thin film transistor according to an embodiment of the present invention.
Figure 6:
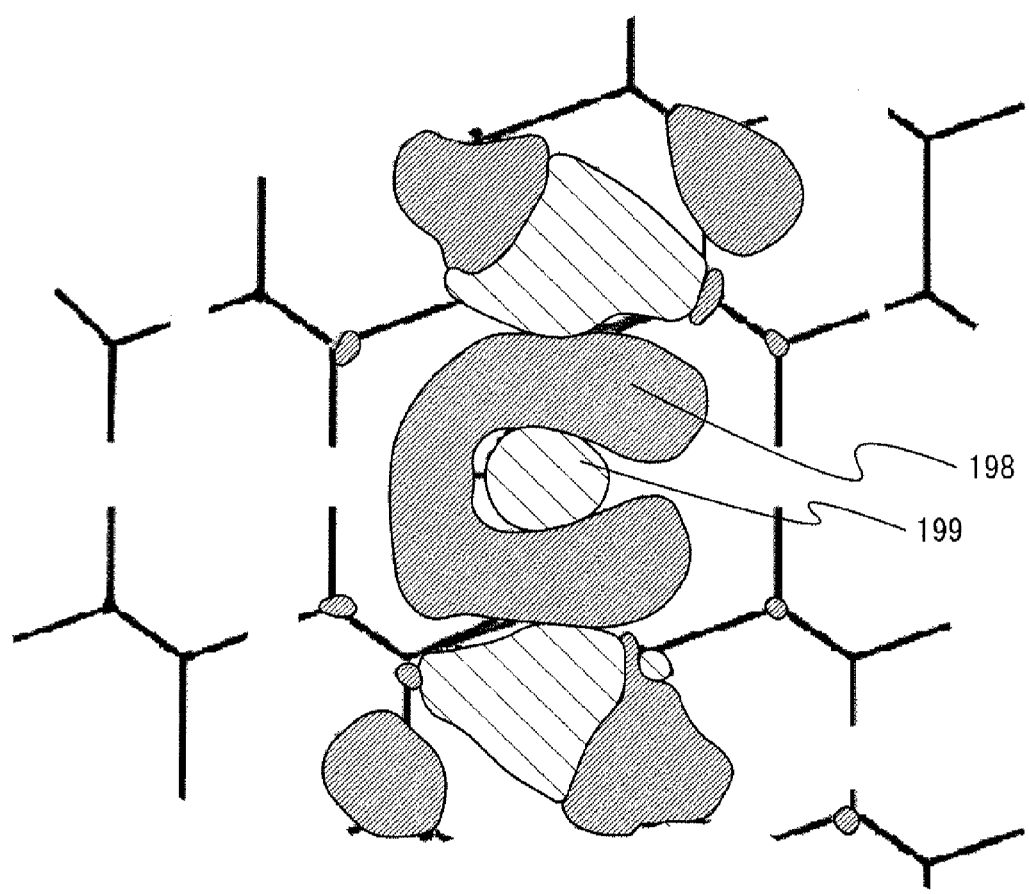
FIG. 6 is a view illustrating a semiconductor layer included in a thin film transistor according to an embodiment of the present invention.

FIG. 5 illustrates a calculation result obtained by using the model 1 and FIG. 6 illustrates a calculation result obtained by using the model 2.

FIG. 5 illustrates a shape of a wave function in a region where the Si atoms are cross-linked with the O atom and in the periphery of the region. A region 196 and a region 197 indicate regions whose phases are positive and negative, respectively (or negative and positive, respectively) and whose absolute value are the same. FIG. 6 illustrates a shape of a wave function in a region where the Si atoms are cross-linked with the NH group and in the periphery of the region. A region 198 and a region 199 are regions whose phases are positive and negative respectively (or negative and positive, respectively) and whose absolute values are the same.

FIG. 5 shows that in the case where the dangling bonds of the Si atom are cross-linked with the O atom, since regions which have the same absolute values and the same phases of a wave function (for example, regions 196a and 196b) are separated, carriers do not easily flow. That is, when the amorphous silicon layer includes oxygen, a bond which interrupts carrier transfer is formed, whereby the carrier mobility of the amorphous silicon layer is reduced.

On the other hand, FIG. 6 shows that in the case where the dangling bonds of the Si atom are cross-linked with the NH group, since the region 198 which has the same absolute value and the same phase of the wave function among different Si atoms is connected to both the adjacent dangling bonds, carriers are likely to flow. That is, when the amorphous silicon layer includes the NH group, a bond which facilitates the carrier transfer in the dangling bonds is formed, whereby the carrier mobility of the amorphous silicon layer is increased. Further, it is considered that the mobility of the thin film transistor is increased.

As is seen from the above, in the amorphous semiconductor layer, the dangling bonds of the Si atom are cross-linked with the NH group, whereby the bond with which carriers can transfer is formed. Further, the carrier mobility of the amorphous semiconductor layer can be increased. Furthermore, the oxygen concentration in the amorphous semiconductor layer is reduced, whereby the bond which interrupts the carrier transfer in the defect can be reduced in the defect.

In the amorphous semiconductor layer, by reducing the oxygen concentration, controlling the nitrogen concentration, and further inclusion of the NH group or the $NH_2$ group, the defect levels of the amorphous semiconductor layer can be reduced, the carrier mobility can be increased, and Shockley-Read-Hall current can be reduced. Therefore, the amorphous semiconductor layer is used for a buffer layer, whereby the off-current of the thin film transistor can be reduced and the on-current thereof can be increased.

In addition, since the drain withstand voltage of the thin film transistor is relieved by using the amorphous semiconductor layer having the NH group for the buffer layer, deterioration of the thin film transistor can be reduced. Further, in the case of forming, using a microcrystalline semiconductor layer, the semiconductor layer which is in contact with the gate insulating layer, an amorphous semiconductor layer having an NH group is used for the buffer layer and the microcrystalline semiconductor layer and an amorphous semiconductor layer having an NH group are formed successively, whereby the interface of the microcrystalline semiconductor and the amorphous structure in the microcrystalline semiconductor layer can be prevented from being oxidized, and thus the carrier mobility of the microcrystalline semiconductor layer can be increased.

A structure of an interface between the microcrystalline semiconductor layer and the buffer layer will be described with reference to FIGS. 29A and 29B.

Figure 29A:
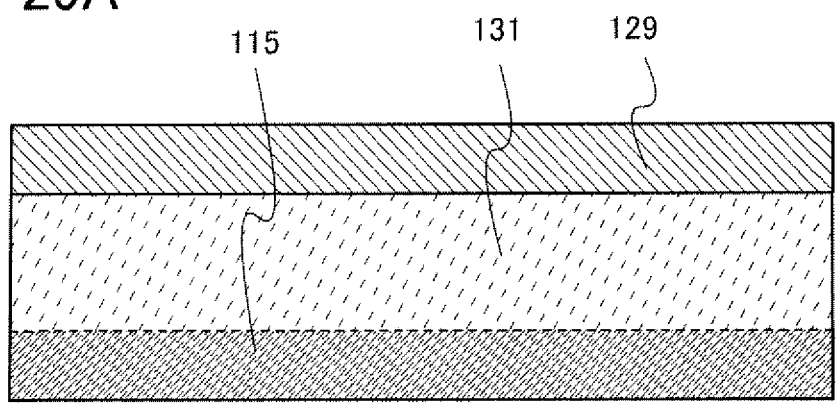
FIGS. 29A and 29B are views each illustrating a structure of a thin film transistor according to an embodiment of the present invention.

As illustrated in FIG. 29A, the interface between the semiconductor layer 115 and the buffer layer 131 can be almost planar. The nitrogen concentration at the interface having such a shape may be set to be high when the buffer layer is deposited over the semiconductor layer 115 to form the amorphous semiconductor layer. As a result, the amorphous semiconductor layer having an NH group can be formed on the surface of the semiconductor layer 115 as the buffer layer 131.

Figure 29B:
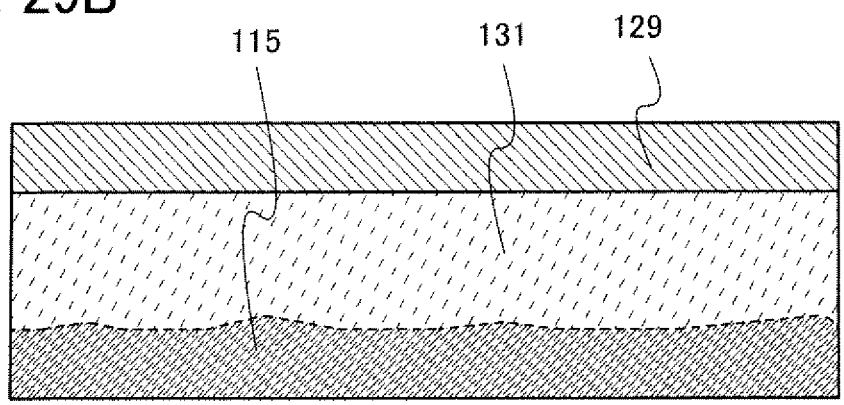

Further, as illustrated in FIG. 29B, the interface between the semiconductor layer 115 and the buffer layer 131 can have projections and depressions. In particular, when the semiconductor layer 115 is a microcrystalline semiconductor layer, the surface of the crystal grain has projections and depressions. However, the projection of the semiconductor layer 115 has an obtuse angle, so that height difference between the top of the projection and the bottom of the depression is small.

As the source and drain regions 129, a semiconductor layer into which an impurity element imparting one conductivity type is added (hereinafter, referred to as an impurity semiconductor layer) is formed. In the case of forming an n-channel thin film transistor, phosphorus may be used as an impurity element imparting one conductivity type, and the thin film transistor is formed typically using amorphous silicon or microcrystalline silicon which contains phosphorus. In the case of forming a p-channel thin film transistor, boron may be used as an impurity element imparting one conductivity type, and the thin film transistor is formed typically using amorphous silicon or microcrystalline silicon which contains boron.

By setting a concentration of an impurity element imparting one conductivity type, here, phosphorus or boron, to $1\times10^{19}$ cm$^{-3}$ to $1\times10^{21}$ cm$^{-3}$, an ohmic contact with the wiring layers 123 and 125 can be obtained, and the impurity semiconductor layer serves as the source and drain regions.

The source and drain regions 129 are formed to have a thickness of greater than or equal to 10 nm and less than or equal to 100 nm, preferably, greater than or equal to 30 nm and less than or equal to 50 nm. When the thickness of the source and drain regions 129 is made small, throughput can be increased.

The wiring layers 123 and 125 can be formed as a single layer or stacked layers using any of aluminum, copper, titanium, neodymium, scandium, molybdenum, chromium, tantalum, tungsten, and the like. An aluminum alloy to which an element to prevent a hillock is added (e.g., an Al—Nd alloy which can be used for the gate electrode layer 103) may be used. Alternatively, crystalline silicon to which an impurity element serving as a donor is added may be used. The wiring layers 123 and 125 may have a stacked-layer structure where a layer on the side which is in contact with the crystalline silicon to which an impurity element serving as a donor is added is formed using titanium, tantalum, molybdenum, tungsten, or nitride of any of these elements and aluminum or an aluminum alloy is formed thereover. Alternatively, top and bottom surfaces of aluminum or an aluminum alloy may be each covered with titanium, tantalum, molybdenum, tungsten, or nitride thereof to form a stacked-layer structure. For example, the wiring layers 123 and 125 preferably have a three-layer structure in which an aluminum layer is sandwiched between molybdenum layers.

According to this embodiment, as compared to a thin film transistor in which an amorphous semiconductor is included in a channel formation region, on-current of a thin film transistor can be increased. In addition, as compared to a thin film transistor in which a microcrystalline semiconductor is included in a channel formation region, off-current of a thin film transistor can be reduced.

Embodiment 2

Figure 7A:
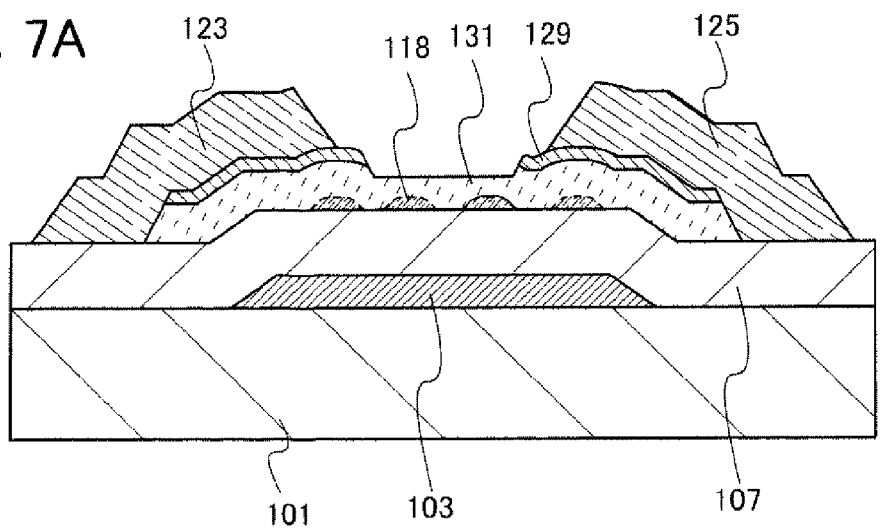
FIGS. 7A and 7B are views illustrating an example of a thin film transistor according to an embodiment of the present invention.

In this embodiment, modes which can be used for the semiconductor layer 115 in the thin film transistor described in Embodiment 1 will be described with reference to FIGS. 7A and 7B and FIGS. 8A and 8B. FIG. 7A is a cross-sectional view of a thin film transistor and FIG. 7B is an enlarged view of a region in which the gate insulating layer 107, a microcrystalline semiconductor 118, and the buffer layer 131 are in contact with each other.

Figure 7B:
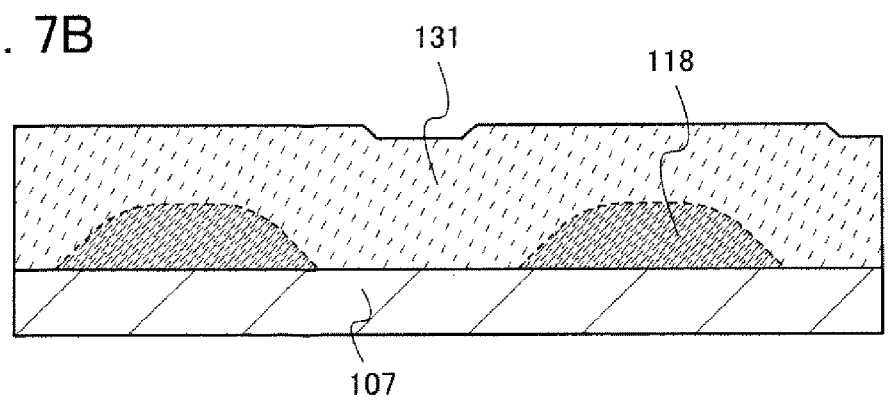

As illustrated in FIGS. 7A and 7B, in a thin film transistor described in this embodiment, dispersed microcrystalline semiconductor particles or a net-like microcrystalline semiconductor 118 are formed over the gate insulating layer 107.

Figure 8A:
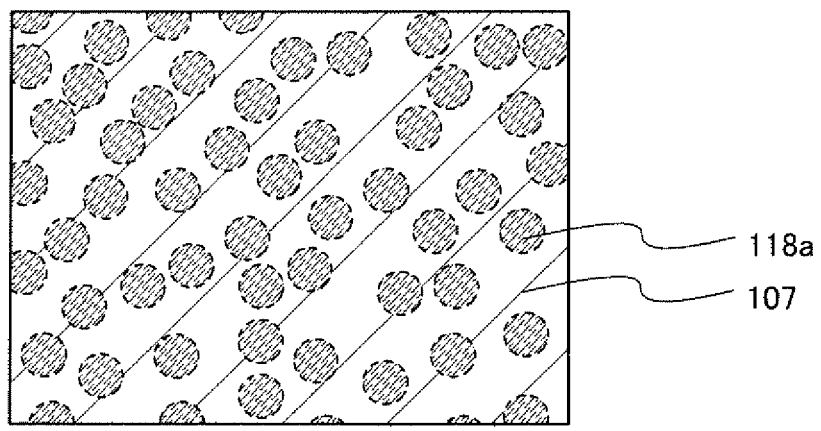
FIGS. 8A and 8B are views each illustrating a semiconductor layer included in a thin film transistor according to an embodiment of the present invention.

Dispersed microcrystalline semiconductor particles 118a can be formed using silicon, silicon germanium ($Si_xGe_{1-x}$, $0.5<x<1$) that contains more silicon than germanium, or the like. As viewed from above, each of the dispersed microcrystalline semiconductor particles has a circular shape as illustrated in FIG. 8A and a cross section thereof has a hemispherical shape as illustrated in FIGS. 7A and 7B. When the diameter of the dispersed microcrystalline semiconductor particle seen from above is set at 1 nm to 30 nm and the density thereof is set at less than $1\times10^{13}/cm^3$, preferably less than $1\times10^{10}/cm^3$, the dispersed microcrystalline semiconductor particles can be formed by only deposition.

The diameter of the dispersed microcrystalline semiconductor particle is not limited to the above and may be larger.

Figure 8B:
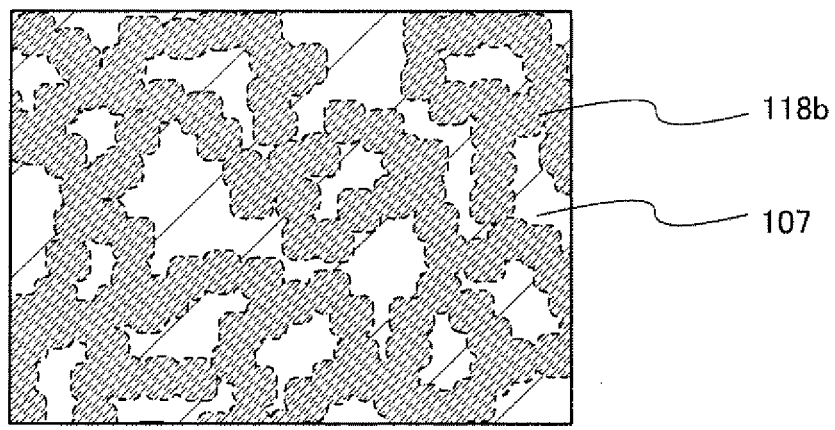

Further, a net-like microcrystalline semiconductor 118b, as illustrated in FIG. 8B, has a shape in which microcrystalline semiconductors are partially continuous and a portion where a microcrystalline semiconductor is continuously formed may be arranged regularly (e.g. lattice-shaped or zigzag) or irregularly. FIG. 8B illustrates a shape viewed from above in which microcrystalline semiconductors are continuous irregularly.

Such a net-like microcrystalline semiconductor 118b in which microcrystalline semiconductors are partially continuous can be formed in such a manner that an amorphous semiconductor or a microcrystalline semiconductor is formed over the gate insulating layer 107, irradiated with a laser beam having energy with such a level that the amorphous semiconductor or the microcrystalline semiconductor is melted, melted, and solidified.

The dispersed microcrystalline semiconductor particle or the net-like microcrystalline semiconductor 118 is formed between the gate insulating layer 107 and the buffer layer 131, whereby adhesion between the buffer layer 131 and the gate insulating layer 107 can be increased. Therefore, a yield of thin film transistors can be enhanced. Further, since the buffer layer 131 is formed using an amorphous semiconductor layer having an NH group, dangling bonds at an interface between the dispersed microcrystalline semiconductor particle or the net-like microcrystalline semiconductor 118 and the buffer layer are cross-linked with the NH group, so that the defect levels at the interface can be reduced. Alternatively, dangling bonds at the interface between the dispersed microcrystalline semiconductor or the net-like microcrystalline semiconductor 118 and the buffer layer are terminated with an $NH_2$ group, so that the defect levels at the interface can be reduced.

According to this embodiment, as compared to a thin film transistor in which an amorphous semiconductor is included in a channel formation region, on-current of a thin film transistor can be increased. In addition, as compared to a thin film transistor in which a microcrystalline semiconductor is included in a channel formation region, off-current of a thin film transistor can be reduced. Further, the dispersed microcrystalline semiconductor particle or the net-like microcrystalline semiconductor is formed over the gate insulating layer, whereby adhesion between the gate insulating layer and the buffer layer is improved, so that yield can be enhanced.

Embodiment 3

In this embodiment, a mode of a thin film transistor which is different from that described in Embodiment 1 will be described with reference to FIGS. 9A and 9B.

Figure 9A:
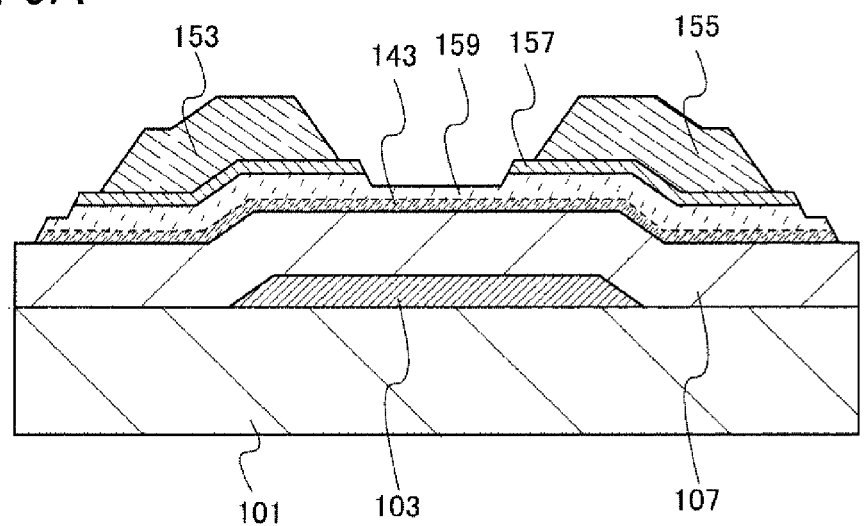
FIGS. 9A and 9B are views illustrating an example of a thin film transistor according to an embodiment of the present invention.
Figure 9B:
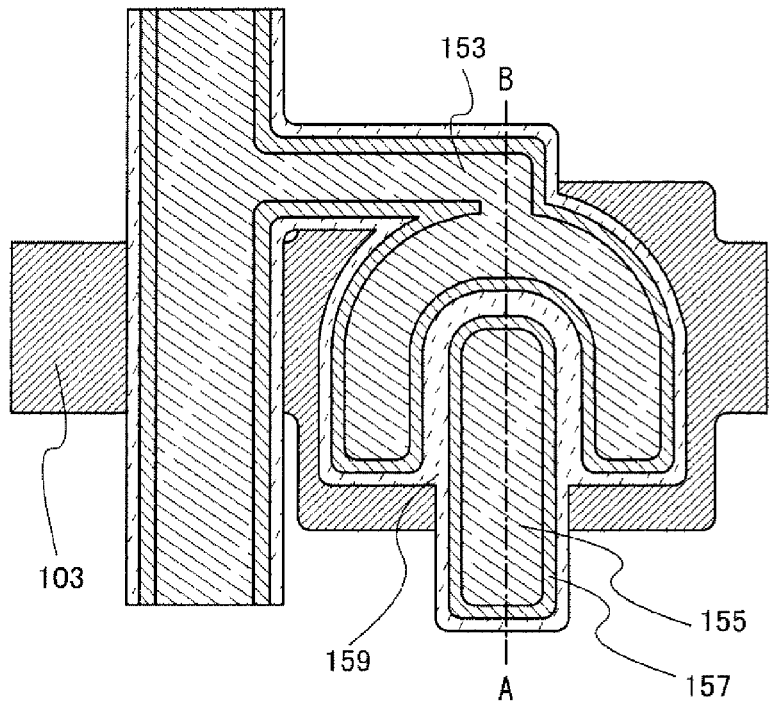

FIG. 9A is a cross-sectional view taken along a line A-B of FIG. 9B illustrating a thin film transistor of this embodiment. A thin film transistor illustrated in FIG. 9A includes a gate electrode layer 103 over a substrate 101; a gate insulating layer 107 which covers the gate electrode layer 103; a semiconductor layer 143 which is provided over and in contact with the gate insulating layer 107 and serves as a channel formation region; a buffer layer 159 over the semiconductor layer 143; and source and drain regions 157 which are in contact with part of the buffer layer 159. In addition, the thin film transistor includes a wiring layer 153 and a wiring layer 155 which are provided over and in contact with the source and drain regions 157. The wiring layer 153 and the wiring layer 155 form a source electrode and a drain electrode. Further, each layer has been patterned into a desired shape. Here, the buffer layer 159 is formed using an amorphous semiconductor layer having an NH group.

Further, as illustrated in FIG. 9B, in the shape viewed from above of the thin film transistor of this embodiment, the source and drain regions 157 are exposed at outer edges of the wiring layer 153 and the wiring layer 155. Such a structure is formed by a photolithography process using a multi-tone mask.

The semiconductor layer 143, the buffer layer 159, the source and drain regions 157, and the wiring layers 153 and 155 can be formed using, as appropriate, materials similar to those of the semiconductor layer 115, the buffer layer 131, the source and drain regions 129, and the wiring layers 123 and 125 in Embodiment 1, respectively.

In this embodiment, one of the source electrode and the drain electrode is formed so as to have a U shape (a reversed C shape or a horseshoe shape), and partially surrounds the other of the source electrode and the drain electrode. The distance between the source and drain electrodes is kept almost constant (see FIG. 9B).

One of the source electrode and the drain electrode has the above-described shape, whereby a channel width of the thin film transistor can be increased, and thus the amount of current of when the thin film transistor is turn on is increased. In addition, variation in electric characteristics can be reduced. Further, decrease in reliability due to misalignment of a mask pattern in a manufacturing process can be suppressed. However, the present invention is not limited thereto. One of the source electrode and the drain electrode does not necessarily have a U shape, and the source electrode and the drain electrode may face each other in a linear manner. Further, the shapes of the thin film transistors viewed from above in Embodiments 1 and 2 can be the same as that in this embodiment.

According to this embodiment, as compared to a thin film transistor in which an amorphous semiconductor is included in a channel formation region, on-current of a thin film transistor can be increased. In addition, as compared to a thin film transistor in which a microcrystalline semiconductor is included in a channel formation region, off-current of a thin film transistor can be reduced.

Embodiment 4

In this embodiment, a method for manufacturing a thin film transistor and a pixel portion of a display device will be described below. Here, a liquid crystal display device is used as a display device. An n-channel thin film transistor has higher carrier mobility than a p-channel thin film transistor. It is preferable that all thin film transistors formed over the same substrate have the same polarity because the number of manufacturing steps can be reduced. Therefore, in this embodiment, a method for manufacturing an n-channel thin film transistor will be described.

Figure 10A:
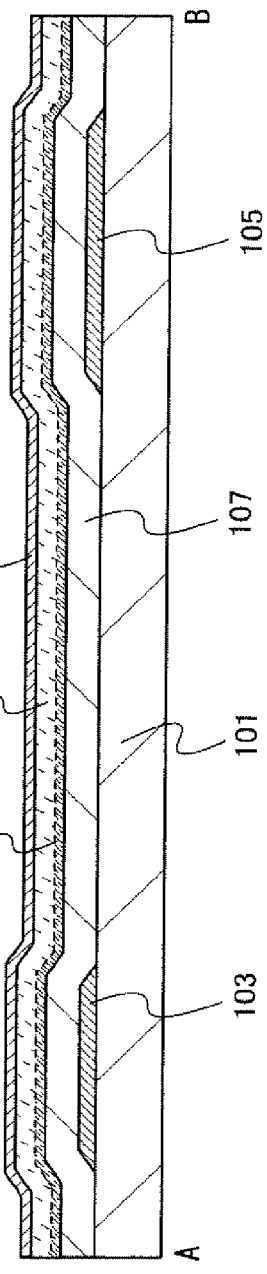
FIGS. 10A to 10C are views illustrating an example of a method for manufacturing a thin film transistor according to an embodiment of the present invention.

First, a gate electrode layer 103 and a capacitor wiring 105 are formed over a substrate 101 (see FIG. 10A).

As the substrate 101, the substrate 101 described in Embodiment 1 can be used as appropriate.

The gate electrode layer 103 and the capacitor wiring 105 are formed using a material used for the gate electrode layer 103 described in Embodiment 1 as appropriate. The gate electrode layer 103 and the capacitor wiring 105 can be formed in such a manner that a conductive layer is formed over the substrate 101, using the above material by a sputtering method or a vacuum evaporation method, a mask is formed over the conductive layer by a photolithography method, an inkjet method, or the like, and the conductive layer is etched using the mask. Alternatively, the gate electrode layer 103 can be formed by discharging a conductive nanopaste of silver, gold, copper, or the like over the substrate by an inkjet method and baking the conductive nanopaste. Note that a nitride layer of any of the above metal materials may be provided between the substrate 101 and the gate electrode layer 103 and the capacitor wiring 105. Here, the conductive layer is formed over the substrate 101 and etched using a resist mask which is formed using a photomask.

Note that it is preferable that side surfaces of the gate electrode layer 103 and the capacitor wiring 105 have a tapered shape. This is in order to prevent disconnection at a step portion because the semiconductor layer and the wiring layer are to be formed over the gate electrode layer 103 in a later step. In order that the side surfaces of the gate electrode layer 103 and the capacitor wiring 105 have a tapered shape, etching may be performed while the resist mask is made to recede. For example, by using an etching gas containing an oxygen gas, etching can be performed while the resist mask is made to recede.

Through the step of forming the gate electrode layer 103, a gate wiring (a scanning line) can also be formed at the same time. Note that a "scanning line" means a wiring which selects a pixel, while a "capacitor wiring" means a wiring which is connected to one of electrodes of a storage capacitor in a pixel. However, without limitation thereto, the gate electrode layer 103 and one or both of a gate wiring and a capacitor wiring may be formed separately.

Next, a gate insulating layer 107, a semiconductor layer 109, a buffer layer 111, and an impurity semiconductor layer 113 are formed so as to cover the gate electrode layer 103.

The gate insulating layer 107 can be formed using any of the materials for the gate insulating layer 107 which are described in Embodiment 1 as appropriate. Furthermore, the gate insulating layer 107 can be formed by a CVD method, a sputtering method, or the like. The gate insulating layer 107 can be formed by a plasma CVD method with a frequency of 1 MHz to 20 MHz, typically a high frequency of 13.56 MHz; or a high frequency of higher than 20 MHz and lower than or equal to 120 MHz approximately, typically 27.12 MHz or 60 MHz. Further, the gate insulating layer 107 may be formed using a microwave plasma CVD apparatus with a high frequency (greater than or equal to 1 GHz). When the gate insulating layer 107 is formed by a microwave plasma CVD apparatus, the withstand voltage between a gate electrode and a drain electrode or a source electrode can be improved; therefore, a highly reliable thin film transistor can be obtained.

Here, as an example of the gate insulating layer 107, a silicon oxynitride layer with a thickness of about 110 nm is formed in such a manner that the source gases are introduced into a treatment chamber and stabilized, where the flow rate of $SiH_4$ is 30 sccm and the flow rate of $N_2O$ is 1200 sccm; and plasma discharge of 50 W is performed, where the pressure in the treatment chamber is 40 Pa and the temperature of the substrate is 280° C. After that, similarly to the formation of the silicon nitride layer, only the introduction of $SiH_4$ is stopped, and after several seconds, the plasma discharge is stopped.

It is preferable that the semiconductor layer 109 be formed to have a thickness of greater than or equal to 2 nm and less than or equal to 60 nm, preferably greater than or equal to 10 nm and less than or equal to 30 nm.

A microcrystalline semiconductor layer as the semiconductor layer 109 is formed by glow discharge plasma generated by mixing a deposition gas including silicon or germanium with hydrogen in a reaction chamber of the plasma CVD apparatus. A microcrystalline semiconductor layer is formed using mixture of the deposition gas including silicon or germanium and hydrogen, which is obtained by diluting the deposition gas with hydrogen whose flow rate is 10 times to 2000 times, preferably 50 times to 200 times that of the deposition gas.

As a typical example of the deposition gas including silicon or germanium, $SiH_4$, $Si_2H_6$, $GeH_4$, $Ge_2H_6$, or the like can be given.

Here, as an example of the semiconductor layer 109, a microcrystalline silicon layer with a thickness of about 50 nm can be formed in such a manner that the source gases are introduced in a treatment chamber and stabilized, where the flow rate of SiH$_4$ is 10 sccm and the flow rate of H$_2$ is 1500 sccm, and plasma discharge of 50 W is performed, where the pressure in the treatment chamber is 280 Pa and the temperature of the substrate is 280° C. After that, similarly to the formation of the silicon oxynitride layer, only the introduction of SiH$_4$ is stopped, and after several seconds, the plasma discharge is stopped.

Next, a method for forming the buffer layer 111 will be described.

The buffer layer 111 is formed using an amorphous semiconductor layer having an NH group. Dangling bonds in the amorphous semiconductor layer are preferably cross-linked with an NH group. The dangling bonds are cross-linked with an NH group in such a manner that an oxygen concentration is made low and a nitrogen concentration is made higher than the oxygen concentration, for example, and thus the buffer layer 111 can be formed. Here, it is preferable that the nitrogen concentration be one or more digits higher than the oxygen concentration. More specifically, the oxygen concentration which is measured by secondary ion mass spectroscopy is less than or equal to $5\times10^{18}$ cm$^{-3}$. Further, the nitrogen concentration is greater than or equal to $1\times10^{20}$ cm$^{-3}$ and less than or equal to $1\times10^{21}$ cm$^{-3}$, preferably greater than or equal to $2\times10^{20}$ cm$^{-3}$ and less than or equal to $1\times10^{21}$ cm$^{-3}$.

In this embodiment, the gate insulating layer 107 has a stacked-layer structure in which a silicon oxynitride layer is formed over a silicon nitride layer, and as the semiconductor layer 109, a microcrystalline silicon layer is formed and the microcrystalline semiconductor layer is exposed to ammonia, whereby nitrogen, preferably an NH group, is supplied to the surface of the semiconductor layer 109 to control the nitrogen concentration of the buffer layer.

Figure 14:
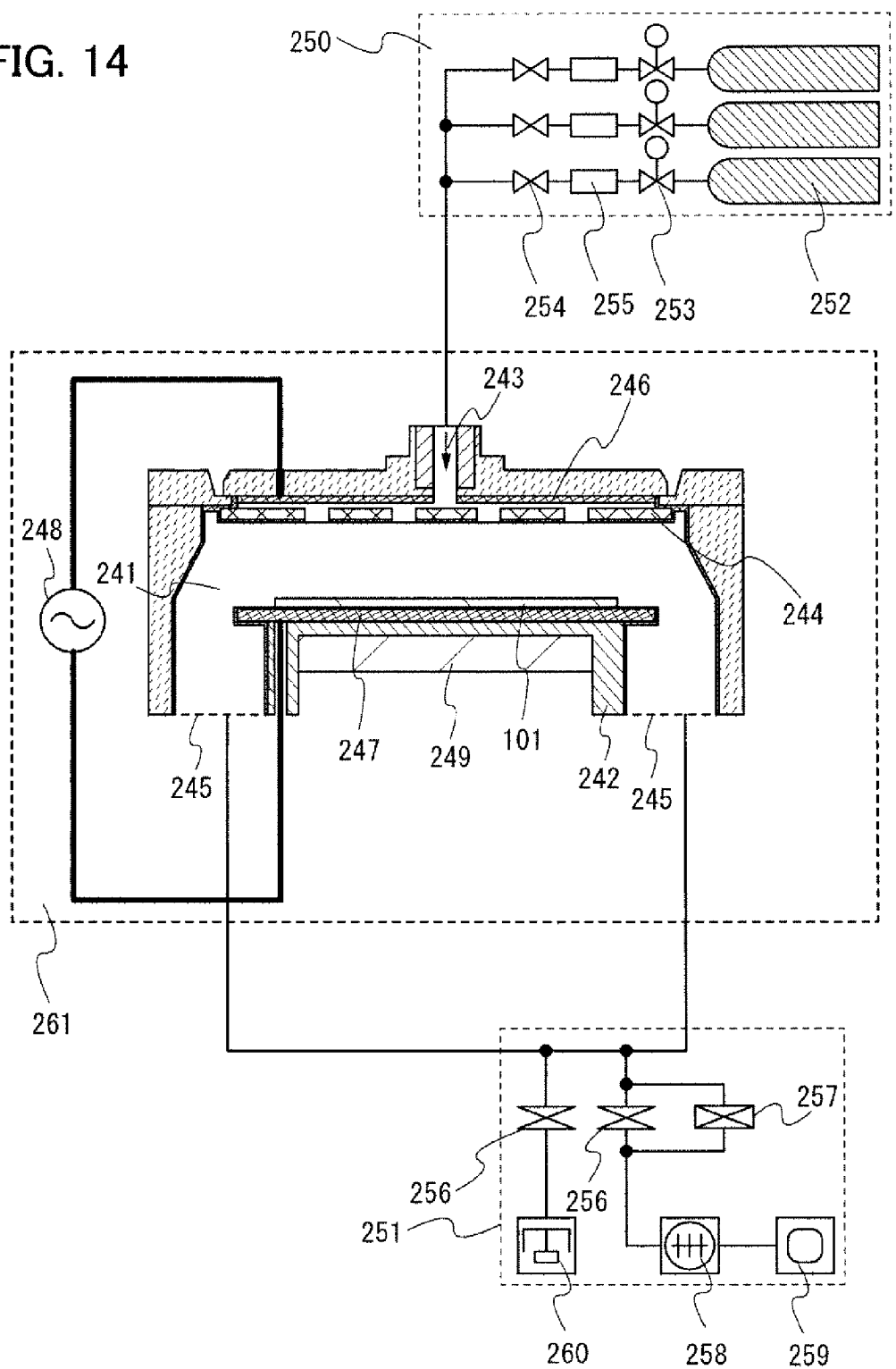
FIG. 14 is a view illustrating a device which can be applied to a method for manufacturing a thin film transistor according to an embodiment of the present invention.

Here, an example of forming the gate insulating layer 107, the semiconductor layer 109, the buffer layer 111, and the impurity semiconductor layer 113 will be described in detail. These layers are formed by a CVD method or the like. Further, the gate insulating layer 107 has a stacked-layer structure in which a silicon oxynitride layer is formed over a silicon nitride layer. By employing such a structure, the silicon nitride layer can prevent an element included in the substrate which adversely affects electric characteristics (an element such as sodium in the case where the substrate is a glass substrate) from entering the semiconductor layer 109 or the like. FIG. 14 is a schematic view illustrating a CVD apparatus which is used for forming these layers.

A plasma CVD apparatus 261 illustrated in FIG. 14 is connected to a gas supply means 250 and an exhaust means 251.

The plasma CVD apparatus 261 illustrated in FIG. 14 includes a treatment chamber 241, a stage 242, a gas supply portion 243, a shower plate 244, an exhaust port 245, an upper electrode 246, a lower electrode 247, an alternate-current power source 248, and a temperature control portion 249.

The treatment chamber 241 is formed using a material having rigidity and the inside thereof can be evacuated to vacuum. The treatment chamber 241 is provided with an upper electrode 246 and a lower electrode 247. Note that in FIG. 14, a structure of a capacitive coupling type (a parallel plate type) is illustrated; however, another structure such as that of an inductive coupling type can be used, as long as plasma can be generated in the treatment chamber 241 by applying two or more different high-frequency powers.

When treatment is performed with the plasma CVD apparatus illustrated in FIG. 14, a given gas is supplied from the gas supply portion 243. The supplied gas is introduced into the treatment chamber 241 through the shower plate 244. High-frequency power is applied with the alternate-current power source 248 connected to the upper electrode 246 and the lower electrode 247 to excite the gas in the treatment chamber 241, whereby plasma is generated. Further, the gas in the treatment chamber 241 is exhausted through the exhaust port 245 which is connected to a vacuum pump. Further, the temperature control portion 249 makes it possible to perform plasma treatment while an object to be processed is being heated.

The gas supply means 250 includes a cylinder 252 which is filled with a reactive gas, a pressure adjusting valve 253, a stop valve 254, a mass flow controller 255, and the like. The treatment chamber 241 includes a shower plate which is processed in a plate-like shape and provided with a plurality of pores, between the upper electrode 246 and the substrate 101. A reactive gas supplied to the upper electrode 246 is supplied to the treatment chamber 241 from the pores in the upper electrode 246 having a hollow structure.

The exhaust means 251 which is connected to the treatment chamber 241 has a function of vacuum evacuation and a function of controlling the pressure inside the treatment chamber 241 to be maintained at a predetermined level when a reactive gas is made to flow. The exhaust means 251 includes in its structure a butterfly valve 256, a conductance valve 257, a turbo molecular pump 258, a dry pump 259, and the like. In the case of arranging the butterfly valve 256 and the conductance valve 257 in parallel, the butterfly valve 256 is closed and the conductance valve 257 is operated, so that the evacuation speed of the reactive gas is controlled and thus the pressure in the treatment chamber 241 can be kept in a predetermined range. Moreover, the butterfly valve 256 having higher conductance is opened, so that high-vacuum evacuation can be performed.

In the case of performing ultra-high vacuum evacuation up to a pressure lower than $10^{-5}$ Pa on the treatment chamber 241, a cryopump 260 is preferably used together. Alternatively, when exhaust is performed up to ultra-high vacuum as ultimate vacuum, the inner wall of the treatment chamber 241 may be polished into a mirror surface, and the treatment chamber 141 may be provided with a heater for baking in order to reduce deflation from the inner wall.

Note that as illustrated in FIG. 14, when precoating treatment is performed so that a layer is formed (deposited) so as to cover the entire treatment chamber 241, it is possible to prevent an impurity element attached to the inner wall of the treatment chamber or an impurity element for forming the inner wall of the treatment chamber from mixing into an element. In this embodiment, as precoating treatment, a layer containing silicon as its main component may be formed. For example, an amorphous silicon layer or the like may be formed. Note that it is preferable that this layer does not include oxygen.

A series of steps from a step of forming the gate insulating layer 107 to a step of forming the impurity semiconductor layer will be described with reference to FIG. 15. Note that the gate insulating layer 107 is formed in such a manner that a silicon oxynitride layer is stacked over a silicon nitride layer.

Figure 15:
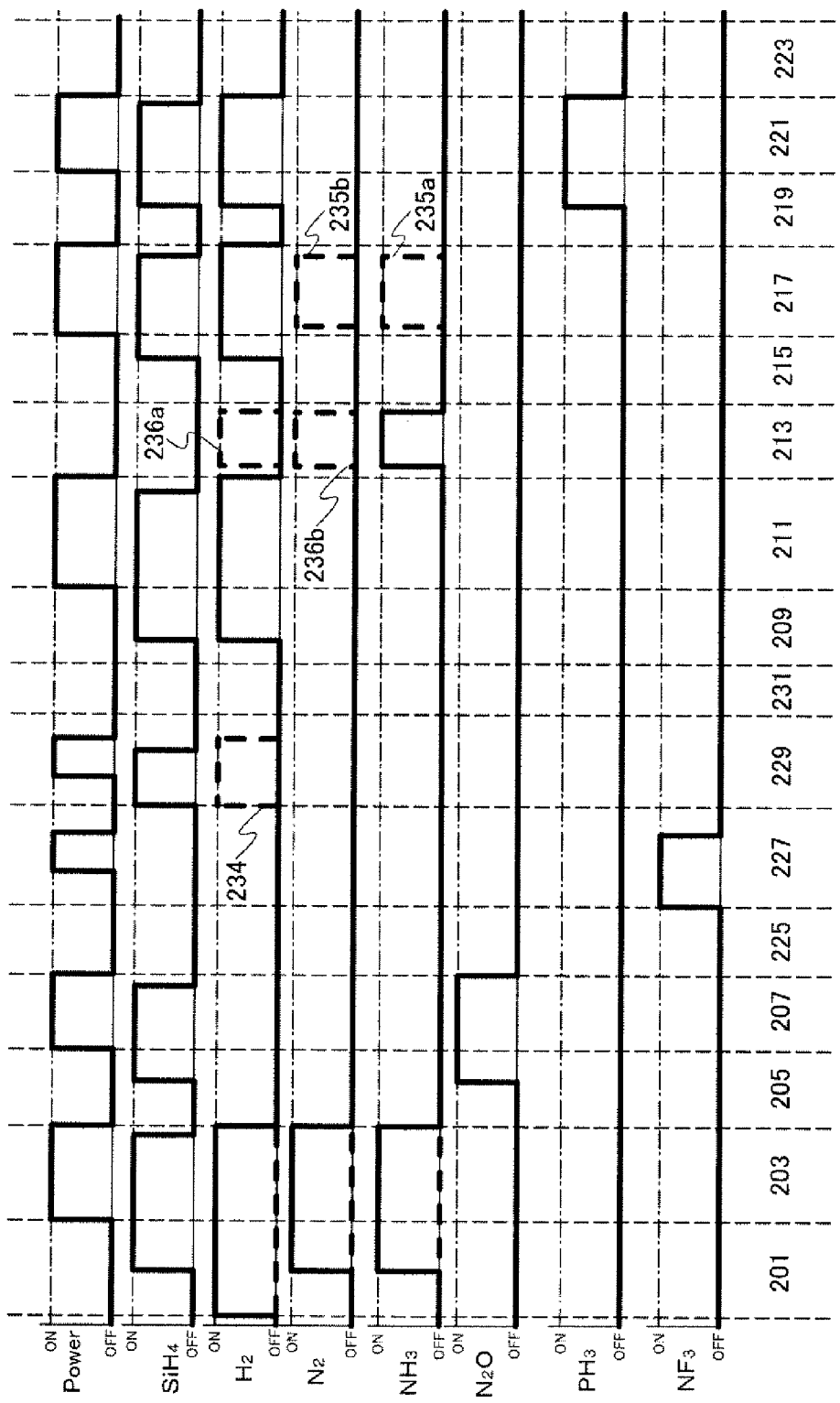
FIG. 15 is a diagram showing an example of a timing chart of a method for manufacturing a thin film transistor according to an embodiment of the present invention.

First, the substrate over which the gate electrode layer 103 is formed is heated in the treatment chamber 241 of the CVD apparatus, and in order to form a silicon nitride layer, source gases used for depositing a silicon nitride layer are introduced into the treatment chamber 241 (pretreatment 201 in FIG. 15). Here, as an example, a silicon nitride layer with a thickness of about 110 nm is formed in such a manner that the source gases are introduced and stabilized, where the flow rate of SiH$_4$ is 40 sccm, the flow rate of $H_2$ is 500 sccm, the flow rate of $N_2$ is 550 sccm, and the flow rate of $NH_3$ is 140 sccm, and plasma discharge of 370 W is performed, where the pressure in the treatment chamber is 100 Pa and the temperature of the substrate is 280° C. After that, only the introduction of $SiH_4$ is stopped, and after several seconds, the plasma discharge is stopped (formation of SiN 203 in FIG. 15). This is because if plasma discharge is stopped in a state where $SiH_4$ is present in the treatment chamber 141, grains or powders containing silicon as its main component are formed, which causes reduction in yield.

Next, the source gases used for depositing the silicon nitride layer are exhausted and source gases used for depositing a silicon oxynitride layer are introduced into the treatment chamber 241 (replacement of gases 205 in FIG. 15). Here, as an example, a silicon oxynitride layer with a thickness of about 110 nm is formed in such a manner that the source gases are introduced and stabilized, where the flow rate of $SiH_4$ is 30 sccm and the flow rate of $N_2O$ is 1200 seem, and plasma discharge of 50 W is performed, where the pressure in the treatment chamber is 40 Pa and the temperature of the substrate is 280° C. After that, in a manner similar to that of the silicon nitride layer, only the introduction of $SiH_4$ is stopped, and after several seconds, the plasma discharge is stopped (formation of SiON 207 in FIG. 15).

Through the above steps, the gate insulating layer 107 can be formed. After the gate insulating layer 107 is formed, the substrate 101 is carried out of the treatment chamber 241 (unloading 225 in FIG. 15).

After the substrate 101 is carried out of the treatment chamber 241, for example, a $NF_3$ gas is introduced into the treatment chamber 241 and the inside of the treatment chamber 241 is cleaned (cleaning treatment 227 in FIG. 15). After that, treatment for forming an amorphous silicon layer in the treatment chamber 241 is performed (precoating treatment 229 in FIG. 15). Although the amorphous silicon layer is formed in a manner similar to that of a buffer layer 111, which will be described later, hydrogen may be introduced into the treatment chamber 241 as indicated by a dashed line 234 or may not be introduced into the treatment chamber 241. By this treatment, the amorphous silicon layer is formed on the inner wall of the treatment chamber 241. After that, the substrate 101 is carried into the treatment chamber 241 (loading 231 in FIG. 15).

Next, source gases used for depositing the semiconductor layer 109 are introduced into the treatment chamber 241 (replacement of gases 209 in FIG. 15). Next, the semiconductor layer 109 is formed over an entire surface of the gate insulating layer 107. In a later step, the semiconductor layer 109 is patterned into the semiconductor layer 115. First, source gases used for depositing the semiconductor layer 109 are introduced into the treatment chamber. Here, as an example, a microcrystalline silicon layer with a thickness of about 50 nm can be formed in such a manner that the source gases are introduced into a treatment chamber and stabilized, where the flow rate of $SiH_4$ is 10 sccm and the flow rate of $H_2$ is 1500 sccm, and plasma discharge of 50 W is performed, where the pressure in the treatment chamber is 280 Pa and the temperature of the substrate is 280° C. After that, in a manner similar to that of the silicon nitride layer or the like described above, only the introduction of $SiH_4$ is stopped, and after several seconds, the plasma discharge is stopped (formation of a semiconductor layer 211 in FIG. 15).

Next, nitrogen is supplied to the surface of the semiconductor layer 109. Here, by exposing the surface of the semiconductor layer 109 to an ammonia gas, nitrogen is supplied (here, such treatment is referred to as "flushing treatment") (flushing treatment 213 in FIG. 15). Further, hydrogen may be contained in the ammonia gas as indicated by a dashed line 236*a*. Instead of an ammonia gas, a nitrogen gas may be used as indicated by a dashed line 236*b* or a hydrogen gas may be used as indicated by a dashed line 236*a*. Alternatively, an ammonia gas and a nitrogen gas may be used. Here, for example, the treatment may be performed under such conditions that the pressure in the treatment chamber 241 is about 20 Pa to 30 Pa, the substrate temperature is 280° C., and the treatment time is 60 seconds. Further alternatively, after the flushing treatment, the pressure in the treatment chamber is reduced or increased to be controlled, so that the amount of nitrogen in the treatment chamber 141 may be controlled. Note that in the treatment of this step, the substrate 101 is only exposed to an ammonia gas; however, plasma treatment may be performed. After that, these gases are exhausted and gases used for depositing the buffer layer 111 are introduced (replacement of gases 215 in FIG. 15).

Next, the buffer layer 111 is formed over an entire surface of the semiconductor layer 109. In a later step, the buffer layer 111 is patterned into the buffer layer 131. Here, the buffer layer is formed using an amorphous semiconductor layer having an NH group. Here, as an example, an amorphous semiconductor layer 105*a* with a thickness of about 50 nm, here, an amorphous silicon layer can be formed in such a manner that the source gases are introduced and stabilized, where the flow rate of $SiH_4$ is 280 sccm and the flow rate of $H_2$ is 300 sccm; the pressure in the treatment chamber is 280 Pa; the temperature of the substrate is 280° C.; and plasma discharge is performed with the RF power source frequency of 13.56 MHz; and the power of the RF power source of 60 W. In this step, the ammonia gas introduced into the reaction chamber by the flushing treatment is decomposed by plasma discharge, so that an NH group or an $NH_2$ group is generated. Further, when the amorphous semiconductor layer is deposited, different dangling bonds included in the amorphous semiconductor layer can be cross-linked to each other. Further, different dangling bonds included in the amorphous semiconductor layer can be terminated. Note that in the case of introducing a nitrogen gas as a gas containing nitrogen into the reaction chamber, a hydrogen gas which is a source gas of the amorphous semiconductor layer and the nitrogen gas are reacted with each other by plasma discharge, so that an NH group or an $NH_2$ group is generated. Further, different dangling bonds in the amorphous semiconductor layer are cross-linked with the NH group. Further, dangling bonds included in the amorphous semiconductor layer can be terminated with the NH group. After that, in a manner similar to that of the silicon nitride layer or the like described above, only the introduction of $SiH_4$ is stopped, and after several seconds, the plasma discharge is stopped (formation of a buffer layer 217 in FIG. 15). After that, these gases are exhausted and gases used for depositing the impurity semiconductor layer 113 are introduced (replacement of gases 219 in FIG. 15).

A gas containing nitrogen is supplied to a reaction chamber in which the buffer layer of this embodiment is formed. The gas containing nitrogen is subjected to plasma discharge, so that an NH group or an $NH_2$ group is generated. Further, as described above, dangling bonds included in the amorphous silicon layer are cross-linked with an NH group. Further, dangling bonds included in the amorphous silicon layer can be terminated with an NH group. Therefore, in the reaction chamber where a gas containing nitrogen is supplied, the buffer layer 111 is formed over the semiconductor layer 109, whereby an amorphous semiconductor layer having an NH group with which dangling bonds are cross-linked can be formed. Further, an amorphous semiconductor layer having an NH$_2$ group with which dangling bonds are terminated can be formed.

In the buffer layer 111 formed by such a method, the nitrogen concentration which is measured by secondary ion mass spectrometry has a peak at an interface between the semiconductor layer 109 and the buffer layer 111 and is gradually reduced in a direction in which the semiconductor layer 109 is deposited.

Note that as indicated by a dashed line 235a in FIG. 15, in formation of a buffer layer 217, an ammonia gas may be made to flow in the reaction chamber. Instead of an ammonia gas, as indicated by a dashed line 235b, a nitrogen gas may be made to flow. Further, an ammonia gas and a nitrogen gas may be made to flow. As a result, the nitrogen concentration of the buffer layer 111 is increased, so that dangling bonds included in the amorphous silicon layer are cross-linked or terminated, leading to reduction in the defect levels.

In the buffer layer 111 formed by such a method, the nitrogen concentration which is measured by secondary ion mass spectrometry has a peak at an interface between the semiconductor layer 109 and the buffer layer 111 and is constant in the direction in which the semiconductor layer 109 is deposited.

Next, the impurity semiconductor layer 113 is formed over an entire surface of the buffer layer 111. In a later step, the impurity semiconductor layer 113 is patterned into the source and drain regions 129. First, source gases used for depositing the impurity semiconductor layer 113 are introduced into the treatment chamber 241. Here, as an example, a semiconductor layer with a thickness of about 50 nm can be formed in such a manner that the source gases are introduced and stabilized, where the flow rate of SiH$_4$ is 100 sccm and the flow rate of a mixed gas in which PH$_3$ is diluted with H$_2$ to 0.5 vol % is 170 sccm, and plasma discharge of 60 W is performed, where the pressure in the treatment chamber 241 is 280 Pa and the temperature of the substrate is 280° C. After that, in a manner similar to that of the silicon nitride layer, only the introduction of SiH$_4$ is stopped, and after several seconds, the plasma discharge is stopped (formation of an impurity semiconductor layer 221 in FIG. 15). After that, these gases are exhausted (exhaust 223 in FIG. 15).

As described above, steps of forming components up to the impurity semiconductor layer 113 can be performed (see FIG. 10A).

Figure 10B:
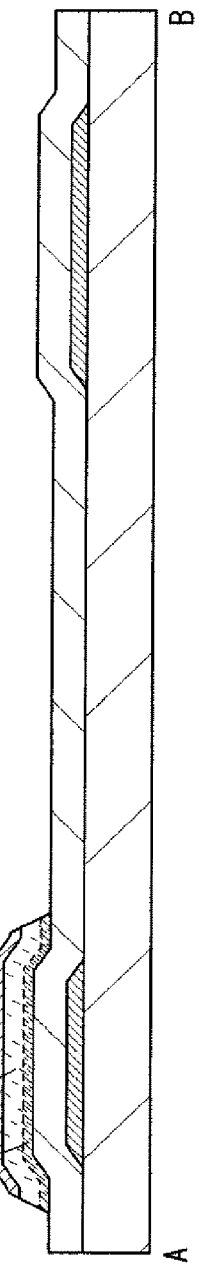

Next, with use of a resist mask formed by a second photolithography step, the semiconductor layer 109, the buffer layer 111, and the impurity semiconductor layer 113 are etched to form the semiconductor layer 115, a buffer layer 117, and an impurity semiconductor layer 119 (see FIG. 10B). After that, the resist mask is removed.

Figure 10C:
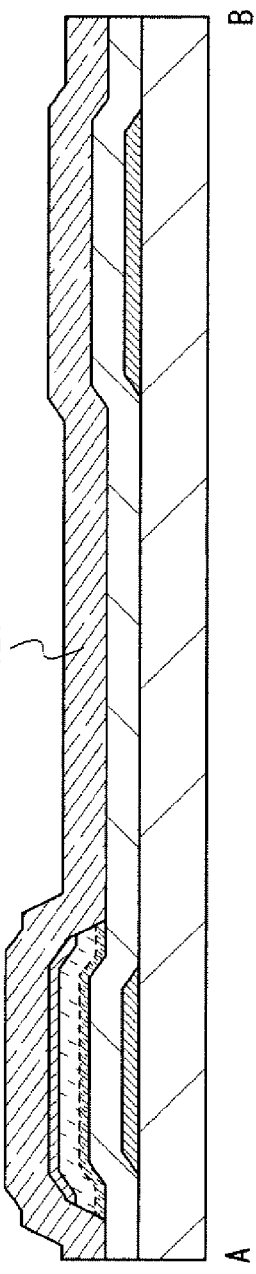

Next, conductive layer 121 is formed so as to cover the semiconductor layer 115, the buffer layer 117, and the impurity semiconductor layer 119 (see FIG. 10C).

The conductive layer 121 can be formed using a material and a stacked-layer structure of the conductive layer 121 described in Embodiment 1 as appropriate. The conductive layer 121 is formed by a CVD method, a sputtering method, or a vacuum evaporation method. Alternatively, the conductive layer 121 may be formed by discharging a conductive nanopaste of silver, gold, copper, or the like by a screen printing method or an inkjet method and baking the conductive nanopaste. After that, a resist mask is formed over the conductive layer 121.

Next, with use of a resist mask formed by a third photolithography step, the conductive layer 121 is etched to form a wiring layer 123 and a wiring layer 125 (see FIG. 11A). The wiring layer 123 and the wiring layer 125 form the source electrode and the drain electrode. The conductive layer 121 is preferably etched by wet etching. By wet etching, the conductive layer is etched isotropically. As a result, the edges of the conductive layer recede to an inner side than the edges of the resist mask, and thus the wiring layer 123 and the wiring layer 125 are formed. Accordingly, the side surfaces of the wiring layer 123 and the wiring layer 125 are not aligned with the side surfaces of the etched source and drain regions 129, and the side surfaces of the source and drain regions are located outside of the side surfaces of the wiring layer 123 and the wiring layer 125. The wiring layer 123 and the wiring layer 125 serve not only as a source electrode and a drain electrode but also as a signal line. However, without limitation thereto, a signal line may be provided separately from the wiring layer 123 and the wiring layer 125.

Figure 13A:
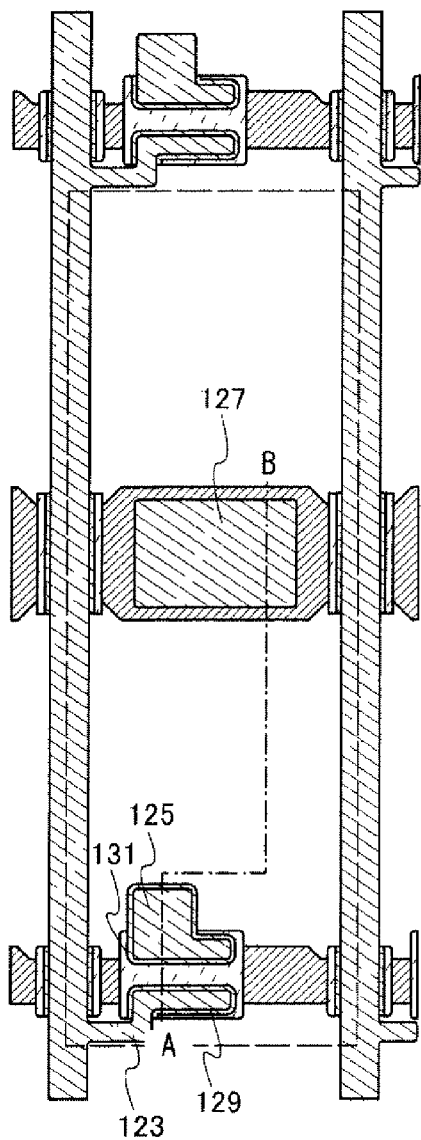
FIGS. 13A and 13B are views illustrating an example of a method for manufacturing a thin film transistor according to an embodiment of the present invention.

Next, with use of a resist mask formed by a third photolithography step, the impurity semiconductor layer 119 and part of the buffer layer 117 are etched (see FIG. 11B). The semiconductor layer 115, the buffer layer 131, and the source and drain regions 129 are formed through the process up to this step. After that, the resist mask is removed. FIG. 13A is a top view of FIG. 11B.

Next, dry etching is preferably performed. A condition of dry etching is set so that the exposed region of the buffer layer 131 is not damaged and the etching rate with respect to the buffer layer 131 is low. In other words, a condition which gives almost no damages to the exposed surface of the buffer layer 131 and hardly reduces the thickness of the exposed region of the buffer layer 131 is applied. As an etching gas, a chlorine-based gas is used; typically, a Cl$_2$ gas is used. There is no particular limitation on an etching method and an inductively coupled plasma (ICP) method, a capacitively coupled plasma (CCP) method, an electron cyclotron resonance (ECR) method, or a reactive ion etching (RIE) method, or the like can be used.

An example of a condition of dry etching which can be used here is as follows: the flow rate of Cl$_2$ gas is 100 sccm; the pressure in a chamber is 0.67 Pa; the temperature of the lower electrode is −10° C.; an RF power (13.56 MHz) of 2000 W is applied to the coil of the upper electrode to generate plasma; no power (i.e. non-biased 0 W) is applied to the substrate 101 side; and thus etching is performed for 30 seconds. The temperature of the inner wall of the chamber is preferably approximately 80° C.

Next, the surface of the buffer layer 131 may be irradiated with water plasma, ammonia plasma, nitrogen plasma, or the like.

Water plasma treatment can be performed in such a manner that a gas containing water typified by water vapor (H$_2$O vapor) as its main component is introduced into a reaction space to generate plasma.

As described above, after the pair of source and drain regions 129 are formed, dry etching is further performed under such a condition that the buffer layer 131 is not damaged, whereby an impurity element such as a residue existing on the exposed region of the buffer layer 131 can be removed. Further, after the dry etching, water plasma treatment is performed, whereby a residue of the resist mask can also be removed. By water plasma treatment, insulation between the source region and the drain region can be secured, and thus, in a thin film transistor which is completed, the off-current can be reduced, the on-current can be increased, and variation in the electric characteristics can be reduced.

Note that the order of the steps of plasma treatment and the like are not limited to the above. Before the resist mask is removed, etching with non-bias applied or plasma treatment may be performed.

Through the steps described above, a thin film transistor according to this embodiment can be manufactured. Like the thin film transistor described in Embodiment 1, the thin film transistor according to this embodiment can also be applied to a switching transistor in a pixel of a display device typified by a liquid crystal display device. Therefore, an insulating layer 133 is formed so as to cover this thin film transistor.

Figure 12A:
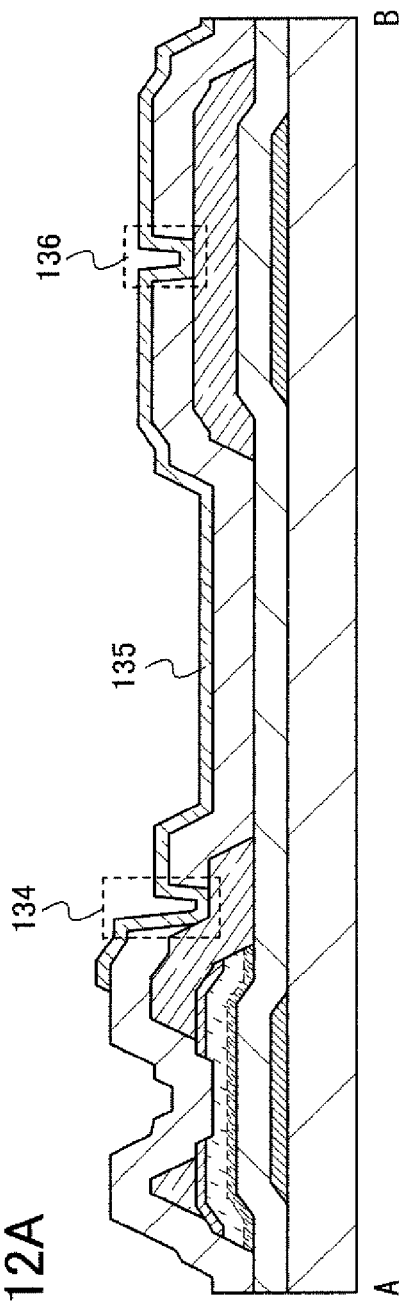
FIGS. 12A and 12B are views illustrating an example of a method for manufacturing a thin film transistor according to an embodiment of the present invention.

Next, an opening 134 and an opening 136 are formed in the insulating layer 133 so as to reach the source electrode and the drain electrode formed using the wiring layer 212. The opening 134 and the opening 136 can be formed by a fourth photolithography step. Note that when the insulating layer 133 is formed using a photosensitive resin, the insulating layer 133 can be formed by the fourth photolithography step. After that, a pixel electrode layer 135 is provided over the insulating layer 133 so that connection through the opening 134 and the opening 136 is obtained. In such a manner, a switching transistor in a pixel of a display device which is illustrated in FIG. 12A can be manufactured.

Note that the insulating layer 133 can be formed in a manner similar to that of the gate insulating layer 107. Further, a dense silicon nitride layer is preferably used as the insulating layer 133 such that entry of a contaminant impurity element such as an organic substance, a metal, or moisture floating in the atmosphere can be prevented.

Note that the pixel electrode layer 135 can be formed using a conductive composition including a conductive macromolecule (also referred to as a conductive polymer) having a light-transmitting property. The pixel electrode layer 135 preferably has a sheet resistance of less than or equal to 10000 $\Omega/cm^2$ and a light transmittance of greater than or equal to 70% at a wavelength of 550 nm. Further, the resistance of the conductive macromolecule included in the conductive composition is preferably less than or equal to 0.1 $\Omega \cdot cm$.

As a conductive macromolecule, a so-called π electron conjugated conductive macromolecule can be used. For example, polyaniline and/or a derivative thereof, polypyrrole and/or a derivative thereof, polythiophene and/or a derivative thereof, and a copolymer of two or more kinds of those materials can be given.

The pixel electrode layer 135 can be formed using, for example, indium oxide including tungsten oxide, indium zinc oxide including tungsten oxide, indium oxide including titanium oxide, indium tin oxide including titanium oxide, indium tin oxide (hereinafter also referred to as ITO), indium zinc oxide, indium tin oxide to which silicon oxide is added, or the like.

The pixel electrode layer 135 may be etched by a photolithography method to be patterned in a manner similar to that of the wiring layers 123, 125 or the like.

Note that although not illustrated, an insulating layer formed using an organic resin by a spin coating method or the like may be formed between the insulating layer 133 and the pixel electrode layer 135. The insulating layer formed using an organic resin is formed using a photosensitive resin, whereby the number of steps can be reduced.

Figure 12B:
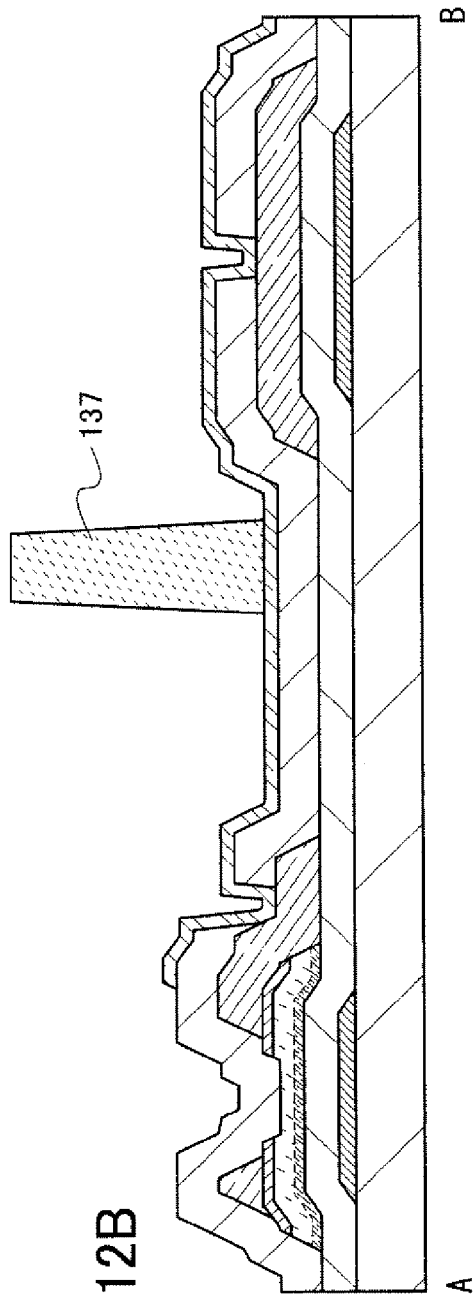
Figure 13B:
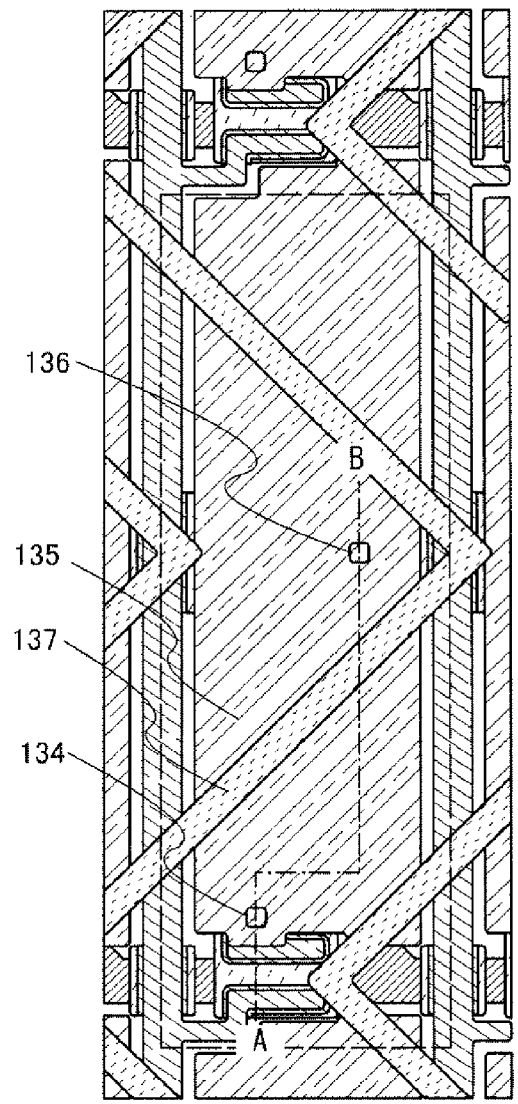

After that, in a vertical alignment (VA) liquid crystal display device, in the case of employing a multi-domain vertical alignment mode (so-called MVA mode) in which pixels are divided into a plurality of portions and the alignment of liquid crystal molecules in pixels of in the divided portions is made different for viewing angle expansion, a protrusion 137 having a predetermined shape is preferably formed over the pixel electrode layer 135. The protrusion 137 is formed using an insulating layer. FIG. 13B is a top view of FIG. 12B.

Here, after a composition containing a photosensitive acrylic is applied to form a composition layer with a thickness of 0.9 μm to 1.0 μm, heating is performed at 90° C. for 120 seconds, so that the composition layer is dried. Next, the composition layer is exposed to light with a photomask and developed to have a predetermined shape. Next, heating is performed at 230° C. for one hour to form an acrylic resin layer.

When the protrusion 137 is formed over the pixel electrode layer, in the case where the voltage of the pixel electrode is an off-state, liquid crystal molecules are aligned perpendicularly to a surface of an alignment film; however, liquid crystal molecules in the vicinity of the protrusion are aligned to be inclined slightly to the substrate surface. When the voltage is applied to of the pixel electrode layer, first, the liquid crystal molecules in the vicinity of the protrusion which are aligned to be inclined slightly are inclined. Further, the liquid crystal molecules other than those in the vicinity of the protrusion are also affected by the liquid crystal molecules in the vicinity of the protrusion to be sequentially aligned in the same direction. As a result, stable alignment can be obtained in all the pixels. That is, alignment of the liquid crystal molecules in the entire display portion is controlled from the protrusion.

Instead of the protrusion provided over the pixel electrode layer, a slit may also be provided for the pixel electrode. In this case, when a voltage is applied to the pixel electrode layer, electric field distortion is generated near the slit and electric field distribution and alignment of the liquid crystal molecules can be controlled similarly to the case where the protrusion is provided over the pixel electrode layer.

Through the steps described above, an element substrate can be manufactured which can be used for a liquid crystal display device and which has a thin film transistor with high on-current as compared to a thin film transistor in which an amorphous semiconductor is included in a channel formation region and with low off-current as compared to a thin film transistor in which a microcrystalline semiconductor is included in a channel formation region.

Embodiment 5

In this embodiment, a formation process of a buffer layer which can be applied to Embodiment 4 will be described.

In this embodiment, the inside of a treatment chamber is cleaned before the buffer layer 111 is deposited, and after that, the inner wall of the chamber is covered with a silicon nitride layer, whereby nitrogen is included in the buffer layer 111, the oxygen concentration is suppressed low, and the nitrogen concentration is made higher than the oxygen concentration. Since a series of steps from a step of forming the gate insulating layer 107 to a step of forming the semiconductor layer 109 can be performed in a manner similar to that of Embodiment 4, here, a series of steps from a step of forming of the semiconductor layer 109 to a step of forming the impurity semiconductor layer 113 will be described with reference to FIG. 16.

Next, the semiconductor layer 109 is formed over an entire surface of the gate insulating layer 107. In a later step, the semiconductor layer 109 is patterned into the semiconductor layer 115. First, source gases used for depositing the semiconductor layer 109 are introduced into the treatment chamber. Here, as an example, in a manner similar to that of Embodiment 4, a microcrystalline semiconductor layer with a thickness of about 50 nm is formed as the semiconductor layer 109. After that, the plasma discharge is stopped (formation of a semiconductor layer 211 in FIG. 16). After that, the substrate 101 is carried out of the treatment chamber 241 (unloading 225 in FIG. 16).

Figure 16:
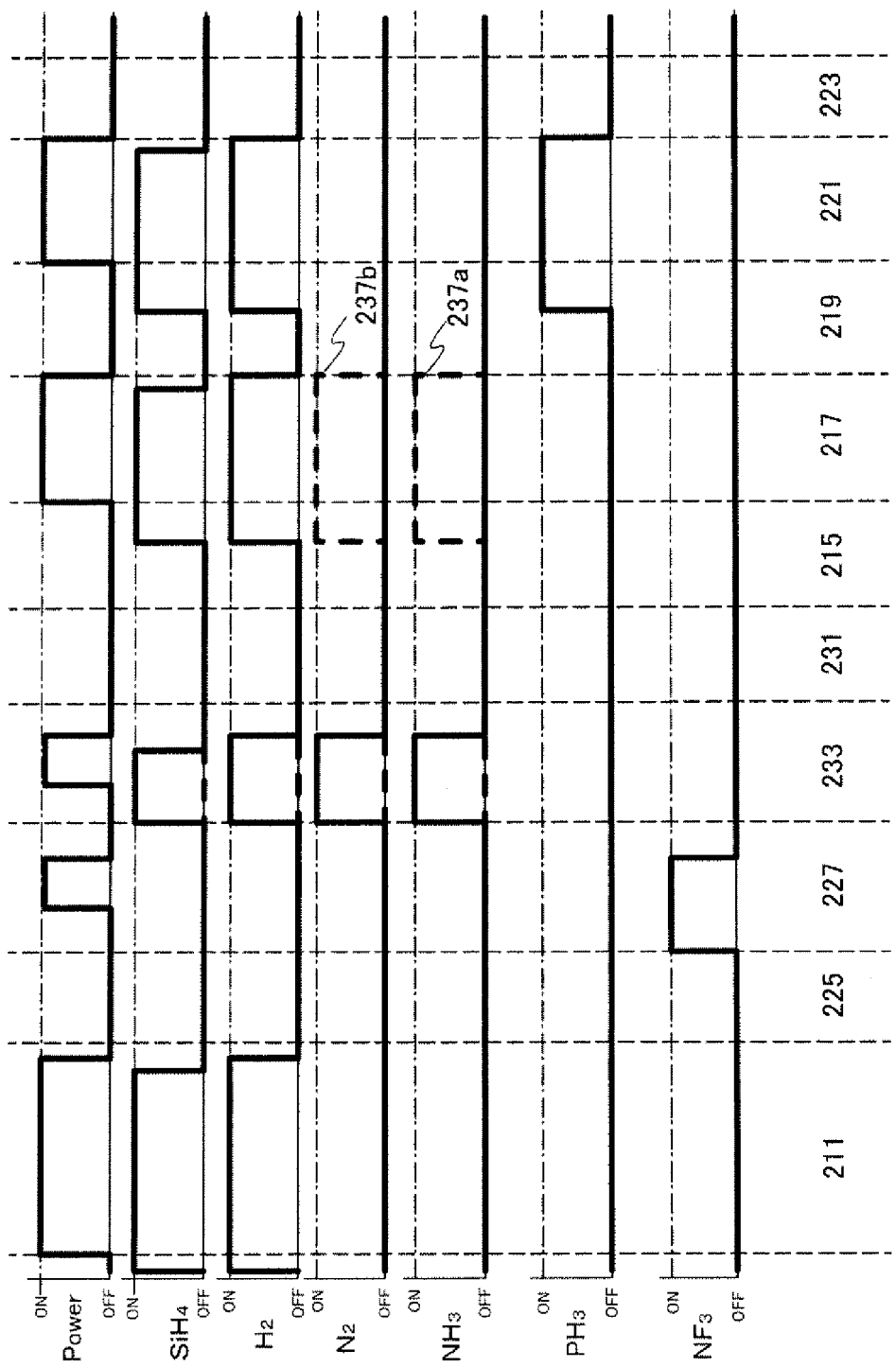
FIG. 16 is a diagram showing an example of a timing chart of a method for manufacturing a thin film transistor according to an embodiment of the present invention.

After the substrate 101 is carried out of the treatment chamber 241, for example, a $NF_3$ gas is introduced into the treatment chamber 241 and the inside of the treatment chamber 241 is cleaned (cleaning treatment 227 in FIG. 16). After that, treatment for forming a silicon nitride layer in the treatment chamber 241 is performed (precoating treatment 233 in FIG. 16). The silicon nitride layer is formed under the same conditions as the silicon nitride layer formed as the gate insulating layer in Embodiment 4. By this treatment, the silicon nitride layer is formed on the inner wall of the treatment chamber 241. After that, the substrate 101 is carried into the treatment chamber 241 (loading 231 in FIG. 16).

Next, source gases used for depositing the buffer layer 111 are introduced into the treatment chamber 241 (replacement of gases 215 in FIG. 16). Next, the buffer layer 111 is formed over an entire surface of the semiconductor layer 109. In a later step, the buffer layer 111 is patterned into the buffer layer 131. Here, as the buffer layer, in a manner similar to that of Embodiment 4, an amorphous silicon layer having an NH group with a thickness of about 80 nm can be formed. After that, the plasma discharge is stopped (formation of a buffer layer 217 in FIG. 16). After that, these gases are exhausted and gases used for depositing the impurity semiconductor layer 113 are introduced (replacement of gases 219 in FIG. 16). In a manner similar to that of Embodiment 4, the impurity semiconductor layer 113 is formed (formation of an impurity semiconductor layer 221 in FIG. 16).

A silicon nitride layer is formed on the surface of the treatment chamber 241 in this embodiment. When a silicon nitride layer formed in the treatment chamber 241 is exposed to plasma in a step of forming the buffer layer 111, nitrogen is preferably dissociated into an NH group or an $NH_2$ group, and thus at the early stage of depositing the buffer layer 111, nitrogen, preferably, an NH group or an $NH_2$ group can be mixed into the buffer layer 111. Further, when an amorphous semiconductor layer is deposited, different dangling bonds in the amorphous semiconductor layer can be cross-linked. Further, when the amorphous semiconductor layer is deposited, dangling bonds in the amorphous semiconductor layer can be terminated.

In the buffer layer 111 formed by such a method, the nitrogen concentration which is measured by secondary ion mass spectrometry has a peak at an interface between the semiconductor layer 109 and the buffer layer 111 and is gradually reduced in a direction in which the semiconductor layer 109 is deposited.

As described above, at least right before the semiconductor layer is formed, the inner wall of the treatment chamber is covered with a silicon nitride layer, whereby the oxygen concentration can be suppressed low and the nitrogen concentration can be made higher than the oxygen concentration, and an amorphous semiconductor layer having an NH group can be formed.

Further, covering the inner wall of the treatment chamber with the silicon nitride film can prevent elements that constitute the inner wall of the treatment chamber and the like from entering the semiconductor layer.

Note that as indicated by a dashed line 237a in FIG. 16, in formation of a buffer layer 217, an ammonia gas may be made to flow in the reaction chamber. Instead of an ammonia gas, as indicated by a dashed line 237b, a nitrogen gas may be used. Further, an ammonia gas and a nitrogen gas may be used. As a result, the nitrogen concentration of the buffer layer 111 is increased, so that dangling bonds included in the buffer layer 111 are cross-linked, leading to reduction in the defect levels.

In the buffer layer 111 formed by such a method, the nitrogen concentration which is measured by secondary ion mass spectrometry has a peak at an interface between the semiconductor layer 109 and the buffer layer 111 and is constant in the direction in which the semiconductor layer 109 is deposited.

Note that in the description above, since the buffer layer 111 is formed in the same treatment chamber as that where the semiconductor layer 109 is formed, after the semiconductor layer 109 is formed, cleaning treatment and precoating treatment are performed; however, this embodiment may be carried out in combination with Embodiment 4. That is, after the semiconductor layer 109 is deposited and a silicon nitride layer is formed in the treatment chamber 241, the flushing treatment 213 may be performed.

Through the above steps, a thin film transistor with high on-current as compared to a thin film transistor in which an amorphous semiconductor is included in a channel formation region and with low off-current as compared to a thin film transistor in which a microcrystalline semiconductor is included in a channel formation region can be manufactured.

Embodiment 6

In this embodiment, a formation process of a buffer layer which can be applied to Embodiment 4 will be described.

In this embodiment, by mixing nitrogen into a deposition gas for forming the buffer layer 111, the oxygen concentration is suppressed low and the nitrogen concentration is made higher than the nitrogen concentration. Since a series of steps from a step of forming the gate insulating layer 107 to a step of forming the semiconductor layer 109 can be performed in a manner similar to that of Embodiment 4, here, a series of steps from a step of forming the semiconductor layer 109 to a step of forming the impurity semiconductor layer 113 will be described with reference to FIG. 17.

The semiconductor layer 109 is formed over an entire surface of the gate insulating layer 107. In a later step, the semiconductor layer 109 is patterned into the semiconductor layer 115. First, source gases used for depositing the semiconductor layer 109 are introduced into the treatment chamber. Here, as an example, in a manner similar to that of Embodiment 4, a microcrystalline silicon layer with a thickness of about 50 nm is formed as the semiconductor layer 109. After that, the plasma discharge is stopped (formation of a semiconductor layer 211 in FIG. 17). After that, these gases are exhausted and gases used for depositing the buffer layer 111 are introduced (replacement of gases 215 in FIG. 17).

Next, the buffer layer 111 is formed over the semiconductor layer 109. In a later step, the buffer layer 111 is patterned into the buffer layer 131. Here, as an example, an amorphous semiconductor layer with a thickness of about 50 nm, here, an amorphous silicon layer with a thickness of about 50 nm can be formed in such a manner that the source gases are introduced and stabilized, where the flow rate of $SiH_4$ is 280 sccm, the flow rate of $H_2$ is 300 sccm, and the flow rate of $NH_3$ is 20 sccm; the pressure in the treatment chamber is 280 Pa; the temperature of the substrate is 280° C.; and plasma discharge is performed with the RF power source frequency of 13.56 MHz; and the power of the RF power source of 60 W (formation of a buffer layer 217 in FIG. 17). After that, these gases are exhausted and gases used for depositing the impurity semiconductor layer 113 are introduced (replacement of gases 219 in FIG. 17). In a manner similar to that of Embodiment 4, the impurity semiconductor layer 113 is formed (formation of an impurity semiconductor layer 221 in FIG. 17).

Note that instead of an ammonia gas, as indicated by a dashed line 238, a nitrogen gas may be used.

The source gases for forming the buffer layer 111 in this embodiment include a gas containing nitrogen. The gas containing nitrogen is subjected to plasma discharge, so that an NH group or an $NH_2$ group is generated. Further, as described above, dangling bonds included in the amorphous silicon layer are cross-linked with an NH group. Thus, an amorphous semiconductor layer having an NH group with which dangling bonds are cross-linked can be formed. Further, dangling bonds included in the amorphous silicon layer are terminated with an $NH_2$ group. Thus, an amorphous semiconductor layer having an $NH_2$ group with which dangling bonds are terminated can be formed.

In the buffer layer 111 formed by such a method, the nitrogen concentration which is measured by secondary ion mass spectrometry is constant.

As described above, nitrogen is included in the gas used in depositing the buffer layer, whereby the oxygen concentration can be suppressed low and the nitrogen concentration can be made higher than the oxygen concentration, and thus the buffer layer which can be applied to Embodiment 4 can be formed.

Embodiment 7

A method for manufacturing an amorphous semiconductor layer having an NH group in which the nitrogen concentration distribution is different in Embodiments 4 to 6 will be described with reference to FIG. 18 and FIG. 19.

Figure 18:
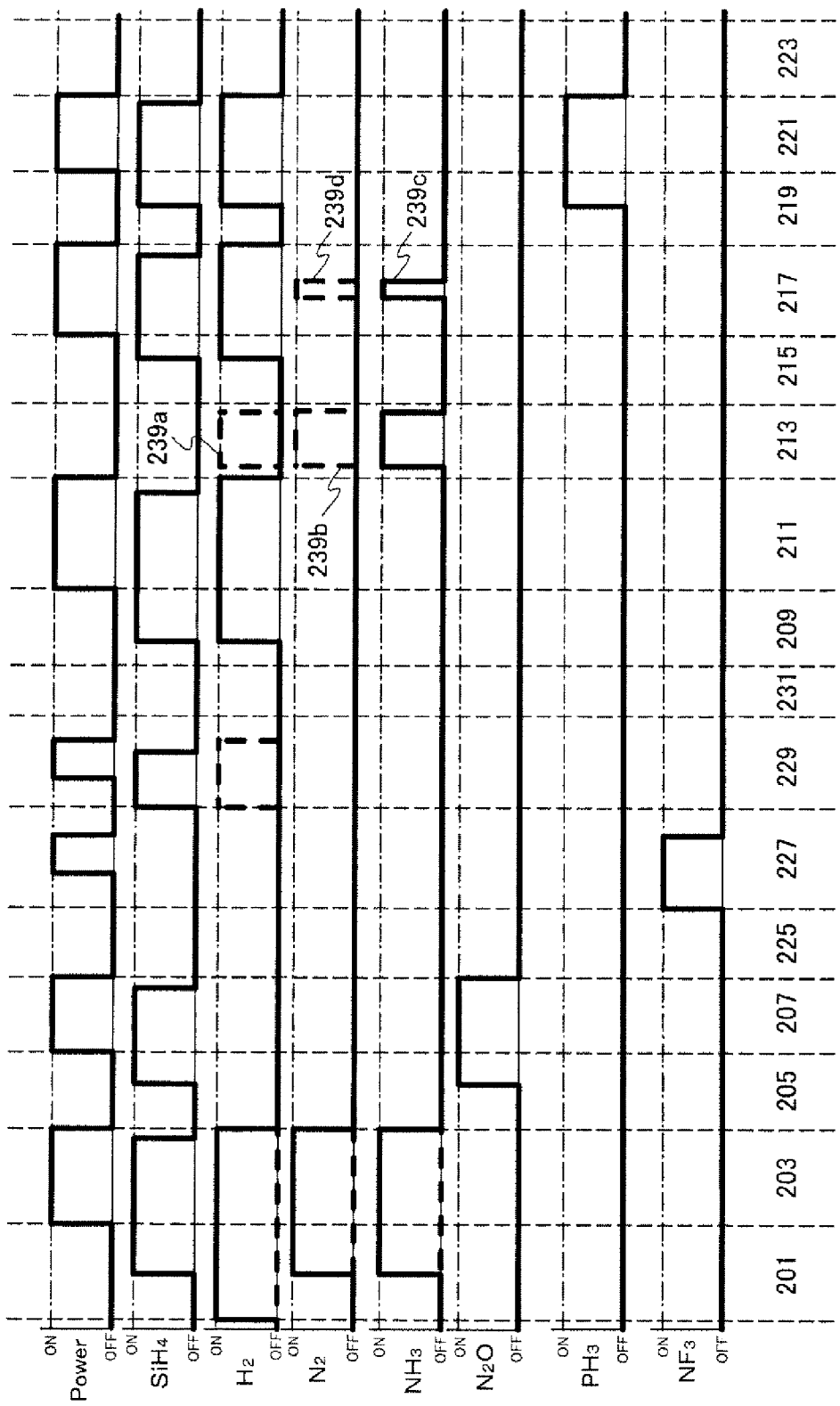
FIG. 18 is a diagram showing an example of a timing chart of a method for manufacturing a thin film transistor according to an embodiment of the present invention.

In this embodiment, nitrogen, and further an NH group are added into the buffer layer 111 in such a manner that in Embodiment 4, after formation of a semiconductor layer 211, a gas containing nitrogen is introduced into the reaction chamber by flushing treatment 213 and during formation of the buffer layer 111, a gas containing nitrogen is introduced again into the reaction chamber as indicated by a solid line 239c (see FIG. 18.). As a gas containing nitrogen, here, an ammonia gas is used. Note that instead of an ammonia gas, a nitrogen gas may be used as indicated by a dashed line 239d. Further, an ammonia gas and a nitrogen gas may be used. As a result, at the early stage of deposition of the buffer layer 111 and during deposition of the buffer layer 111, the nitrogen concentration is made high, so that the defect levels of the buffer layer 111 can be reduced.

Figure 19:
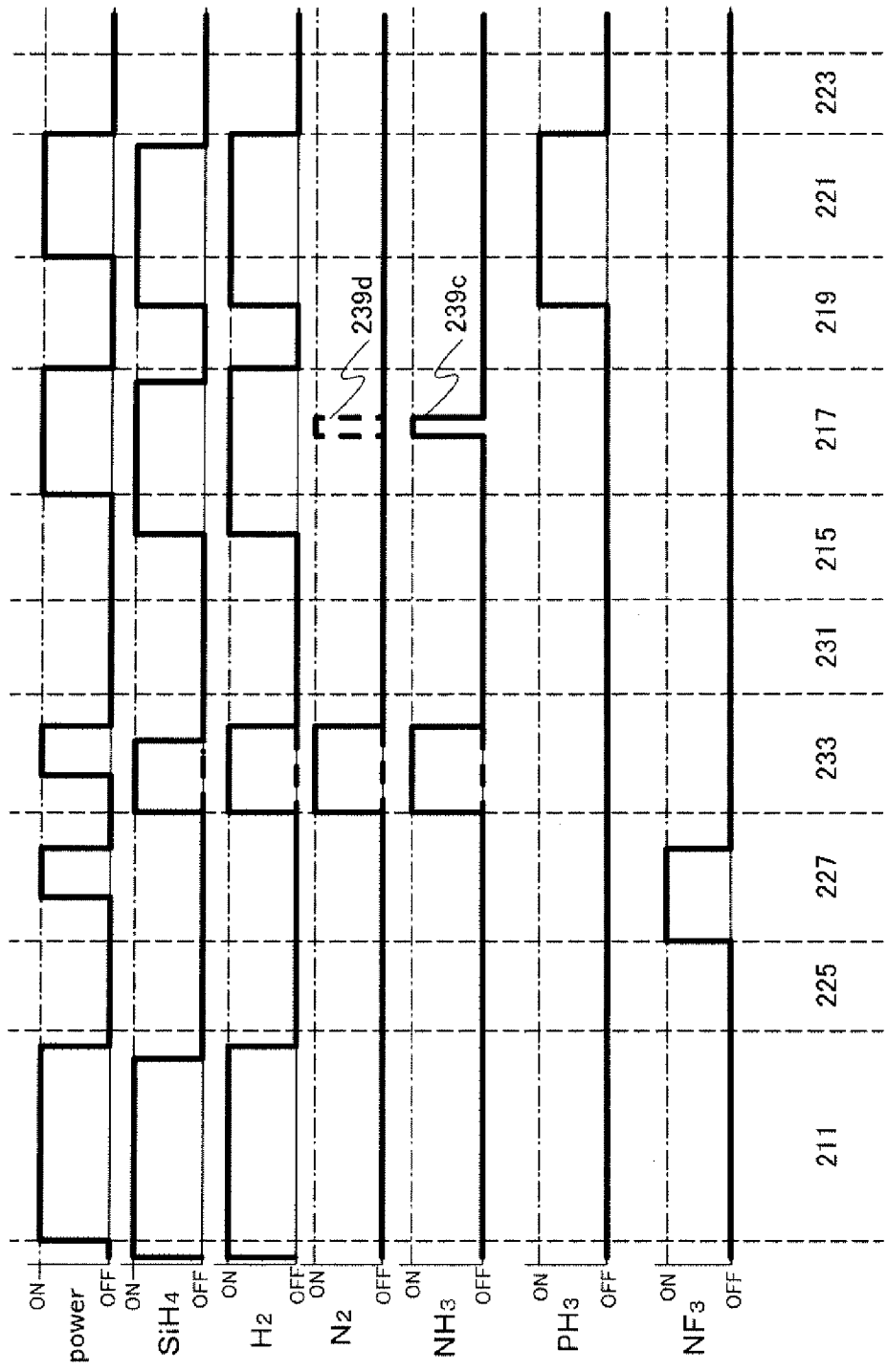
FIG. 19 is a diagram showing an example of a timing chart of a method for manufacturing a thin film transistor according to an embodiment of the present invention.

Alternatively, nitrogen, and further an NH group are added into the buffer layer 111 in such a manner that in Embodiment 5, after formation of a semiconductor layer, a silicon nitride layer is formed in the reaction chamber by precoating treatment 233 and during formation of the buffer layer 111, a gas containing nitrogen is introduced again into the reaction chamber as indicated by a solid line 239c (see FIG. 19). As a gas containing nitrogen, here, an ammonia gas is used. Note that instead of an ammonia gas, a nitrogen gas may be used as indicated by a dashed line 239d. Further, an ammonia gas and a nitrogen gas may be used. As a result, at the early stage of deposition of the buffer layer 111 and during deposition of the buffer layer 111, the nitrogen concentration is made high, so that the defect level of the buffer layer 111 can be reduced.

As described above, the nitrogen concentration on an upper side of the buffer layer, that is, a side of the source and drain regions is controlled, whereby the defect levels of the buffer layer can be reduced, so that off-current of a thin film transistor can be reduced.

Embodiment 8

In this embodiment, a method for manufacturing a thin film transistor described in Embodiment 3 will be described. Also in this embodiment, a method for manufacturing an n-channel thin film transistor will be described.

In a manner similar to that of Embodiment 4, the gate electrode layer 103 and the capacitor wiring 105 are formed over the substrate 101 through a first photolithography step.

Figure 20A:
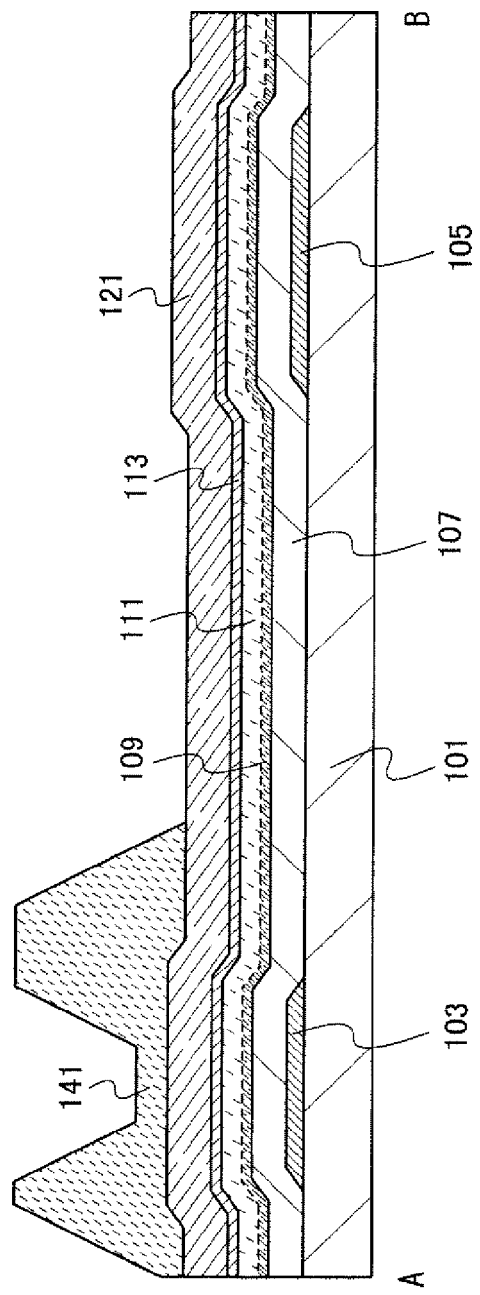
FIGS. 20A and 20B are views illustrating an example of a method for manufacturing a thin film transistor according to an embodiment of the present invention.

Next, the gate insulating layer 107, the semiconductor layer 109, the buffer layer 111, the impurity semiconductor layer 113, and the conductive layer 121 are formed so as to cover the gate electrode layer 103. After that, a resist mask 141 is formed over the conductive layer 121 through a second photolithography step (see FIG. 20A).

As a method for forming the gate insulating layer 107, the semiconductor layer 109, and the impurity semiconductor layer 113, any of the methods described in Embodiments 4 to 7 may be applied.

The resist mask 141 has two regions with different thicknesses and can be formed using a multi-tone mask. The multi-tone mask is used, so that the number of photomasks to be used and the number of manufacturing steps are reduced, which is preferable. In this embodiment, the resist mask formed using a multi-tone mask can be used in a step of forming a pattern of the semiconductor layer and a step of separating the semiconductor layer into a source region and a drain region.

A multi-tone mask is a mask capable of light exposure with multi-level light intensity, and typically, light exposure is performed with three levels of light intensity to provide an exposed region, a half-exposed region, and an unexposed region. When the multi-tone mask is used, one-time light exposure and development process allows a resist mask with plural thicknesses (typically, two levels of thicknesses) to be formed. Therefore, by using a multi-tone mask, the number of photomasks can be reduced.

Figures 1, 24A:
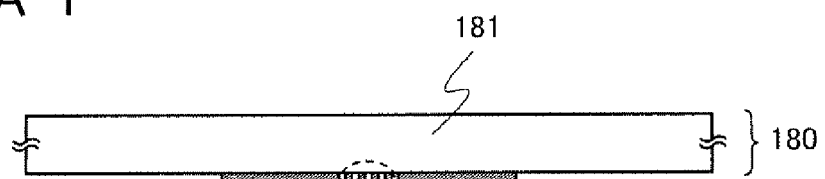
FIGS. 24(A-1), 24(A-2), 24(B-1), and 24(B-2) are views showing multi-tone masks which can be applied to the present invention.
Figures 2, 24A:
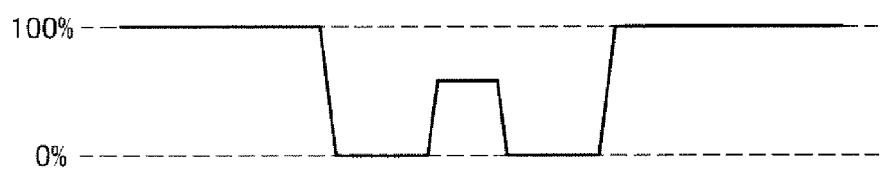
Figures 1, 24B:
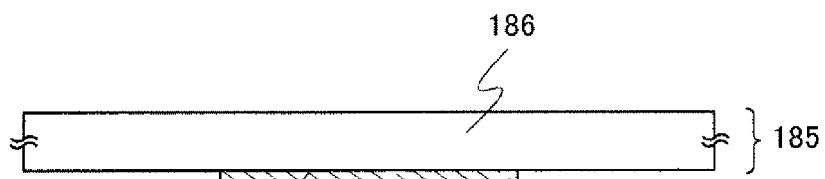
Figures 2, 24B:
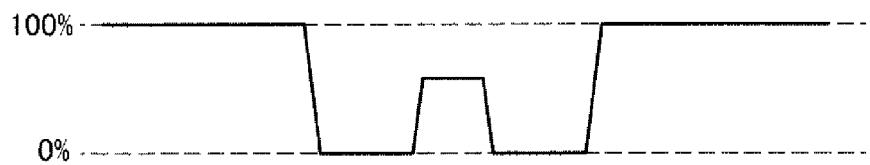

FIGS. 24A-1 and 24B-1 are cross-sectional views of typical multi-tone masks. FIG. 24A-1 illustrates a gray-tone mask 180 and FIG. 24B-1 illustrates a half-tone mask 185.

The gray-tone mask 180 illustrated in FIG. 24A-1 includes a light-shielding portion 182 formed using a light-shielding layer on a substrate 181 having a light-transmitting property, and a diffraction grating portion 183 provided with a pattern of the light-shielding layer.

The diffraction grating portion 183 has slits, dots, meshes, or the like that is provided at intervals which are less than or equal to the resolution limit of light used for the exposure, whereby the light transmittance can be controlled. Note that the slits, dots, or mesh provided at the diffraction grating portion 183 may be provided periodically or non-periodically.

As the substrate 181 having a light-transmitting property, a quartz substrate or the like can be used. The light-shielding layer for forming the light-shielding portion 182 and the diffraction grating portion 183 may be formed using a metal, and chromium, chromium oxide, or the like is preferably used.

In the case where the gray-tone mask 180 is irradiated with light for light exposure, as shown in FIG. 24A-2, the transmittance in the region overlapping with the light-shielding portion 182 is 0%, and the transmittance in the region where both the light-shielding portion 182 and the diffraction grating portion 183 are not provided is 100%. Further, the transmittance at the diffraction grating portion 183 is basically in the range of 10% to 70%, which can be adjusted by the interval of slits, dots, or mesh of the diffraction grating, or the like.

The half-tone mask 185 illustrated in FIG. 24B-1 includes a semi-light-transmitting portion 187 which is formed on a substrate 186 having a light-transmitting property, using a semi-light-transmitting layer, and a light-shielding portion 188 formed using a light-shielding layer.

The semi-light-transmitting portion 187 can be formed using a layer of MoSiN, MoSi, MoSiO, MoSiON, CrSi, or the like. The light-shielding portion 188 may be formed using metal similar to that of the light-shielding layer of the gray-tone mask, and chromium, chromium oxide, or the like is preferably used.

In the case where the half-tone mask 185 is irradiated with light for light exposure, as shown in FIG. 24B-2, the transmittance in the region overlapping with the light-shielding portion 188 is 0%, and the transmittance in the region where both the light-shielding portion 188 and the semi-light-transmitting portion 187 are not provided is 100%. Further, the transmittance in the semi-light-transmitting portion 187 is approximately in the range of 10% to 70%, which can be adjusted by the kind, the thickness, or the like of the material to be formed.

By light exposure using the multi-tone mask and development, a resist mask which includes regions having different thicknesses can be formed.

Figure 20B:
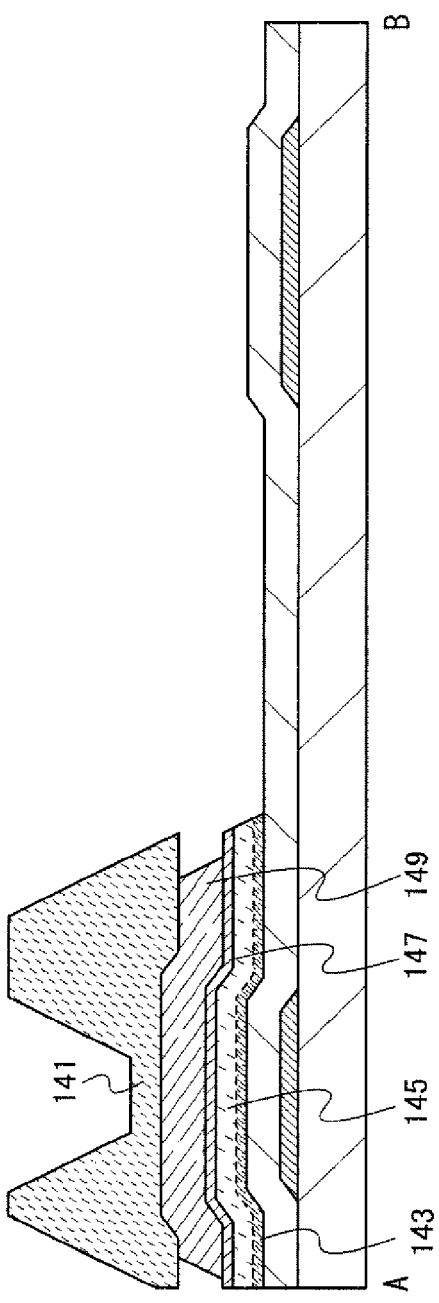

Next, with the use of the resist mask 141, the semiconductor layer 109, the buffer layer 111, the impurity semiconductor layer 113, and the conductive layer 121 are etched. Through this step, the semiconductor layer 109, the buffer layer 111, the impurity semiconductor layer 113, and the conductive layer 121 are separated into each element to form a semiconductor layer 143, a buffer layer 145, an impurity semiconductor layer 147, and a conductive layer 149 (see FIG. 20B).

Next, the resist mask 141 is made to recede to form a resist mask 151. Ashing using oxygen plasma may be performed in order that the resist mask is made to recede. Here, ashing is performed on the resist mask 141 so that the resist mask 141 is separated over the gate electrode. As a result, the resist mask 151 is separated (see FIG. 21A).

Next, the conductive layer 149 is etched using the resist mask 151 to form a wiring layer 153 and a wiring layer 155 (see FIG. 21B). The wiring layer 153 and the wiring layer 155 form a source electrode and a drain electrode. The conductive layer 149 is preferably etched in a manner similar to that of the conductive layer 121 described in Embodiment 4.

Next, in a state where the resist mask 151 is formed, the impurity semiconductor layer 147 and part of the buffer layer 145 are etched to form the buffer layer 159 and the source and drain regions 157 (see FIG. 21C). After that, the resist mask 151 is removed. FIG. 23A is a top view of FIG. 21C.

Next, dry etching may be performed in a manner similar to that of Embodiment 1. Further, a surface of the buffer layer 159 may be irradiated with water plasma, ammonia plasma, nitrogen plasma, or the like.

Through the steps described above, a thin film transistor according to this embodiment can be manufactured. Like the thin film transistor described in Embodiment 4, the thin film transistor according to this embodiment can also be applied to a switching transistor in a pixel of a display device typified by a liquid crystal display device. Therefore, the insulating layer 133 is formed so as to cover this thin film transistor (see FIG. 22A).

Next, an opening 134 and an opening 160 are formed in the insulating layer 133 so as to reach the source electrode and the drain electrode formed using the wiring layers 153 and 155. The opening 134 and the opening 160 can be formed through a third photolithography step. After that, a pixel electrode layer 135 is provided over the insulating layer 133 through a fourth photolithography step so that connection through the openings 134 and 160 is obtained. In such a manner, a switching transistor in a pixel of a display device which is illustrated in FIG. 22B can be manufactured.

Note that although not illustrated, an insulating layer formed using an organic resin by a spin coating method or the like may be formed between the insulating layer 133 and the pixel electrode layer 135.

After that, as in Embodiment 4, in a vertical alignment (VA) liquid crystal display device, in the case of employing a multi-domain vertical alignment mode (so-called MVA mode) in which pixels are divided into a plurality of portions and the alignment of liquid crystal molecules in pixels in the divided portions is made different for viewing angle expansion, the protrusion 137 is preferably formed over the pixel electrode layer 135 (see FIG. 22C). FIG. 23B is a top view of FIG. 22C.

Through the steps described above, an element substrate which can be used for a liquid crystal display device and which has a thin film transistor with high on-current as compared to a thin film transistor in which an amorphous semiconductor is included in a channel formation region and with low off-current as compared to a thin film transistor in which a microcrystalline semiconductor is included in a channel formation region can be manufactured with a small number of masks.

Embodiment 9

In this embodiment, a structure of a thin film transistor which can reduce contact resistance will be described. Specifically, the source and drain regions described in Embodiments 1 to 8 are formed using a semiconductor layer having an impurity element imparting one conductivity type and an NH group or an $NH_2$ group (hereinafter, referred to as an impurity semiconductor layer having an NH group).

An impurity semiconductor layer having an NH group is formed by combining steps of forming the impurity semiconductor layer and the buffer layer in Embodiments 4 to 7. Specifically, in the case of combining a step of formation of a buffer layer 217 and a step of formation of an impurity semiconductor layer 221 described in Embodiment 4, in FIG. 15, flushing treatment 213 is performed between formation of a buffer layer 217 and replacement of gases 219, whereby the nitrogen concentration on the surface of the buffer layer may be made higher so that the nitrogen concentration in the impurity semiconductor layer may be made higher.

Alternatively, in the case of combining a step of forming the amorphous semiconductor layer having an NH group and a step of forming the impurity semiconductor layer which are described in Embodiment 5, in FIG. 16, the steps from unloading 225 to loading 231 are performed between formation of a buffer layer 217 and replacement of gases 219 and a silicon nitride layer may be formed in the reaction chamber, whereby the nitrogen concentration in the reaction chamber may be made higher and the nitrogen concentration in the impurity semiconductor layer may be made higher.

Figure 17:
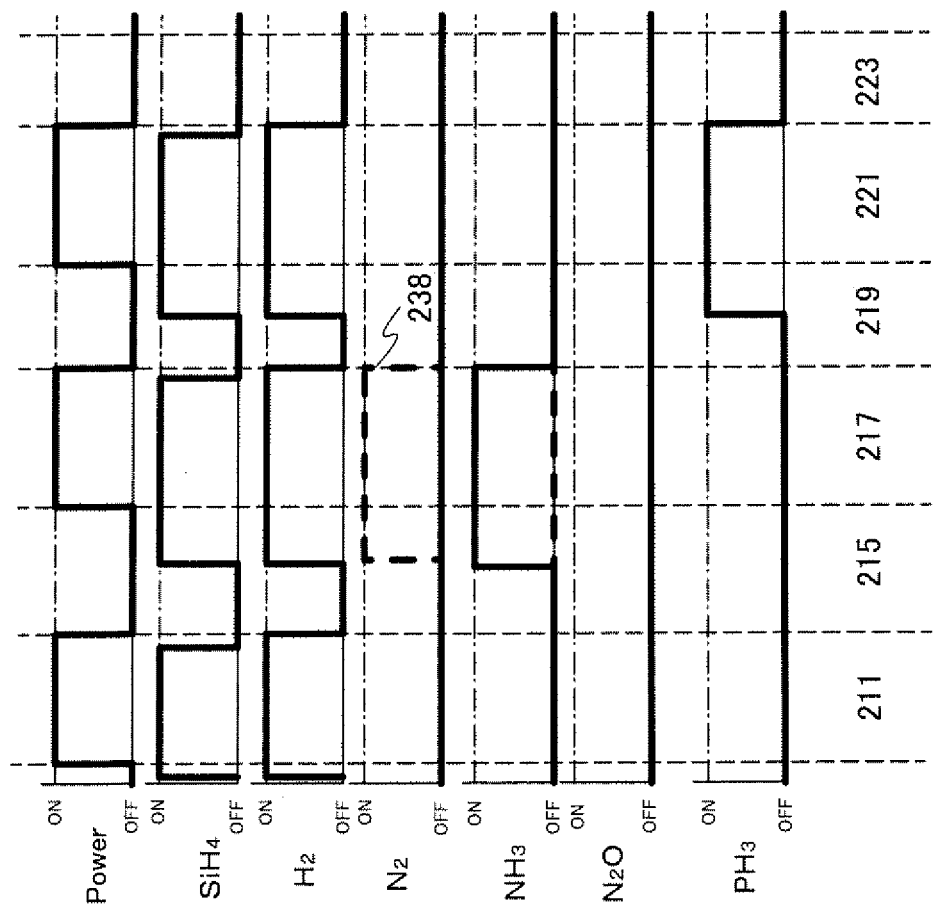
FIG. 17 is a diagram showing an example of a timing chart of a method for manufacturing a thin film transistor according to an embodiment of the present invention.

Further alternatively, in the case of combining a step of forming the amorphous semiconductor layer having an NH group and a step of forming the impurity semiconductor layer which are described in Embodiment 6, in a step of formation of an impurity semiconductor layer 221 in FIG. 17, an ammonia gas or a nitrogen gas may be introduced, whereby the nitrogen concentration in the impurity semiconductor layer may be made higher.

In addition to an impurity element imparting one conductivity type, an NH group or an $NH_2$ group is included in the source and drain regions, whereby the defect levels of the source and drain regions can be reduced. Therefore, the mobility of the source and drain regions can be increased and contact resistance can be reduced.

Embodiment 10

The thin film transistors described in Embodiments 1 to 3 can be used for light-emitting display devices or light-emitting devices. As light-emitting elements used for light-emitting display devices or light-emitting devices, typically, light-emitting elements utilizing electroluminescence can be given. Light-emitting elements utilizing electroluminescence are roughly classified according to whether a light-emitting material is an organic compound or an inorganic compound. In general, the former is referred to as organic EL elements and the latter as inorganic EL elements.

Further, a light-emitting element is formed over the element substrate as described in Embodiments 4 and 8, whereby a light-emitting display device or a light-emitting device can be manufactured.

Since the thin film transistor having high on-current and low off-current is used as a pixel transistor in the light-emitting display device and the light-emitting device of this embodiment, a light-emitting display device and a light-emitting device having preferable image quality (for example, high contrast) and low power consumption can be manufactured.

Embodiment 11

Next, an example of a structure of a display panel included in a display device to which the present invention can be applied will be described below.

Figure 25A:
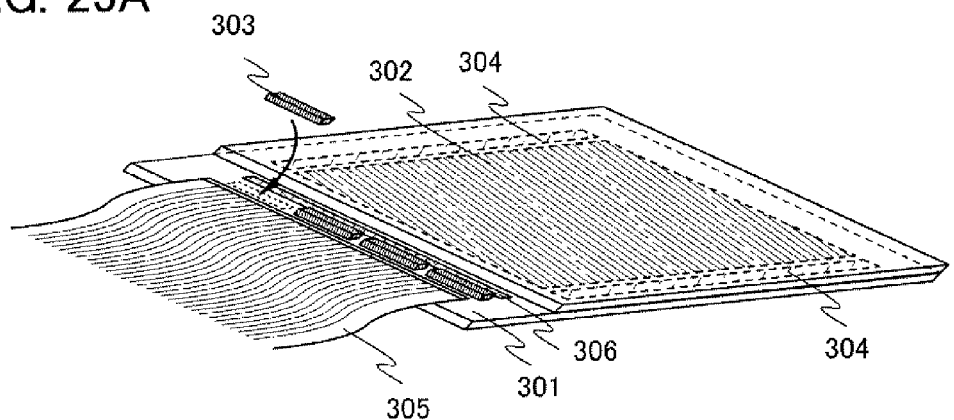
FIGS. 25A to 25C are views each illustrating an electronic device to which a thin film transistor according to an embodiment of the present invention can be applied.

FIG. 25A illustrates a mode of a display panel in which only a signal line driver circuit 303 is formed separately and connected to a pixel portion 302 formed over a substrate 301. An element substrate provided with the pixel portion 302, a protective circuit 306, and a scanning line driver circuit 304 is formed using the thin film transistor described in any of Embodiments 1 to 10. The signal line driver circuit 303 may be formed with a transistor using a single crystal semiconductor for a channel formation region, a thin film transistor using a polycrystalline semiconductor for a channel formation region, or a transistor using silicon on insulator (SOI) for a channel formation region. The transistor using SOI for a channel formation region includes a transistor using a single crystal semiconductor layer provided over a glass substrate for a channel formation region. To each of the pixel portion 302, the signal line driver circuit 303, and the scanning line driver circuit 304, potential of power supply, various signals, and the like are supplied through an FPC 305. The protective circuit 306 formed using the thin film transistor described in any of embodiments 1 to 10 may be provided between the signal line driver circuit 303 and the FPC 305 and/or between the signal line driver circuit 303 and the pixel portion 302. The protective circuit 306 may be provided with one or more elements selected from a thin film transistor with another structure, a diode, a resistive element, a capacitor, or the like.

Note that the signal line driver circuit and the scanning line driver circuit may both be formed over a substrate which is the same as the substrate over which a pixel transistor of the pixel portion is formed.

Figure 25B:
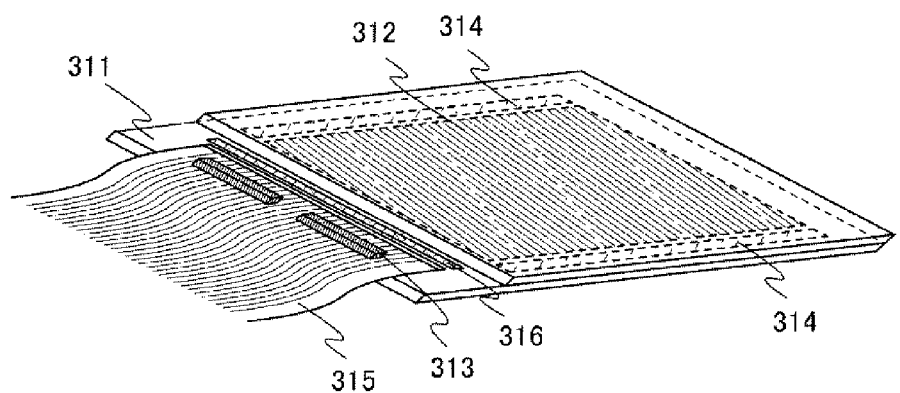

Further, when the driver circuit is separately formed, a substrate provided with the driver circuit is not always necessary to be attached to a substrate provided with the pixel portion, and may be attached to, for example, the FPC. FIG. 25B illustrates a mode of a display panel in which an element substrate provided with a pixel portion 312, a protective circuit 316, and a scanning line driver circuit 314 which are formed over a substrate 311 is connected to an FPC 315, with only a signal line driver circuit 313 formed separately. The pixel portion 312, the protective circuit 316, and the scanning line driver circuit 314 are formed using the thin film transistor described in the above Embodiment 1. The signal line driver circuit 313 is connected to the pixel portion 312 through the FPC 315 and the protection circuit 316. To each of the pixel portion 312, the signal line driver circuit 313, and the scanning line driver circuit 314, potential of power supply, various signals, and the like are supplied through the FPC 315. The protective circuit 316 may also be provided between the FPC 315 and the pixel portion 312.

Figure 25C:
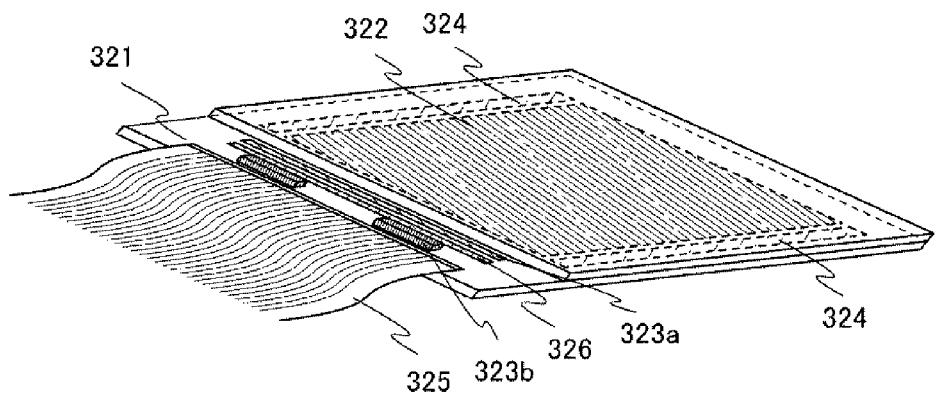

Furthermore, only part of the signal line driver circuit or part of the scanning line driver circuit may be formed over a substrate the same as the substrate over which the pixel portion is formed, using any of the thin film transistors described in the above embodiments, and the rest may be formed separately and electrically connected to the pixel portion. FIG. 25C illustrates the mode of a display panel in which an analog switch 323a included in a signal line driver circuit is formed over a substrate the same as a substrate 321, over which a pixel portion 322 and a scanning line driver circuit 324 are formed, and a shift register 323b included in the signal line driver circuit is separately formed over a different substrate and then attached to the substrate 321. The pixel portion 322, a protective circuit 326, and the scanning line driver circuit 324 are each formed using any of the thin film transistors described in the above embodiments. The shift register 323b included in the signal line driver circuit is connected to the pixel portion 322 through the analog switch 323a and the protective circuit 326. To each of the pixel portion 322, the signal line driver circuit, and the scanning line driver circuit 324, potential of power supply, various signals, and the like are supplied through an FPC 325. The protective circuit 326 may also be provided between the FPC 325 and the analog switch 323a.

As illustrated in each of FIGS. 25A to 25C, in the display device of this embodiment, the driver circuits can be entirely or partially formed using the thin film transistors described in the above embodiments over a substrate the same as the substrate over which the pixel portion is formed.

Note that a connection method of a substrate which is separately formed is not particularly limited, and a known COG method, wire bonding method, TAB method, or the like can be used. In addition, a position for connection is not limited to the position illustrated in FIGS. 25A to 25C as long as electrical connection is possible. A controller, a CPU, a memory, or the like may be formed separately and connected.

Note that the signal line driver circuit used in this embodiment includes a shift register and an analog switch. In addition to the shift register and the analog switch, another circuit such as a buffer, a level shifter, or a source follower may be included. The shift register and the analog switch are not necessarily provided, and for example, a different circuit such as a decoder circuit which can select signal lines may be used instead of the shift register, and a latch or the like may be used instead of the analog switch.

Embodiment 12

An element substrate which is formed using the thin film transistor described in any of the above embodiments and a display device or the like with the use of this element substrate can be applied to an active-matrix display panel. That is, the present invention can be applied to all the electronic devices including the element substrate and the display device in a display portion.

Examples of such electronic devices include a camera such as a video camera or a digital camera, a head-mounted display (a goggle-type display), a car navigation system, a projector, a car stereo, a personal computer, and a portable information terminal (such as a mobile computer, a cellular phone, or an e-book reader). Examples of these devices are illustrated in FIGS. 26A to 26D.

Figure 26A:
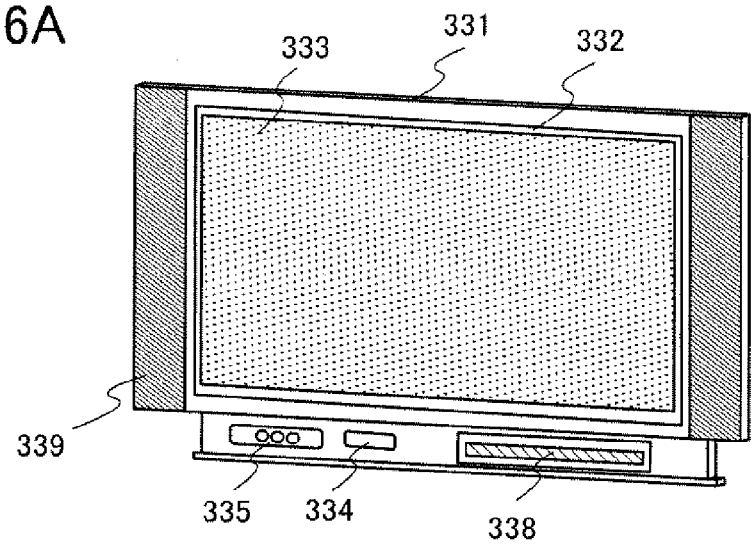
FIGS. 26A to 26D are views each illustrating an electronic device to which a thin film transistor according to an embodiment of the present invention can be applied.

FIG. 26A illustrates a television device. The television device can be completed by incorporating the display panel to which the above embodiment is applied into a housing. A main screen 333 is formed with the display panel, and a speaker portion 339, operation switches, or the like are provided as other additional accessories.

As illustrated in FIG. 26A, a display panel 332 utilizing a display element is incorporated into a housing 331. In addition to reception of general television broadcast by a receiver 335, communication of information in one direction (from a transmitter to a receiver) or in two directions (between a transmitter and a receiver or between receivers) can be performed by connection to a wired or wireless communication network through a modem 334. Operation of the television device can be performed by the switch incorporated into the housing or a remote control device 336 provided separately. This remote control device may also be provided with a display portion 337 for displaying output information. Further, the display portion 337 may also be provided with the thin film transistor described in any of Embodiments 1 to 10. Further, the television device may include a sub screen 338 formed with a second display panel to display channels, volume, or the like, in addition to the main screen 333. In this structure, the thin film transistor described in any of Embodiments 1 to 10 can be applied to either or both the main screen 333 and the sub screen 338.

Figure 27:
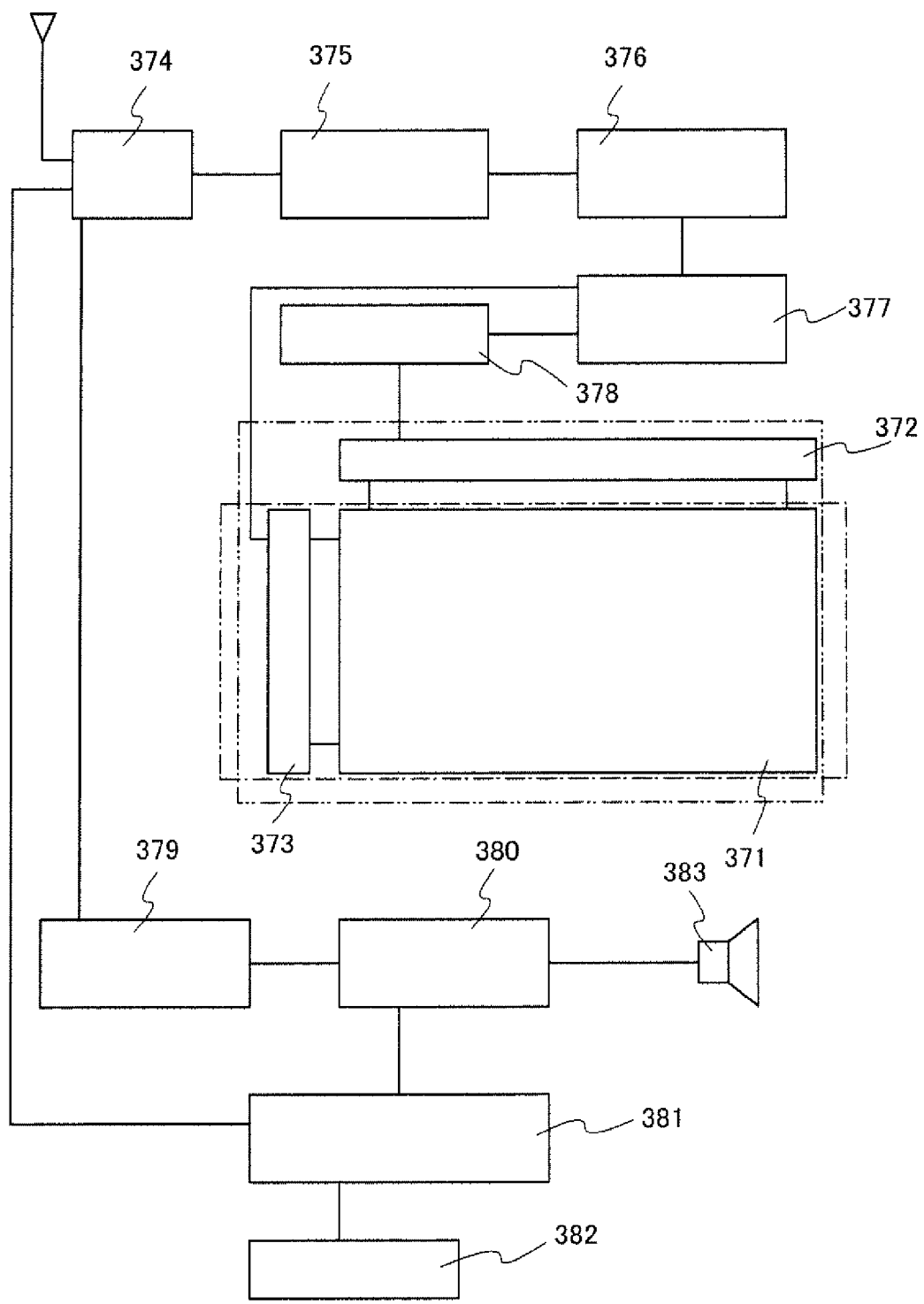
FIG. 27 is a view illustrating an electronic device to which a thin film transistor according to an embodiment of the present invention can be applied.

FIG. 27 is a block diagram illustrating a main structure of a television device. A display panel is provided with a pixel portion 371. A signal line driver circuit 372 and a scanning line driver circuit 373 may be mounted on the display panel by a COG method.

As another external circuit, a video signal amplifier circuit 375 that amplifies a video signal among signals received by a tuner 374; a video signal processing circuit 376 that converts the signals outputted from the video signal amplifier circuit 375 into chrominance signals corresponding to respective colors of red, green, and blue; a control circuit 377 that converts the video signal into an input specification of the driver IC; and the like are provided on an input side of the video signal. The control circuit 377 outputs a signal to both a scanning line side and a signal line side. In the case of digital driving, a structure may be employed in which a signal line dividing circuit 378 is provided on the signal line side and an input digital signal is divided into m pieces to be supplied.

Among the signals received by the tuner 374, an audio signal is transmitted to an audio signal amplifier circuit 379, and an output thereof is supplied to a speaker 383 through an audio signal processing circuit 380. A control circuit 381 receives control information of a receiving station (received frequency) or a sound volume from an input portion 382, and transmits signals to the tuner 374 and the audio signal processing circuit 380.

Needless to say, the present invention is not limited to a television device, and can be applied to monitors of personal computers, or display media having a large area, such as information display boards in railway stations, airports, and the like, and street-side advertisement display boards.

As described above, a television device having high image quality and low power consumption can be manufactured by applying the thin film transistor described in any of Embodiments 1 to 10 to either or both the main screen 333 and the sub screen 338.

Figure 26B:
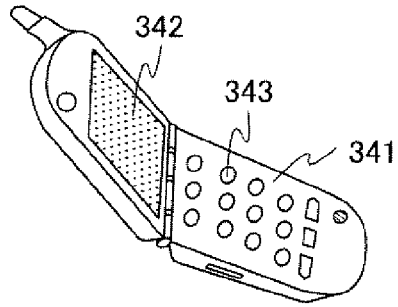

FIG. 26B illustrates one example of a cellular phone 341. The cellular phone 341 includes a display portion 342, an operation portion 343, and the like. The image quality thereof can be improved and the power consumption thereof can be reduced by applying, to the display portion 342, the thin film transistor described in any of Embodiments 1 to 10.

Figure 26C:
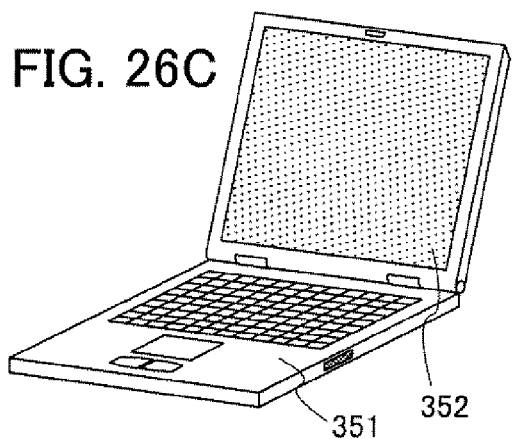

A portable computer illustrated in FIG. 26C includes a main body 351, a display portion 352, and the like. The image quality thereof can be improved and the power consumption thereof can be reduced by applying, to the display portion 352, the thin film transistor described in Embodiment 1 or the like.

Figure 26D:
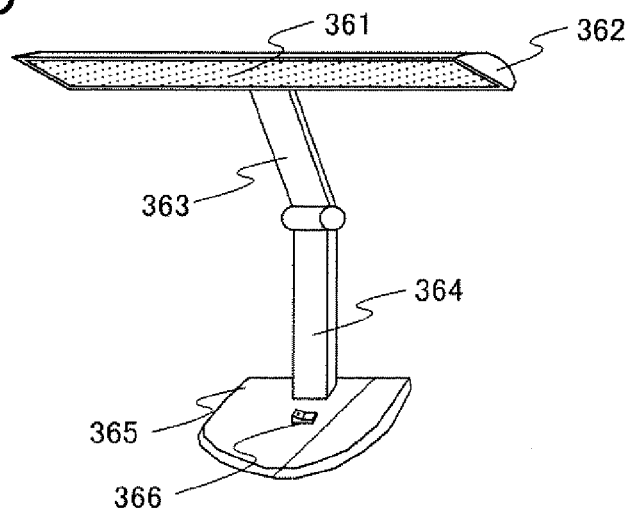

FIG. 26D illustrates a desk lamp, which includes a lighting portion 361, a shade 362, an adjustable arm 363, a support 364, a base 365, a power source 366, and the like. The desk lamp is manufactured using, for the lighting portion 361, the light-emitting device which is described in the above embodiment. The image quality thereof can be improved and the power consumption thereof can be reduced by applying, to the lighting portion 361, the thin film transistor described in any of Embodiments 1 to 10.

Figure 28A:
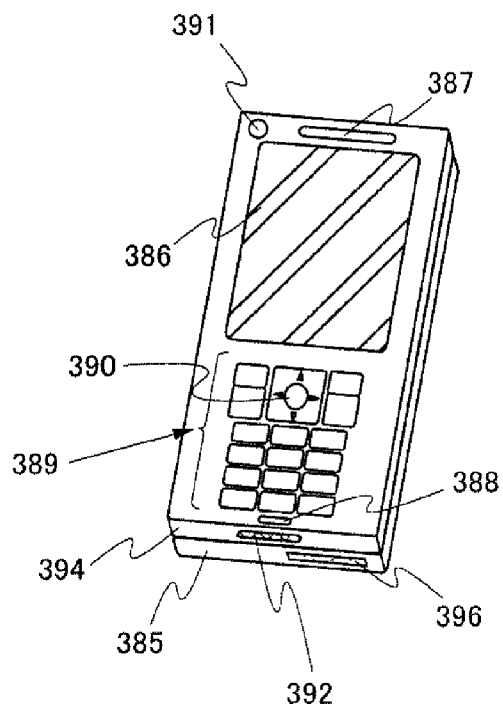
FIGS. 28A to 28C are views illustrating an electronic device to which a thin film transistor according to an embodiment of the present invention can be applied.
Figure 28B:
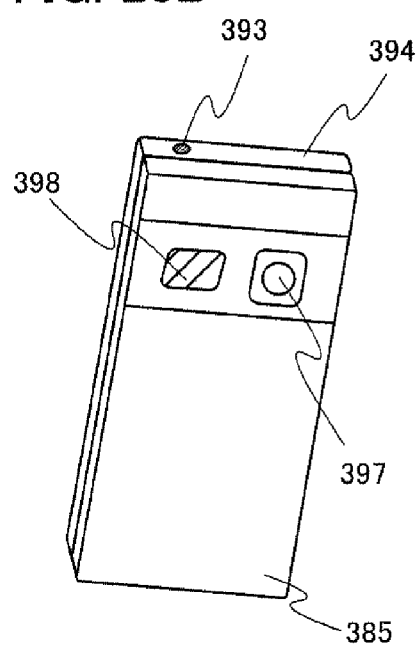
Figure 28C:
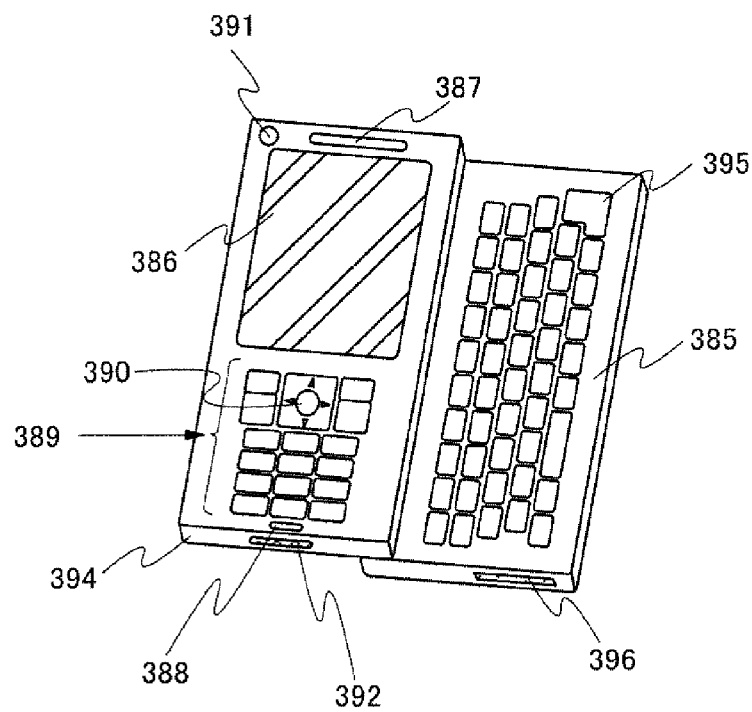

FIGS. 28A to 28C illustrate an example of a structure of a cellular phone, and the element substrate having the thin film transistor described in any of Embodiments 1 to 10 and the display device having the element substrate are applied to, for example, a display portion thereof. FIG. 28A is a front view, FIG. 28B is a rear view, and FIG. 28C is a development view. The cellular phone illustrated in FIG. 28A to 28C includes two housings, a housing 394 and a housing 385. The cellular phone illustrated in FIGS. 28A to 28C, which is also referred to as a smartphone, has both of functions of a cellular phone and a portable information terminal, incorporates a computer, and can perform a variety of data processing in addition to voice calls.

The cellular phone includes two housings 394 and 385. The housing 394 includes a display portion 386, a speaker 387, a microphone 388, operation keys 389, a pointing device 390, a front camera lens 391, a jack 392 for an external connection terminal, an earphone terminal 393, and the like, while the housing 385 includes a keyboard 395, an external memory slot 396, a rear camera 397, a light 398, and the like. In addition, an antenna is incorporated in the housing 394.

In addition to the structure described above, a non-contact IC chip, a small size memory device, or the like can be incorporated therein.

The housings 394 and 385 are overlapped with each other in FIG. 28A and slid from a state illustrated in FIG. 28A, and the cellular phone is opened as illustrated in FIG. 28C. In the display portion 386, the display device described in any of Embodiments 1 to 10 can be incorporated, and display direction can be changed as appropriate depending on a use mode. Note that since the front camera lens 391 is provided in the same plane as the display portion 386, the cellular phone can be used as a videophone. A still image and a moving image can be taken by the rear camera 397 and the light 398 by using the display portion 386 as a viewfinder.

The speaker 387 and the microphone 388 can be used for videophone, recording and playing sound, and the like without being limited to voice calls. With the use of the operation keys 389, operation of incoming and outgoing calls, simple information input such as electronic mail, scrolling of a screen, cursor motion, and the like are possible.

If much information needs to be treated, such as documentation, use as a portable information terminal, and the like, it is convenient to use the keyboard 395. The housings 394 and 385 that are overlapped with each other (FIG. 28A) can be slid and the cellular phone is opened as illustrated in FIG. 28C, so that the cellular phone can be used as an information terminal. In addition, with the use of the keyboard 395 and the pointing device 390, smooth operation is possible. An AC adaptor and various types of cables such as a USB cable can be connected to the jack 392 for an external connection terminal, through which charging and data communication with a personal computer or the like are possible. Moreover, by inserting a recording medium into the external memory slot 396, a large amount of data can be stored and transferred.

In the rear surface of the housing 385 (FIG. 28B), the rear camera 397 and the light 398 are provided, and a still image and a moving image can be taken by using the display portion 386 as a viewfinder.

Further, the cellular phone may have an infrared communication function, a USB port, a function of receiving one segment television broadcast, a non-contact IC chip, an earphone jack, or the like, in addition to the above structures.

The image quality thereof can be improved and the power consumption thereof can be reduced by applying, to a pixel, the thin film transistor described in any of Embodiments 1 to 10.

The present application is based on Japanese Patent Application serial No. 2008-169499 and Japanese Patent Application serial No. 2008-228242 which are filed with Japan Patent Office on Jun. 27, 2008 and Sep. 5, 2008, respectively, the entire contents of which are hereby incorporated by reference.

EXPLANATION OF REFERENCE

101: substrate, 103: gate electrode layer, 105: capacitor wiring, 107: gate insulating layer, 109: semiconductor layer, 111: buffer layer, 113: impurity semiconductor layer, 115: semiconductor layer, 117: buffer layer, 118: microcrystalline semiconductor, 119: impurity semiconductor layer, 121: conductive layer, 123: wiring layer, 125: wiring layer, 129: source region and drain region, 131: buffer layer, 132: resist mask, 133: insulating layer, 134: opening, 135: pixel electrode layer, 136: opening, 137: protrusion, 141: resist mask, 143: semiconductor layer, 145: buffer layer, 147: impurity semiconductor layer, 149: conductive layer, 151: resist mask, 153: wiring layer, 155: wiring layer, 157: source region and drain region, 159: buffer layer, 160: opening, 260: cryopump, 171: region, 172: region, 173: region, 174: region, 180: graytone mask, 181: substrate, 182: light-shielding portion, 183: diffraction grating portion, 185: half-tone mask, 186: substrate, 187: semi-light-transmitting portion, 188: light-shielding portion, 192: defect, 193: O atom, 194: NH group, 195: nitrogen atom, 196: region, 197: region, 198: region, 199: region, 201: pretreatment, 203: formation of SiN, 205: replacement of gases, 207: formation of SiON, 209: replacement of gases, 211: formation of a semiconductor layer, 212: wiring layer, 213: flushing treatment, 215: replacement of gases, 217: formation of a buffer layer, 219: replacement of gases, 221: formation of an impurity semiconductor layer, 223: exhaust, 225: unloading, 227: cleaning treatment, 229: precoating treatment, 231: loading, 233: precoating treatment, 234: dashed line, 241: treatment chamber, 242: stage, 243: gas supply portion, 244: shower plate, 245: exhaust port, 246: upper electrode, 247: lower electrode, 248: alternate-current power source, 249: temperature control portion, 250: gas supply means, 251: exhaust means, 252: cylinder, 253: pressure adjusting valve, 254: stop valve, 255: mass flow controller, 256: butterfly valve, 257: conductance valve, 258: turbo molecular pump, 259: dry pump, 261: plasma CVD apparatus, 301: substrate, 302: pixel portion, 303: signal line driver circuit, 304: scanning line driver circuit, 305: FPC, 306: protective circuit, 311: substrate, 312: pixel portion, 313: signal line driver circuit, 314: scanning line driver circuit, 315: FPC, 316: protective circuit, 321: substrate, 322: pixel portion, 324: scanning line driver circuit, 325: FPC, 326: protective circuit, 331: housing, 332: display panel, 333: main screen, 334: modem, 335: receiver, 336: remote control device, 337: display portion, 338: sub screen, 339: speaker portion, 341: cellular phone, 342: display portion, 343: operation portion, 351: main body, 352: display portion, 361: lighting portion, 362: shade, 363: adjustable arm, 364: support, 365: base, 366: power source, 371: pixel portion, 372: signal line driver circuit, 373: scanning line driver circuit, 374: tuner, 375: video signal amplifier circuit, 376: video signal processing circuit, 377: control circuit, 378: signal line dividing circuit, 379: audio signal amplifier circuit, 380: audio signal processing circuit, 381: control circuit, 382: input portion, 383: speaker, 385: housing, 386: display portion, 387: speaker, 388: microphone, 389: operation keys, 390: pointing device, 391: front camera lens, 392: jack for an external connection terminal, 393: earphone terminal, 394: housing, 395: keyboard, 396: external memory slot, 397: rear camera, 398: light, 105a: amorphous semiconductor layer, 115a: needle-like crystal, 115b: crystal grain boundary, 115c: amorphous structure, 115d: amorphous layer, 118a: microcrystalline semiconductor, 118b: microcrystalline semiconductor, 191a: H atom, 191b: hydrogen atom, 196a: region, 196b: region, 235a: dashed line, 235b: dashed line, 236a: dashed line, 236b: dashed line, 237a: dashed line, 237b: dashed line, 239c: solid line, 239d: dashed line, 323a: analog switch, and 323b: shift register.

The invention claimed is:

1. A thin film transistor comprising:
a gate electrode over a substrate having an insulating surface;
a gate insulating layer which covers the gate electrode;
a first semiconductor layer which is in contact with the gate insulating layer;
a second semiconductor layer which is stacked over the first semiconductor layer; and
impurity semiconductor layers forming a source region and a drain region which are in contact with part of the second semiconductor layer,
wherein the second semiconductor layer comprises an amorphous semiconductor layer having an NH group or an $NH_2$ group,
wherein different semiconductor atoms included in the second semiconductor layer are cross-linked with the NH group,
wherein the second semiconductor layer comprises a concave portion between the impurity semiconductor layers, and
wherein a nitrogen concentration in the second semiconductor layer gradually decreases toward the impurity semiconductor layers.

2. The thin film transistor according to claim 1, wherein different dangling bonds in semiconductor atoms included in the second semiconductor layer are terminated with the $NH_2$ group.

3. The thin film transistor according to claim 1, wherein the first semiconductor layer is a microcrystalline semiconductor layer.

4. The thin film transistor according to claim 1, wherein the first semiconductor layer is a dispersed microcrystalline semiconductor layer or a net-like microcrystalline semiconductor layer.

5. The thin film transistor according to claim 1, wherein an oxygen concentration of the second semiconductor layer which is measured by secondary ion mass spectrometry is less than or equal to $5 \times 10^{18}$ cm$^{-3}$.

6. The thin film transistor according to claim 1 or claim 9, wherein an NH group is included in the impurity semiconductor layers forming the source region and the drain region.

7. The thin film transistor according to claim 1, wherein a concentration of nitrogen in the second semiconductor layer is greater than or equal to $1 \times 10^{20}$ cm$^{-3}$ and less than or equal to $1 \times 10^{21}$ cm$^{-3}$.

8. The thin film transistor according to claim 1, wherein a concentration of nitrogen in the second semiconductor layer is greater than or equal to $2 \times 10^{20}$ cm$^{-3}$ and less than or equal to $1 \times 10^{21}$ cm$^{-3}$.

9. A thin film transistor comprising:
a gate electrode over a substrate having an insulating surface;
a gate insulating layer which is in contact with the gate electrode;
a semiconductor layer which is in contact with the gate insulating layer;
impurity semiconductor layers forming a source region and a drain region; and
a buffer layer which is formed between the semiconductor layer and the impurity semiconductor layers,
wherein the buffer layer comprises an amorphous semiconductor layer having an NH group or an NH$_2$ group,
wherein different semiconductor atoms included in the buffer layer are cross-linked with the NH group,
wherein the buffer layer comprises a concave portion between the impurity semiconductor layers, and
wherein a nitrogen concentration in the buffer layer gradually decreases toward the impurity semiconductor layers.

10. The thin film transistor according to claim 9, wherein different dangling bonds in semiconductor atoms included in the buffer layer are terminated with the NH$_2$ group.

11. The thin film transistor according to claim 9, wherein the semiconductor layer is a microcrystalline semiconductor layer.

12. The thin film transistor according to claim 9, wherein the semiconductor layer is a dispersed microcrystalline semiconductor layer or a net-like microcrystalline semiconductor layer.

13. The thin film transistor according to claim 9, wherein an oxygen concentration of the buffer layer which is measured by secondary ion mass spectrometry is less than or equal to $5 \times 10^{18}$ cm$^{-3}$.

14. The thin film transistor according to claim 9, wherein a concentration of nitrogen in the buffer layer is greater than or equal to $1 \times 10^{20}$ cm$^{-3}$ and less than or equal to $1 \times 10^{21}$ cm$^{-3}$.

15. The thin film transistor according to claim 9, wherein a concentration of nitrogen in the buffer layer is greater than or equal to $2 \times 10^{20}$ cm$^{-3}$ and less than or equal to $1 \times 10^{21}$ cm$^{-3}$.

16. A semiconductor device comprising:
a thin film transistor comprising:
a gate electrode over a substrate having an insulating surface;
a gate insulating layer which covers the gate electrode;
a first semiconductor layer which is in contact with the gate insulating layer;
a second semiconductor layer which is stacked over the first semiconductor layer; and
impurity semiconductor layers forming a source region and a drain region which are in contact with part of the second semiconductor layer,
wherein the second semiconductor layer comprises an amorphous semiconductor layer having an NH group or an NH$_2$ group,
wherein different semiconductor atoms included in the second semiconductor layer are cross-linked with the NH group,
wherein the second semiconductor layer comprises a concave portion between the impurity semiconductor layers, and
wherein a nitrogen concentration in the second semiconductor layer gradually decreases toward the impurity semiconductor layers.

17. An electronic device having the semiconductor device according to claim 16,
wherein the electronic device is selected from the group consisting of a television device, a cellular phone, a portable computer, and a desk lamp.

18. A semiconductor device according to claim 16, wherein a concentration of nitrogen in the second semiconductor layer is greater than or equal to $1 \times 10^{20}$ cm$^{-3}$ and less than or equal to $1 \times 10^{21}$ cm$^{-3}$.

19. A semiconductor device according to claim 16, wherein a concentration of nitrogen in the second semiconductor layer is greater than or equal to $2 \times 10^{20}$ cm$^{-3}$ and less than or equal to $1 \times 10^{21}$ cm$^{-3}$.

* * * * *